US006624724B2

(12) United States Patent
Tomita et al.

(10) Patent No.: US 6,624,724 B2
(45) Date of Patent: Sep. 23, 2003

(54) DUAL BAND COMMON-MODE NOISE LINE FILTER

(75) Inventors: Hiroshi Tomita, Hyogo (JP); Toshinori Oda, Osaka (JP); Hirotaka Ishikawa, Osaka (JP); Tatsuya Mori, Hyogo (JP)

(73) Assignee: Matsuhita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/936,519

(22) PCT Filed: Jan. 12, 2001

(86) PCT No.: PCT/JP01/00115

§ 371 (c)(1),
(2), (4) Date: Dec. 26, 2001

(87) PCT Pub. No.: WO01/52282

PCT Pub. Date: Jul. 19, 2001

(65) Prior Publication Data

US 2002/0158713 A1 Oct. 31, 2002

(30) Foreign Application Priority Data

Jan. 14, 2000 (JP) ....................................... 2000-005509
Aug. 28, 2000 (JP) ....................................... 2000-256932

(51) Int. Cl.[7] .................................................. H03H 7/01
(52) U.S. Cl. ....................... 333/181; 333/177; 333/185; 336/92; 336/198

(58) Field of Search ................................. 333/177, 181, 333/185; 336/92, 198

(56) References Cited

U.S. PATENT DOCUMENTS 4,945,332 A * 7/1990 Sakamoto et al. ...... 333/177 X
5,793,273 A * 8/1998 Yamaguchi et al. ........ 336/198

FOREIGN PATENT DOCUMENTS

| | | | |
|---|---|---|---|
| EP | 0 246 377 A1 | 11/1987 | |
| EP | 0 740 317 A1 | 10/1996 | |
| EP | 0 971 479 | 1/2000 | ............ H03H/1/00 |
| JP | 63-185219 | 11/1988 | ........... H01F/37/00 |
| JP | 10-163046 | 6/1998 | ........... A01F/37/00 |
| WO | WO96/14643 | 5/1996 | |

* cited by examiner

*Primary Examiner*—Justin P. Bettendorf
(74) *Attorney, Agent, or Firm*—McDermott, Will & Emery

(57) ABSTRACT

The present invention is intended to provide a line filter having an outstanding attenuation characteristic over a wide frequency band from low frequency band to high frequency band, with an improved elimination characteristic for common mode noises. To achieve this object, the invention incorporates a structure wherein a first coil unit (14) for second band and a second coil unit (16) for second band are disposed vertically to a closed-loop magnetic core (11).

28 Claims, 58 Drawing Sheets

Common Mode Noise Attenuation Characteristics

Normal Mode Noise Attenuation Characteristics

DUAL BAND COMMON-MODE NOISE LINE FILTER

FIELD OF THE INVENTION

The present invention relates to a line filter used for a variety of consumer products, and the like.

BACKGROUND OF THE INVENTION

A conventional line filter will be described hereinafter with reference to the accompanying figures.

In FIG. 55 and FIG. 56, the conventional line filter is provided with bobbin 32 having a through hole, first coil 33 and second coil 34 wound on the bobbin 32, and closed-loop magnetic core 35 inserted in the through hole of the bobbin 32.

They thus constitute noise suppression means to eliminate common mode noises, as shown in FIG. 57 and FIG. 58. This noise suppression means eliminates noises by making magnetic flux A and magnetic flux B generated respectively by the first coil 33 and the second coil 34 flow into the closed-loop magnetic core 35 equally in the same direction, in a manner not to cancel with each other.

When common mode noise 36 propagates into an electric circuit, as shown in FIG. 57, the magnetic flux A and the magnetic flux B generated in the line filter are in directions shown in FIG. 58, due to the above-described structure.

That is, in FIG. 58, the magnetic flux A generated by the first coil 33 and the magnetic flux B generated by the second coil 34 are in the same direction equally, and flow in the closed-loop magnetic core 35 in a manner that they are combined together instead of being cancelled.

A frequency-attenuation characteristic in this instance is given as shown in FIG. 59.

High frequency noise currents generated in an electric circuit through commercial power supply generally include in-phase current and differential current, and the former is called common mode noise and the latter is called normal mode noise.

Although the above-described structure of the prior art can eliminate common mode noise 36, a frequency band in which the common mode noise 36 can be eliminated in this case is usually in the region of low frequency band, as shown in FIG. 59. It therefore has a problem of poor elimination characteristic for the common mode noise 36, as it is unable to attenuate over a wide frequency and from low frequency region to high frequency region.

The present invention addresses the above-described problem, and it is intended to provide a line filter having an outstanding attenuation characteristic over a wide frequency band from low frequency region to high frequency region, with an improved elimination characteristic for the common mode noise.

DISCLOSURE OF THE INVENTION

To achieve the above object, the present invention incorporates a first bobbin and a second bobbin, each of which has a through hole in an axial direction and a winding slot where a coil is wound, a first coil wound around the winding slot of the first bobbin to form a first coil unit, a second coil wound around the winding slot of the second bobbin to form a second coil unit, a closed-loop magnetic core having a magnetic frame-bar inserted in the through holes of the first bobbin and the second bobbin, and a first noise suppression means for eliminating common mode noise.

The first noise suppression means comprises a first noise suppressor for first band to eliminate common mode noise in a first frequency band and another first noise suppressor for second band to eliminate common mode noise in a second frequency band.

The first noise suppressor for first band eliminates noises with the first coil and the second coil so wound that magnetic flux generated by the first coil and another magnetic flux generated by the second coil enhance each other in the closed-loop magnetic core.

The first noise suppressor for second band has a spirally wound first coil for second band, which forms a first coil unit for second band, and a spirally wound second coil for second band, which forms a second coil unit for second band. The first coil for second band and the second coil for second band are so wound that magnetic flux generated by the first coil unit for second band and magnetic flux generated by the second coil unit for second band enhance each other. Noises are eliminated by such an arrangement of the first coil unit for second band and the second coil unit for second band that they are orthogonal to the closed-loop magnetic core, so that a direction of magnetic fluxes generated by the first coil unit and the second coil unit and a direction of magnetic fluxes generated by the first coil unit for second band and the second coil unit for second band cross orthogonally with respect to each other.

In the foregoing structure, the first coil for second band and the second coil for second band are wound in a manner that the magnetic flux generated by the first coil unit for second band and the magnetic flux generated by the second coil unit for second band enhance each other, to eliminate the common mode noise in the second frequency band. It is therefore easy to set a frequency band that can be attenuated by the first coil unit for second band and the second coil unit for second band in a region outside of a frequency band that can be attenuated by the first coil unit and the second coil unit. In addition, it realizes attenuation widely from low frequency region to high frequency region, thereby improving the attenuation characteristic.

In this instance, in particular, the first coil unit for second band and the second coil unit for second band are arranged orthogonal to the closed-loop magnetic core, so that a direction of the magnetic fluxes generated by the first coil unit and the second coil unit and a direction of the magnetic fluxes generated by the first coil unit for second band and the second coil unit for second band cross orthogonally with respect to each other. For this reason, the magnetic fluxes generated by the first coil unit and the second coil unit do not influence with the magnetic fluxes generated by the first coil unit for second band and the second coil unit for second band. This prevents attenuation characteristic of the second frequency band from causing an adverse effect to attenuation characteristic of the first frequency band. Furthermore, the attenuation characteristics can be improved since the attenuation characteristics covering a frequency band is positively broadened.

THE BEST MODES FOR CARRYING OUT THE INVENTION

Figure 1:
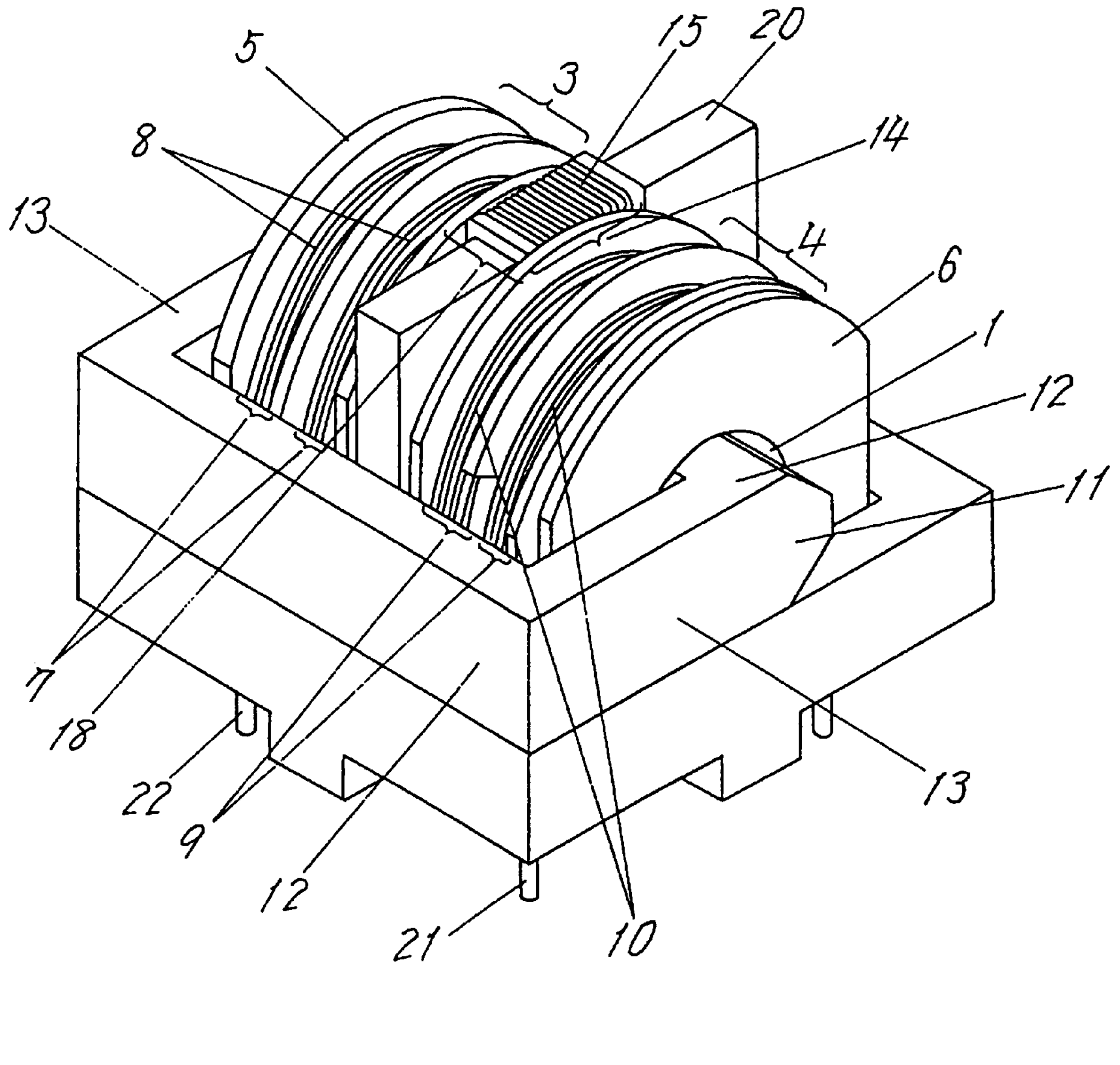
FIG. 1 is a perspective view of a line filter according to a first exemplary embodiment of the present invention.
Figure 2:
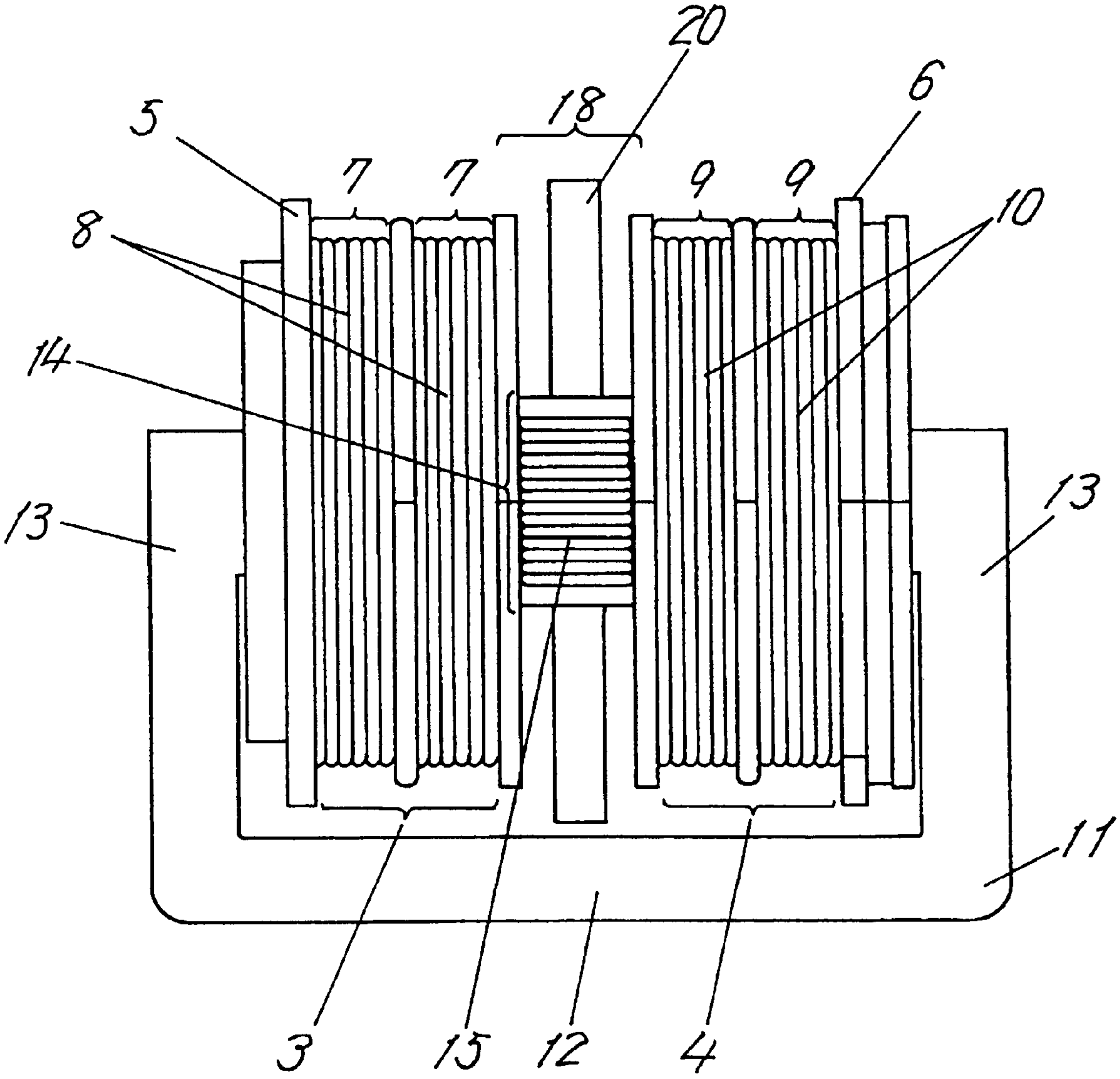
FIG. 2 is a plan view of the same line filter.
Figure 3:
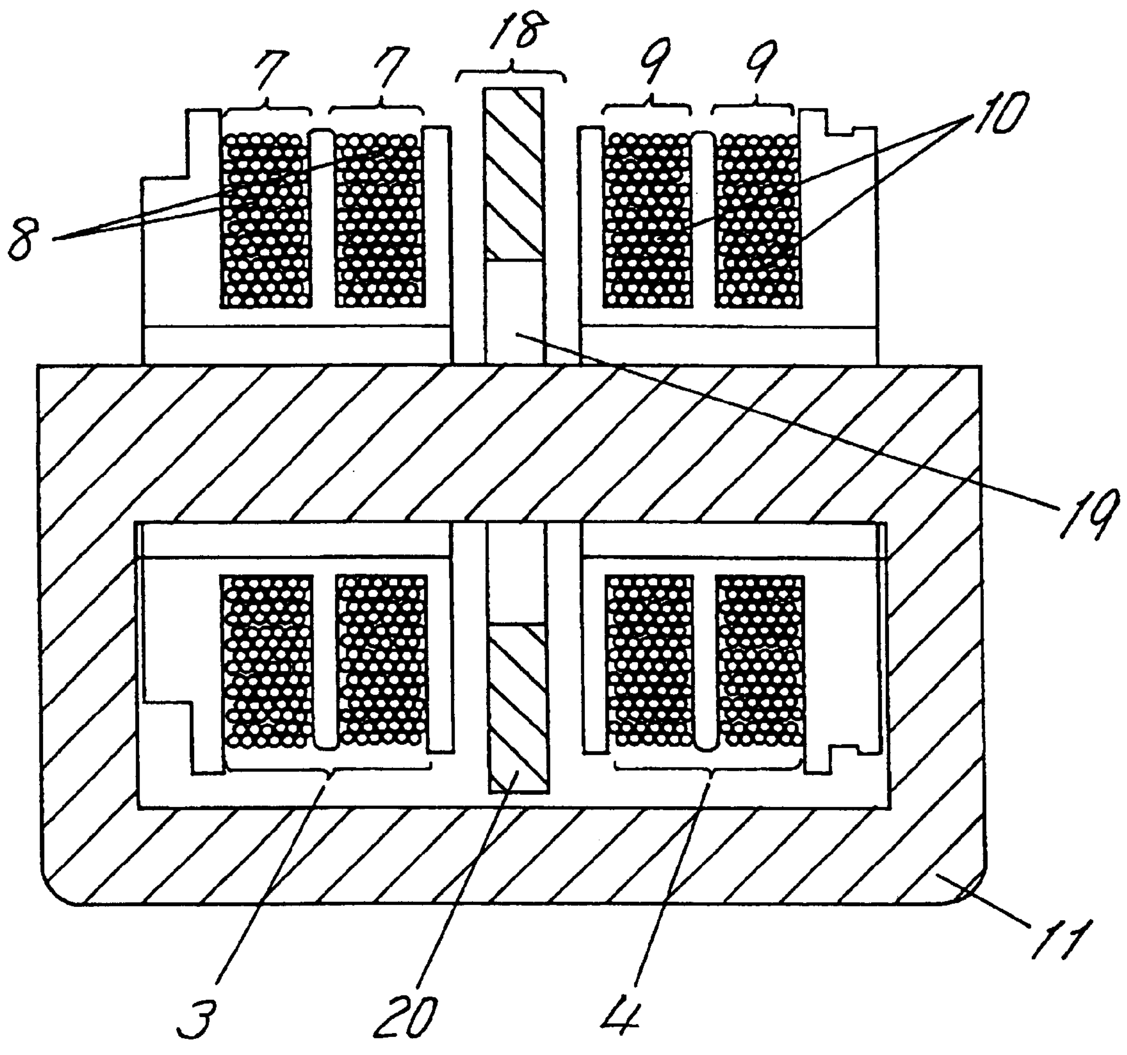
FIG. 3 is a sectioned plan view of the same line filter.
Figure 4:
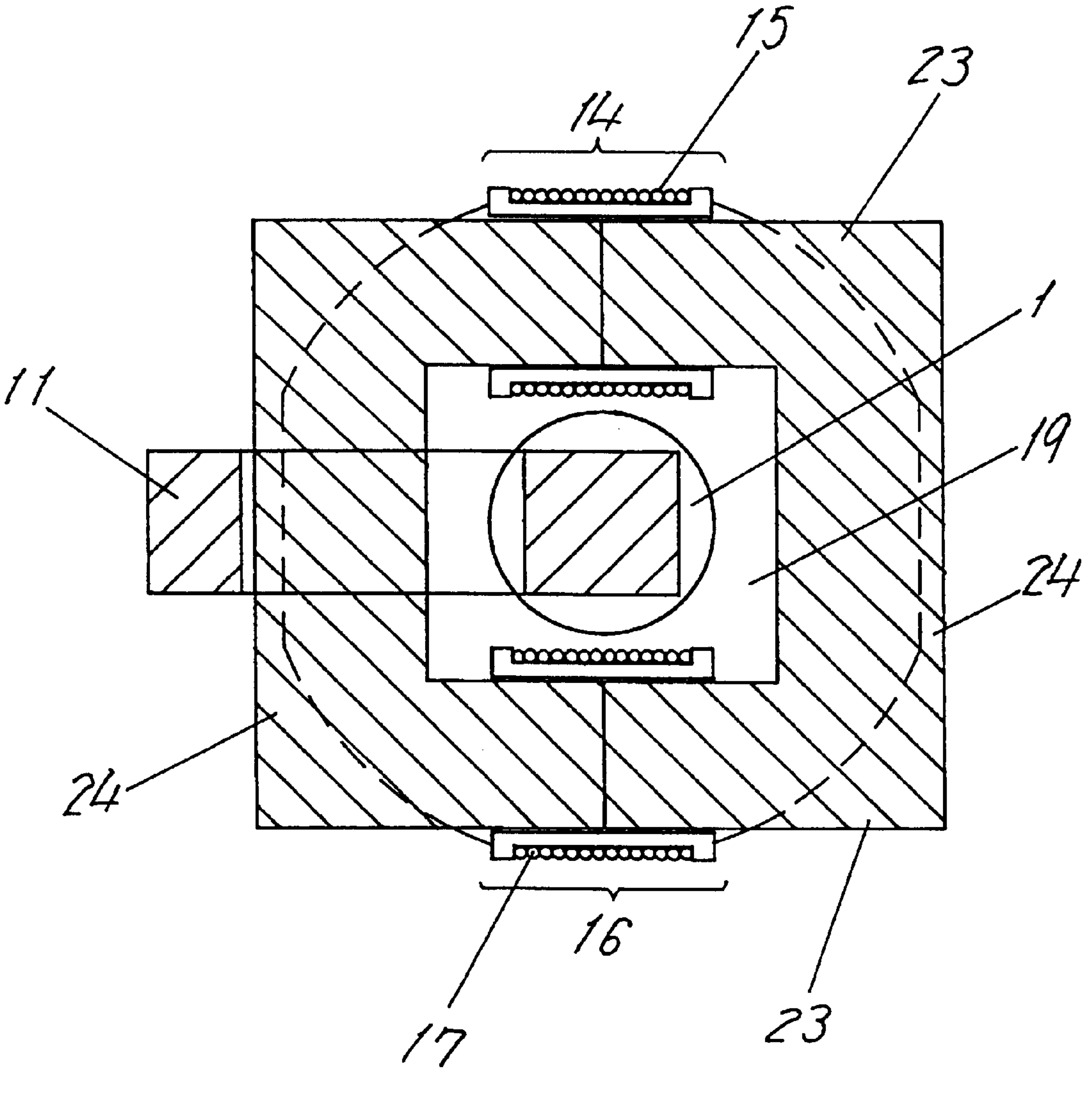
FIG. 4 is a sectioned right side view of the same line filter.
Figure 5:
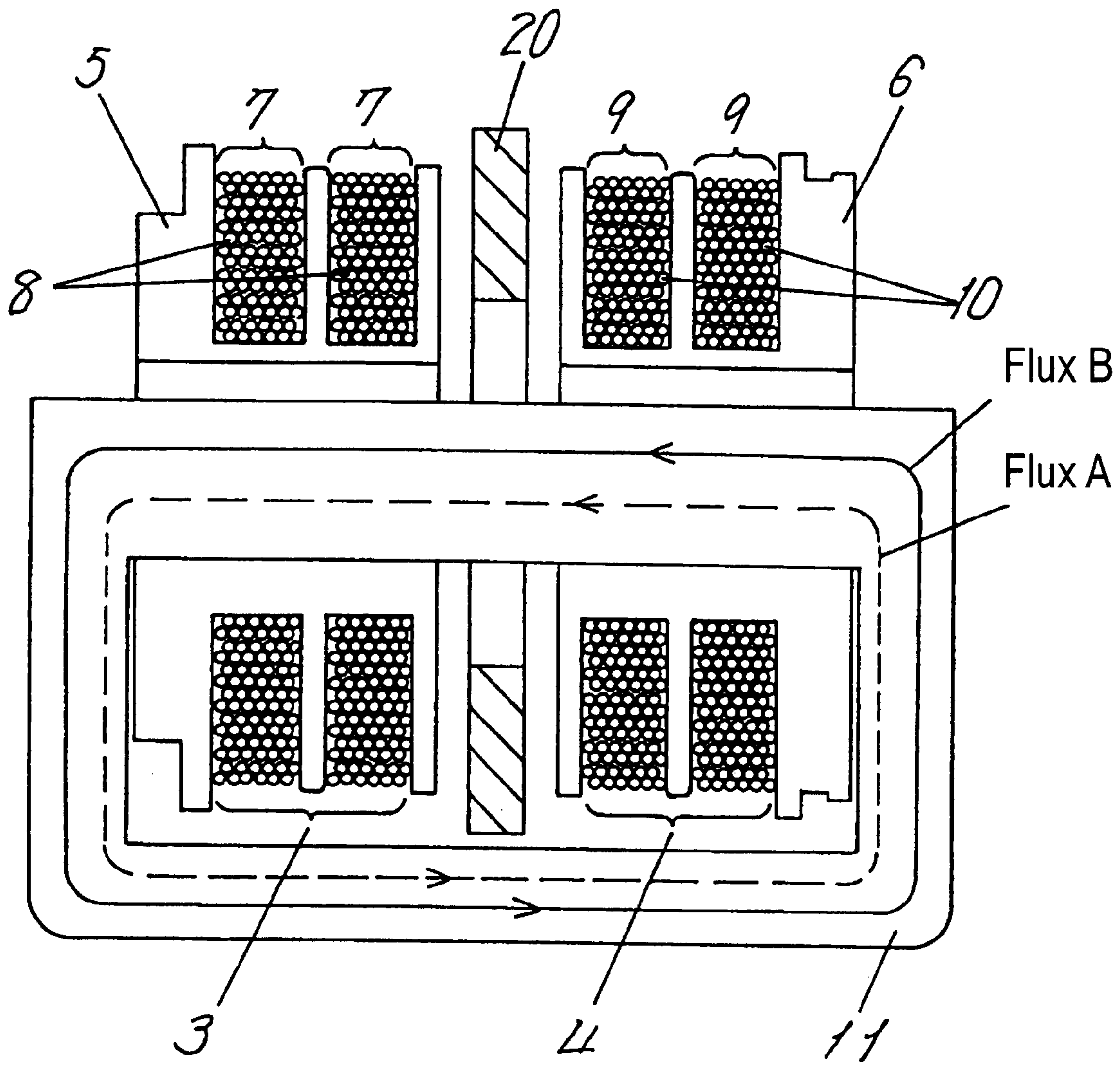
FIG. 5 is a schematic illustration of a magnetic circuit of the same line filter, depicting flows of magnetic flux caused by common mode noise in a first frequency band.
Figure 6:
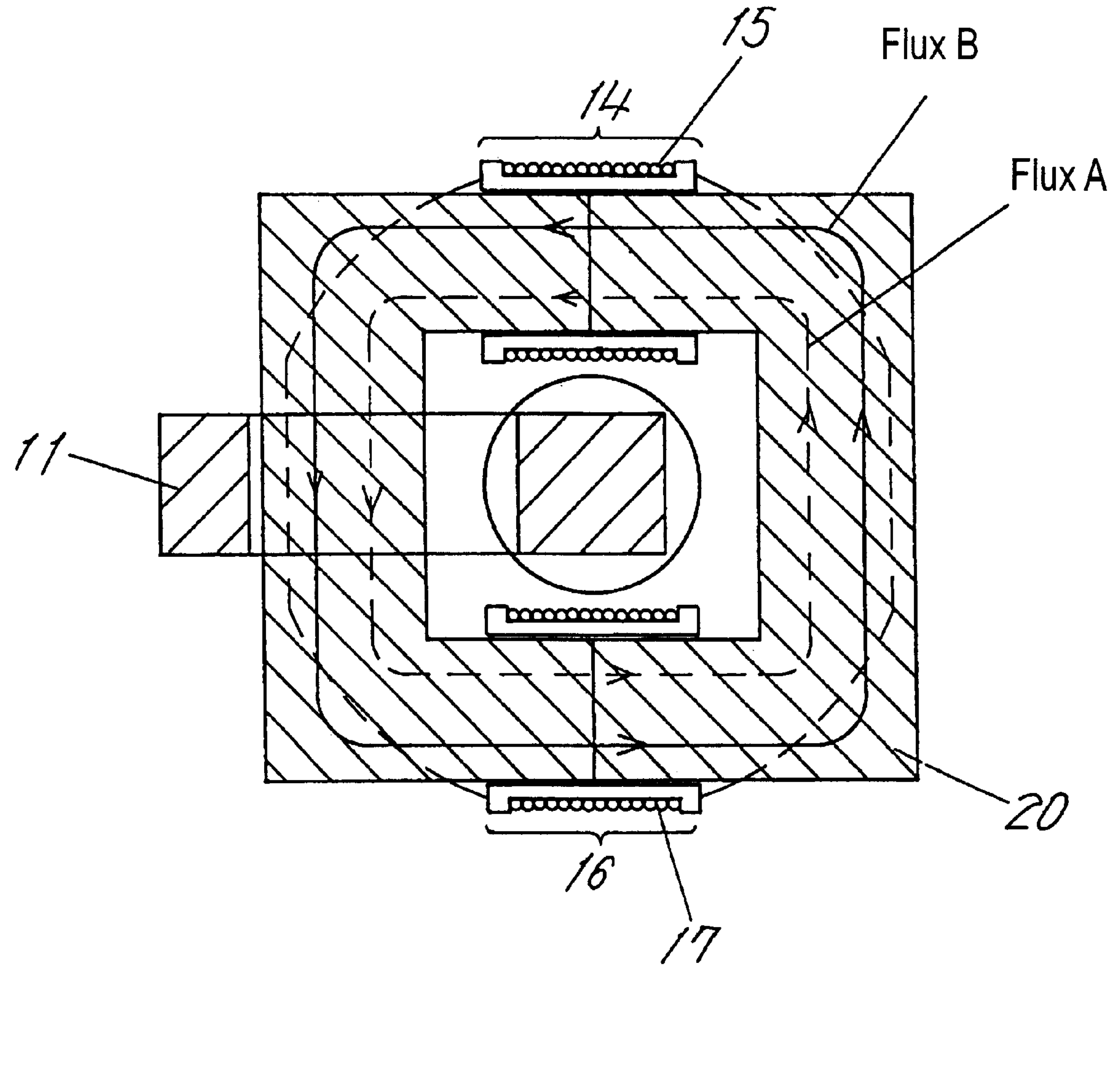
FIG. 6 is a schematic illustration of another magnetic circuit of the same line filler, depicting flows of magnetic flux caused by common mode noise in a second frequency band.
Figure 7:
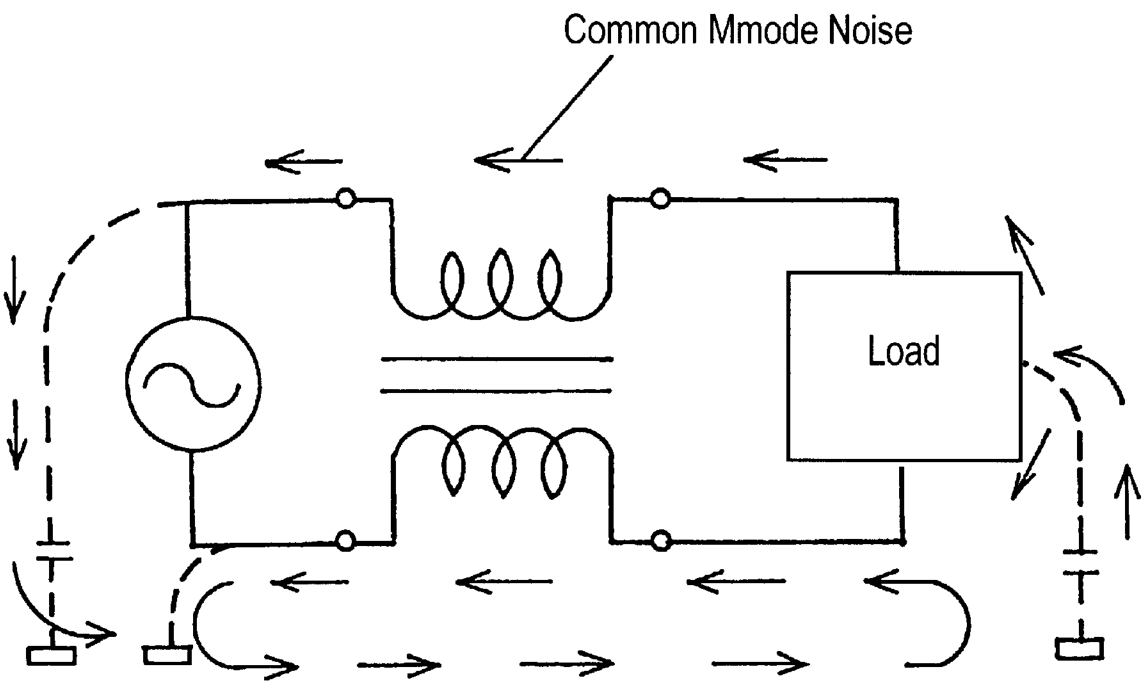
FIG. 7 is an electric circuit diagram depicting propagation of the common mode noise when the same line filter is used.

The line filter in a first embodiment comprises a first bobbin and a second bobbin, each of which has a through hole in an axial direction and a winding slot where a coil is wound, a first coil wound around the winding slot of the first bobbin to form a first coil unit, a second coil wound around the winding slot of the second bobbin to form a second coil unit, a closed-loop magnetic core having a magnetic frame-bar inserted in the through holes of the first bobbin and the second bobbin, and a first noise suppression means for eliminating common mode noise.

The first noise suppression means comprises a first noise suppressor for first band to eliminate common mode noises in a first frequency band and another first noise suppressor for second band to eliminate common mode noises in a second frequency band.

The first noise suppressor for first band eliminates noises with the first coil and the second coil so wound that magnetic flux generated by the first coil and another magnetic flux generated by the second coil enhance each other in the closed-loop magnetic core.

The first noise suppressor for second band has a spirally wound first coil for second band, which forms a first coil unit for second band, and a spirally wound second coil for second band, which forms a second coil unit for second band. The first coil for second band and the second coil for second band are so wound that magnetic flux generated by the first coil unit for second band and magnetic flux generated by the second coil unit for second band enhance each other. Noises are eliminated by such an arrangement of the first coil unit for second band and the second coil unit for second band that they are orthogonal to the closed-loop magnetic core, so that a direction of magnetic fluxes generated by the first coil unit and the second coil unit and a direction of magnetic fluxes generated by the first coil unit for second band and the second coil unit for second band cross orthogonally with respect to each other.

In the foregoing structure, the first coil for second band and the second coil for second band are wound in a manner that the magnetic flux generated by the first coil unit for second band and the magnetic flux generated by the second coil unit for second band enhance each other, to eliminate the common mode noise in the second frequency band. It is therefore easy to set a frequency band that can be attenuated by the first coil unit for second band and the second coil unit for second band in a region outside of a frequency band that can be attenuated by the first coil unit and the second coil unit. In addition, it realizes attenuation widely from low frequency region to high frequency region, thereby improving the attenuation characteristic.

In this instance, in particular, the first coil unit for second band and the second coil unit for second band are arranged orthogonal to the closed-loop magnetic core, so that a direction of the magnetic fluxes generated by the first coil unit and the second coil unit and a direction of the magnetic fluxes generated by the first coil unit for second band and the second coil unit for second band cross orthogonally with respect to each other. For this reason, the magnetic fluxes generated by the first coil unit and the second coil unit do not influence with the magnetic fluxes generated by the first coil unit for second band and the second coil unit for second band. This prevents attenuation characteristic of the second frequency band from causing negative effect to attenuation characteristic of the first frequency band. Furthermore, the attenuation characteristic can be improved since the attenuation characteristic of frequency band is positively broadened.

The line filter in a variation of the foregoing further includes a second noise suppression means for eliminating normal mode noises. The second noise suppression means is so designed that magnetic fluxes generated by the first coil and the second coil are led in directions opposite to each other in the closed-loop magnetic core, but in a same direction in a space between side surface next to the winding slot of the first bobbin and another surface next to the winding slot of the second bobbin that confront each other. The magnetic fluxes are generated in a closed-loop pattern around the winding slot of the first bobbin and also around the winding slot of the second bobbin. Normal mode noises are thus eliminated in the above manner.

The normal mode noises can be eliminated with the above-described structure.

The line filter in another variation pertains to a structure provided with a magnetic body, and the first coil for second band, which forms the first coil unit for second band, and the second coil for second band, which forms the second coil unit for second band, are wound on the magnetic body.

With the above-described structure, an attenuation characteristic of the second frequency band can be improved further when eliminating the common mode noises.

The line filter in another variation incorporates a magnetic body between a side surface next to the winding slot of the first bobbin and another side surface next to the winding slot of the second bobbin that confront each other. It is a structure wherein the first coil for second band, which forms the first coil unit for second band, and the second coil for second band, which forms the second coil unit for second band, are wound on the magnetic body.

With the above-described structure, an attenuation characteristic of the second frequency band can be improved further for eliminating the common mode noises. Magnetic fluxes are produced in a closed-loop pattern through the magnetic body around the winding slot of the first bobbin and also around the winding slot of the second bobbin. The normal mode noises can be thus eliminated adequately.

The line filter in another variation is a structure in which the magnetic body is formed into a closed-loop configuration with an opening.

With the above-described structure, magnetic fluxes generated by a first coil unit for second band and the second coil unit for second band are concentrated in the magnetic body, so as to bring the generated magnetic fluxes easily into the same direction. Hence, an attenuation characteristic of the second frequency band can be improved furthermore for eliminating the common mode noises.

The line filter in another variation is a structure in which the magnetic body is constructed into a square shape with an opening by coupling two magnetic frame-bars and two other magnetic frame-bars that confront one-another.

With the foregoing structure, magnetic fluxes generated by the first coil unit for second band and the second coil unit for second band are concentrated in the magnetic body, so as to bring the generated magnetic fluxes easily into the same direction. Hence, an attenuation characteristic of the second frequency band can be improved furthermore for eliminating the common mode noises.

The line filter in another variation is a structure in which the magnetic body is constructed into a square shape with an opening by coupling two magnetic frame-bars and two other magnetic frame-bars that confront one another, and the first coil for second band is wound around one of the two magnetic frame-bars and the second coil for second band is wound around the other of the two magnetic frame-bars.

With the foregoing structure, magnetic fluxes generated by the first coil unit for second band and the second coil unit for second band are concentrated in the magnetic body, so as to bring the generated magnetic fluxes easily into the same direction. Hence, an attenuation characteristic of the second frequency band can be improved furthermore for eliminating the common mode noises.

The line filter in another variation is a structure in which the magnetic body is constructed into a square shape with an opening by coupling two magnetic frame-bars and two other magnetic frame-bars that confront one another, and both the first coil for second band and the second coil for second band are wound around one of the two other magnetic frame-bars.

With the foregoing structure, magnetic fluxes generated by the first coil unit for second band and the second coil unit for second band are concentrated in the magnetic body, so as to bring the generated magnetic fluxes easily into the same direction. Hence, an attenuation characteristic of the second frequency band can be improved even further for eliminating the common mode noises.

The line filter in another variation is a structure wherein the magnetic body is so arranged as to locate one of its two magnetic frame-bars up and the other of the two magnetic frame-bars down.

Because of the foregoing structure, magnetic fluxes generated by the first coil unit for second band and the second coil unit for second band are concentrated in the magnetic body, so as to bring the generated magnetic fluxes easily into the same direction. Hence, an attenuation characteristic of the second frequency band can be improved furthermore for eliminating the common mode noises.

The line filter in another variation is a structure in which the magnetic frame-bar of the closed-loop magnetic core is inserted in the opening of a magnetic body.

A reduction in size can be realized with the above-described structure, since the closed-loop magnetic core and the magnetic body can be positioned closely with respect to each other.

The line filter in another variation is a structure in which the magnetic frame-bar of the closed-loop magnetic core is inserted in the opening of a magnetic body, and the same magnetic frame-bar as the one inserted in the through hole of the first bobbin and the through hole of the second bobbin is also inserted in the opening of the magnetic body.

The foregoing structure facilitates formation of magnetic fluxes into a closed-loop configuration around the winding slot of the first bobbin and the winding slot of the second bobbin. Thus, normal mode noises can be eliminated effectively.

In the line filter in another variation, the second frequency band is set in a higher frequency region than the first frequency band. Also, numbers of turns of the first coil for second band and the second coil for second band are set to be equal to or less than numbers of turns of the first coil and the second coil. In addition, the first coil for second band and the second coil for second band are constructed by winding only in a single layer so as not to overlap each other.

The above-described structure can improve an attenuation characteristic in the high frequency band for eliminating common mode noises since the first coil for second band and the second coil for second band are wound only in one layer.

The line filter in another variation is to construct magnetic frame-bars of the closed-loop magnetic core by coupling at least two confronting magnetic frame-bars with at least two confronting side magnetic frame-bars. In addition, one of the two magnetic frame-bars is inserted in the through hole of the first bobbin as well as the through hole of the second bobbin. Further, the first bobbin and the second bobbin are arranged coaxially in this structure.

With the above-described structure, magnetic flux generated from winding slot of the first bobbin as well as magnetic flux generated from winding slot of the second bobbin can be guided adequately into the closed-loop magnetic core, since the first bobbin and the second bobbin can be connected and used as an integral bobbin. Thus, it does not impair noise elimination characteristic for common mode noises in the first frequency band.

The line filter in another variation is to construct magnetic frame-bars of the closed-loop magnetic core by coupling at least two confronting magnetic frame-bars with at least two confronting side magnetic frame-bars. One of the at least two magnetic frame-bars is inserted in the through hole of the first bobbin, and the other of the at least two magnetic frame-bars is inserted in the through hole of the second bobbin. In this structure, the first bobbin and the second bobbin are arranged coaxially.

The foregoing structure facilitates formation of magnetic fluxes into a closed-loop configuration around the winding slot of the first bobbin and the winding slot of the second bobbin. Hence, normal mode noise can be eliminated effectively.

The line filter in another variation is to construct magnetic frame-bars of the closed-loop magnetic core by coupling at least two confronting magnetic frame-bars with at least two confronting side magnetic frame-bars. One of the at least two magnetic frame-bars is inserted in the through hole of the first bobbin, and the other of the at least two magnetic frame-bars is inserted in the through hole of the second bobbin. Further, the first bobbin and the second bobbin are arranged eccentrically in a staggered form in a manner that a periphery of winding slot of the first bobbin and a periphery of winding slot of the second bobbin do not confront each other.

The above-described structure facilitates formation of magnetic fluxes into a closed-loop configuration around the winding slot of the first bobbin and the winding slot of the second bobbin. Hence, normal mode noise can be eliminated more effectively.

The line filter in another variation is a structure in which the closed-loop magnetic core is constructed into a square shape.

The common mode noise can be eliminated adequately with the above structure.

The line filter in another variation is a structure in which the closed-loop magnetic core is constructed into a double-square shape.

The common mode noise can be eliminated adequately removed by the above structure.

The line filter in another variation is a structure in which the closed-loop magnetic core is constructed into a double-square shape, and a magnetic frame-bar in a center position among three confronting magnetic frame-bars is inserted in the through hole of the first bobbin and the through hole of the second bobbin.

The common mode noise can be eliminated adequately with the above-described structure.

The line filter in another variation is a structure in which second frequency band is set in a higher frequency region than first frequency band, and permeability of the magnetic body is chosen to be equal to or less than permeability of the closed-loop magnetic core.

With the above-described structure, an attenuation characteristic of high frequency band can be improved further in elimination of common mode noises. It can also eliminate normal mode noises better, when the magnetic body is disposed between a side surface next to a winding slot of the first bobbin and another side surface next to the winding slot of the second bobbin that confront each other.

The line filter in another variation is a structure that the magnetic body and the closed-loop magnetic core are made of MnZn-base core material.

With the above-described structure, an attenuation characteristic of high frequency band can be improved further in elimination of common mode noises. It can also eliminate normal mode noises better, when the magnetic body is disposed between a side surface next to the winding slot of the first bobbin and another side surface next to the winding slot of the second bobbin that confront each other.

The line filter in another variation is a structure that the magnetic body is made of NiZn-base core material, and the closed-loop magnetic core is made of MnZn-base core material.

With the above-described structure, an attenuation characteristic of high frequency band can be improved further in elimination of common mode noises. It can also eliminate normal mode noises better, when the magnetic body is disposed between a side surface next to the winding slot of the first bobbin and another side surface next to the winding slot of the second bobbin that confront each other.

The line filter in another variation is a structure provided with tapping terminals, through which the first coil and the first coil for second band are connected, and the second coil and the second coil for second band are connected.

According to the above-described structure, interconnections can be made easily between the first coil and the first coil for second band, and between the second coil and the second coil for second band, through the tapping terminals.

The line filter in another variation is a structure provided with a first tapping terminal and a second tapping terminal. The first coil and the first coil for second band are connected through the first tapping terminal, and the second coil and the second coil for second band are connected through the second tapping terminal.

With the above-described structure, interconnections can be made easily between the first coil and the first coil for second band through the first tapping terminal, and between the second coil and the second coil for second band through the second tapping terminal.

The line filter in another variation has a structure in which the closed-loop magnetic core and the magnetic body are arranged vertically, while they are positioned orthogonally with respect to each other, and none of their magnetic frame-bars is inserted in the opening of the closed-loop magnetic core and the opening of the magnetic body.

Because of the foregoing structure, magnetic fluxes generated by the first coil unit for second band and the second coil unit for second band are concentrated in the magnetic body, so as to direct the generated magnetic fluxes easily into the same direction. Hence, an attenuation characteristic of the second frequency band can be improved furthermore for eliminating the common mode noises.

The line filter in another variation has a structure in which the closed-loop magnetic core and the magnetic body are arranged vertically, while they are positioned orthogonally with respect to each other, and their respective two magnetic frame-bars or two other magnetic frame-bars are inserted in any of the opening of the closed-loop magnetic core and the opening of the magnetic body.

Because of the foregoing structure, magnetic fluxes generated by the first coil unit for second band and the second coil unit for second band are concentrated in the magnetic body, so as to lead the generated magnetic fluxes easily into the same direction. Hence, an attenuation characteristic of the second frequency band can be improved furthermore for eliminating the common mode noises.

The line filter in another variation is a structure provided with a terminal block, and the closed-loop magnetic core and the magnetic body are disposed vertically to the terminal block. The terminal block includes the first bobbin for second band, on which the a first coil for second band is wound, and the second bobbin for second band, on which the second coil for second band is wound, and both the first and second bobbins are molded unitary with the terminal block.

Because of the foregoing structure, magnetic fluxes generated by the first coil unit for second band and the second coil unit for second band are concentrated in the magnetic body, so as to lead the generated magnetic fluxes easily into the same direction. Hence, an attenuation characteristic of the second frequency band for eliminating the common mode noises can be improved furthermore.

In addition, since the terminal block is molded unitary with the first bobbin for second band and the second bobbin for second band, it facilitates winding of the first coil for second band and the second coil for second band. It also reduces a number of components, which simplifies the manufacturing process, thereby resulting in cost reduction.

The line filter in another variation is a structure in that the first bobbin for second band and the second bobbin for second band are connected in series.

The above-described structure realizes uninterrupted winding of the first coil for second band and the second coil for second band, so as to further simplify the manufacturing process, and to reduce the cost.

The line filter in another variation has a structure provided with a separating flange at a connecting portion between the first bobbin for second band and the second bobbin for second band.

The separating flange in the foregoing structure can be used to ease routing of coil wires.

(First Exemplary Embodiment)

A line filter according to a first exemplary embodiment of this invention will be described hereinafter with referring to the accompanying figures.

In FIG. 1 through FIG. 7, the line filter of the first exemplary embodiment of this invention comprises: first bobbin 5 and second bobbin 6, each of which has through hole 1 in an axial direction and winding slots 3 and 4 where coils are wound; first coil 8 wound around the winding slot 3 of the first bobbin 5 to form first coil unit 7; second coil 10 wound around the winding slot 4 of the second bobbin 6 to form second coil unit 9; closed-loop magnetic core 11 having a magnetic frame-bar inserted in the through hole 1 of the first bobbin 5 and another through hole 1 of the second bobbin 6; first noise suppression means for eliminating common mode noise; and second noise suppression means for eliminating normal mode noise.

Here, the closed-loop magnetic core 11 is constructed into a square shape with at least two confronting magnetic frame-bars 12 linked by at least two confronting magnetic frame-bars 13. One of the magnetic frame-bars 12 is inserted in the through hole 1 of the first bobbin 5 and the through hole 1 of the second bobbin 6. The first bobbin 5 and the second bobbin 6 are integrally conjoined and coaxially positioned.

The first noise suppression means comprises a first noise suppressor of first band for eliminating common mode noises in a first frequency band and another first noise suppressor of second band for eliminating common mode noises in a second frequency band of a higher frequency region than the first frequency band. The first noise suppressor for the first band includes the first coil 8 and the second coil 10 that are wound in such a manner that magnetic flux A generated by the first coil 8 and magnetic flux B generated by the second coil 10 enhance each other in the closed-loop magnetic core 11.

The first noise suppressor for second band includes first coil 15 for second band, which is spirally wound only in a single layer (un-overlapped) in first coil unit 14 for second band, and second coil 17 for second band, which is spirally wound also in a single layer (un-overlapped) in second coil unit 16 for second band. The first coil 15 for second band and the second coil 17 for second band are so wound that magnetic flux A generated by the first coil unit 14 for second band and magnetic flux B generated by the second coil unit 16 for second band enhance each other. The first coil unit 14 for second band and the second coil unit 16 for second band are arranged orthogonally to the closed-loop magnetic core 11, so that a direction of magnetic fluxes A and B generated by the first coil unit 7 and the second coil unit 8 and a direction of magnetic fluxes A and B generated by the first coil unit 14 for second band and the second coil unit 16 for second band cross orthogonally with respect to each other.

In this instance, the first noise suppressor for second band includes magnetic body 20, which forms a closed magnetic loop with opening 19, positioned in space 18 between a side surface next to the winding slot 3 of the first bobbin 5 and a confronting side surface next to the winding slot 4 of the second bobbin 6. One of the magnetic frame-bars of the closed-loop magnetic core 11 is inserted in the opening 19 of the magnetic body 20. The magnetic frame-bar inserted in the opening 19 of the magnetic body 20 is the same magnetic frame-bar inserted in the through hole 1 of the first bobbin 5 and the through hole 1 of the second bobbin 6. The first coil 15 for second band, which forms the first coil unit 14 for second band, and the second coil 17 for second band, which forms the second coil unit 16 for second band, are wound on this magnetic body 20. The first coil unit 8 and the first coil 15 for second band are connected through first tapping terminal 21, and the second coil 10 and the second coil 17 for second band are connected through second tapping terminal 22.

The magnetic body 20 is comprised of two confronting magnetic frame-bars 23 and two other confronting magnetic frame-bars 24, in a shape of square with the opening 19. The first coil 15 for second band is wound on one of the magnetic frame-bars 23, and the second coil 17 for second band is wound on the other of the magnetic frame-bars 23. The magnetic body 20 is arranged in such an orientation that one of the magnetic frame-bars 23 is located upward and the other of the magnetic frame-bars 23 downward.

Permeability of the magnetic body 20 is equal to or less than that of the closed-loop magnetic core 11. NiZn-base material is used for the magnetic body 20, and MnZn-base material for the closed-loop magnetic core 11. The magnetic frame-bar 12, which is the same magnetic frame-bar of the closed-loop magnetic core 11 inserted in the through hole 1 of the first bobbin 5 and the through hole 1 of the second bobbin 6, is inserted in the opening 19 of the magnetic body 20.

Figure 8:
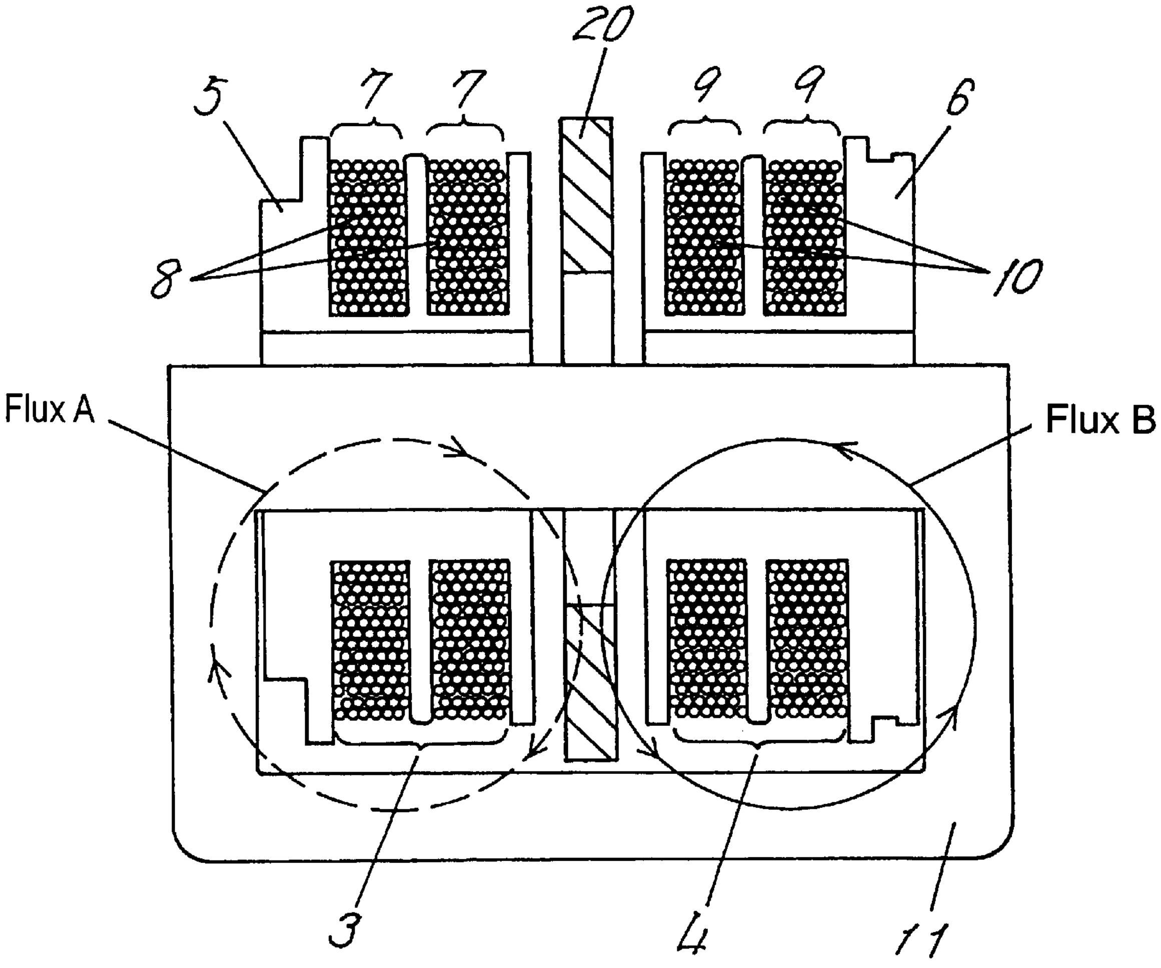
FIG. 8 is another schematic illustration of the magnetic circuit of the same line filter, depicting flows of magnetic flux caused by normal mode noise.
Figure 9:
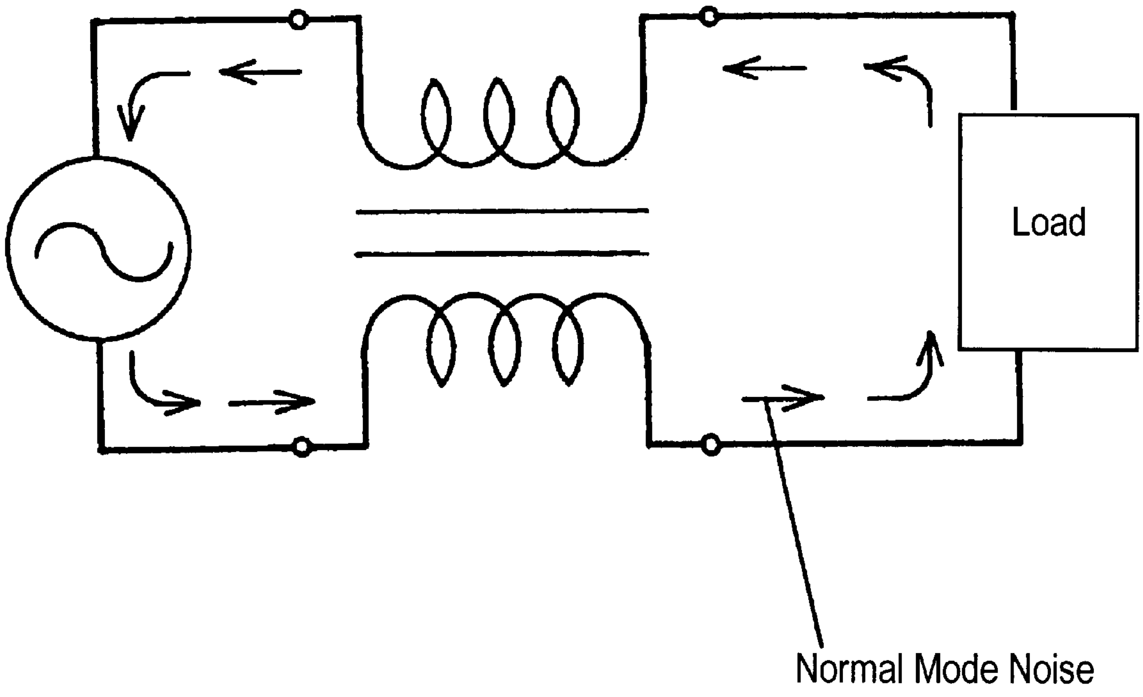
FIG. 9 is an electrical circuit diagram depicting propagation of the normal mode noise when the same line filter is used.

The second noise suppression means is so designed that, as shown in FIG. 8 and FIG. 9, the magnetic fluxes A and B generated by the first coil 8 and the second coil 10 are in directions opposite each other in the closed-loop magnetic core 11, but in the same direction in the magnetic body 20 disposed to the space 18 between the side surfaces next to the winding slot 3 of the first bobbin 5 and the winding slot 4 of the second bobbin 6 that confront each other. In this way, the magnetic fluxes A and B are generated in a closed-loop pattern around the winding slot 3 of the first bobbin 5 and also around the winding slot 4 of the second bobbin 5, to eliminate the normal mode noises.

Figure 10A:
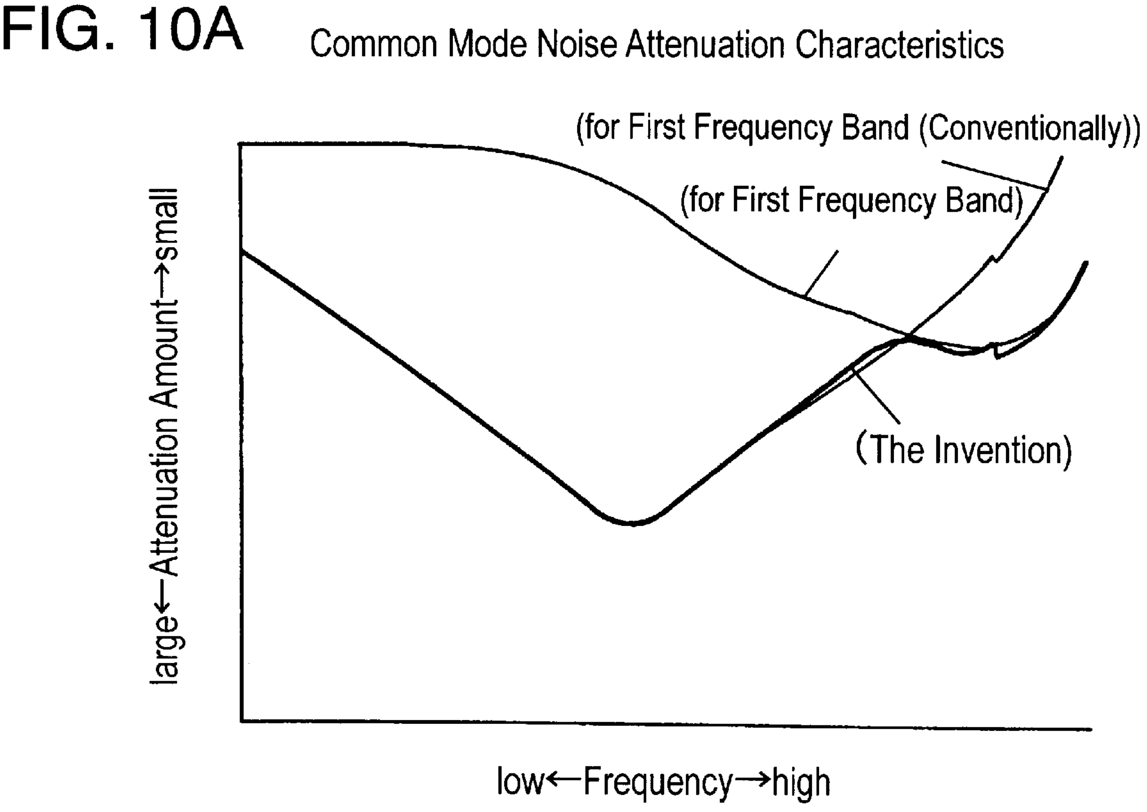
FIGS. 10A and 10B covers graphs representing frequency attenuation characteristics of the same line filter.
Figure 10B:
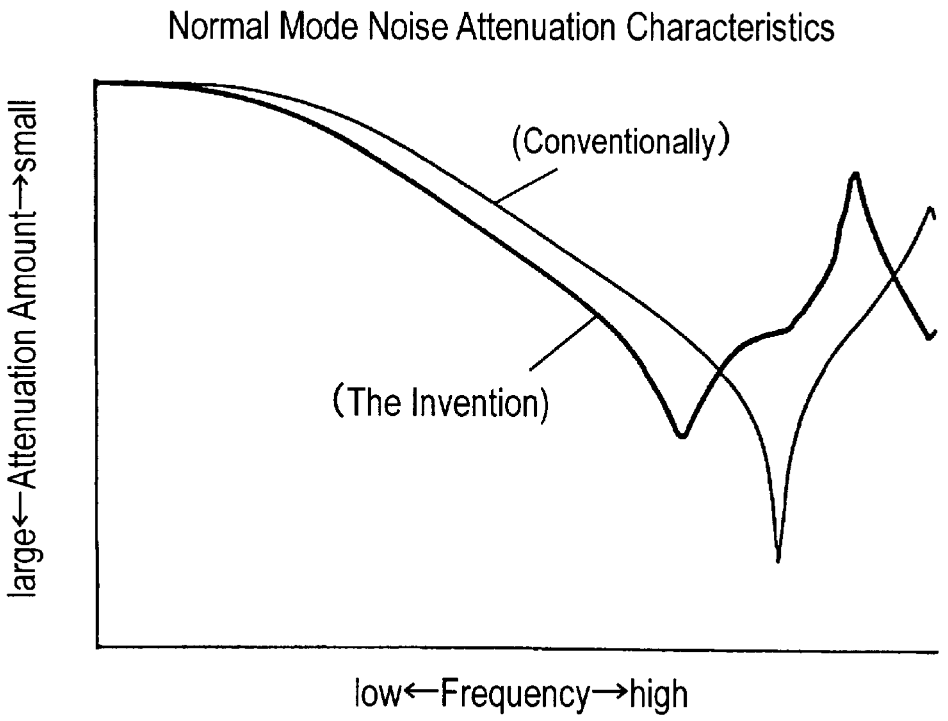

Here, frequency attenuation characteristics for common mode noises in the first frequency band, common mode noises in the second frequency band, and normal mode noises become such as shown in FIG. 10.

A line filter of the foregoing structure operates in a manner, which is described hereinafter.

In order to eliminate common mode noises of the second frequency band, the first coil 15 for second band and the second coil 17 for second band are so wound that the magnetic flux A generated by the first coil unit 14 for second band and the magnetic flux B generated by the second coil unit 16 for second band enhance each other. It is therefore easy to set a frequency band that can be attenuated by the first coil unit 14 for second band and the second coil unit 16 for second band in a region outside of a frequency band that can be attenuated by the first coil unit 7 and the second coil unit 9. In other words, it realizes attenuation over a wide range from low frequency region to high frequency region, thereby improving the attenuation characteristics.

In this embodiment, the first coil unit 14 for second band and the second coil unit 16 for second band are arranged orthogonal to the closed-loop magnetic core 11, so that a direction of the magnetic fluxes A and B generated by the first coil unit 7 and the second coil unit 9 and a direction of the magnetic fluxes A and B generated by the first coil unit 14 for second band and the second coil unit 16 for second band cross orthogonally with respect to each other. Therefore, the magnetic fluxes A and B generated by the first coil unit 7 and the second coil unit 8 and the magnetic fluxes A and B generated by the first coil unit 14 for second band and the second coil unit 16 for second band do not influence one another. That is, the attenuation characteristic in the second frequency band does not adversely affect the attenuation characteristic in the first frequency band, thereby improving the overall attenuation characteristic since the bandwidth in frequency of the attenuation characteristic is broadened positively.

There is provided, in particular, with the magnetic body, 20, and the first coil 15 for second band, which forms the first coil unit 14 for second band, and the second coil 17 for second band, which forms the second coil unit 16 for second band, are wound on this magnetic body 20. Thus, the attenuation characteristic in the second frequency band can be improved further for eliminating the common mode noises.

It can also eliminate normal mode noises since it is provided with the means of eliminating normal mode noises. The magnetic body 20 is disposed to the space 18 between the confronting side surfaces next to the winding slot 3 of the first bobbin 5 and the winding slot 4 of the second bobbin 6. Accordingly, magnetic loops are established via the magnetic body 20 around the winding slot 3 of the first bobbin 5 and the winding slot 4 of the second bobbin 6, and the normal mode noises can be thus eliminated adequately.

In addition, the magnetic body 20 is square in shape having the opening 19, as it is comprised of a combination of the two confronting magnetic frame-bars 23 and the other two confronting magnetic frame-bars 24. It is so arranged that one of the magnetic frame-bars 23 is in upper position, and the other one of the magnetic frame-bars 23 is in upper position. The first coil 15 for second band is wound on one of the magnetic frame-bars 23, and the second coil 17 for second band is wound on the other of the magnetic frame-bars 23. The structure composed as above concentrates the magnetic fluxes generated by the second coil unit 14 for second band and the second coil unit 16 for second band into the magnetic body 20, so as to lead them easily into the same direction. That is to improve further the attenuation characteristic in the second frequency band for eliminating the common mode noises.

Moreover, since the first coil 15 for second band and the second coil 17 for second band are wound only in a single layer, the attenuation characteristic in the high frequency region for eliminating the common mode noises can be improved.

The magnetic frame-bar of the closed-loop magnetic core 11 is inserted in the opening 19 of magnetic body 20, or that the same magnetic frame-bar inserted in the through hole 1 of the first bobbin 5 and the through hole 1 of the second bobbin 6 is inserted in the opening 19 of the magnetic body 20. This helps bring the closed-loop magnetic core 11 and the magnetic body 20 closer in position to each other, thereby reducing the overall size. It also facilitates formation of the magnetic fluxes into a closed-loop configuration around the winding slot 3 of the first bobbin 5 and the winding slot 4 of the second bobbin 6, so as to eliminate the normal mode noises effectively.

Moreover, common mode noises in the first frequency band can be eliminated adequately since the closed-loop magnetic core 11 is constructed in the square shape. Furthermore, one of the magnetic frame-bars 12 of the closed-loop magnetic core 11 is inserted in the through hole 1 of the first bobbin 5 and the through hole 1 of the second bobbin 6, and the first bobbin 5 and the second bobbin 6 are arranged coaxially. The first bobbin 5 and the second bobbin 6 are connected and used as a single bobbin, which leads the magnetic flux A generated from the winding slot 3 of the first bobbin 5 and the magnetic flux B generated from the winding slot 4 of the second bobbin 6 to flow properly in the closed-loop magnetic core 11. Therefore, the noise elimination characteristic for the common mode noises in the first frequency band will never be deteriorated.

Further, the magnetic body 20 is made of NiZn-base core material and the closed-loop magnetic core 11 is made of MnZn-base core material. The second frequency band is set to be in a higher frequency region than the first frequency band. Permeability of the magnetic body 20 is chosen to be equal to or less than that of the closed-loop magnetic core 11. Therefore, the attenuation characteristic for eliminating common mode noises in the high frequency region can be improved even more. It can also eliminate the normal mode noises better, when the magnetic body 20 is disposed to the space 18 between the confronting side surfaces next to the winding slot 3 of the first bobbin 5 and the winding slot 4 of the second bobbin 6.

In addition, the first coil 8 and the first coil 15 for second band are connected through the first tapping terminal 21, and the second coil 10 and the second coil 17 for second band are connected through the second tapping terminal 22. It is hence easy to make connections between the first coil 8 and the first coils 15 for second band, and between the second coil 10 and the second coils 17 for second band through the first tapping terminal 21 and the second tapping terminal 22.

According to the first exemplary embodiment as described, attenuation over a wide range is achievable from low frequency region to high frequency region for elimination of the common mode noises. A frequency bandwidth for the attenuation characteristic can be broadened positively and the overall attenuation characteristic improved, without causing the attenuation characteristic in the second frequency band affect adversely to the attenuation characteristic in the first frequency band.

Also, because the means is provided to eliminate normal mode noises, the normal mode noises can be eliminated. The normal mode noises can be eliminated positively, since the magnetic fluxes are formed in a closed-loop configuration around the winding slot 3 of the first bobbin 5 as well as the winding slot 4 of the second bobbin 6 via the magnetic body 20.

In addition, because the first bobbin 5 and the second bobbin 6 are serially connected and used as a single bobbin, the noise elimination characteristic will never be deteriorated for the common mode noises in the first frequency band.

The closed-loop magnetic core 11 and the magnetic body 20 are positioned closely to each other to reduce the overall size. Since this helps the magnetic fluxes to flow smoothly around the winding slot 3 of the first bobbin 5 and the winding slot 4 of the second bobbin 6, the normal mode noises can be eliminated efficiently.

Also, the connections can be made easily through the first tapping terminal 21 and the second tapping terminal 22, between the first coil 8 and the first coils 15 for second band, and between the second coil 10 and the second coils 17 for second band.

Figure 11:
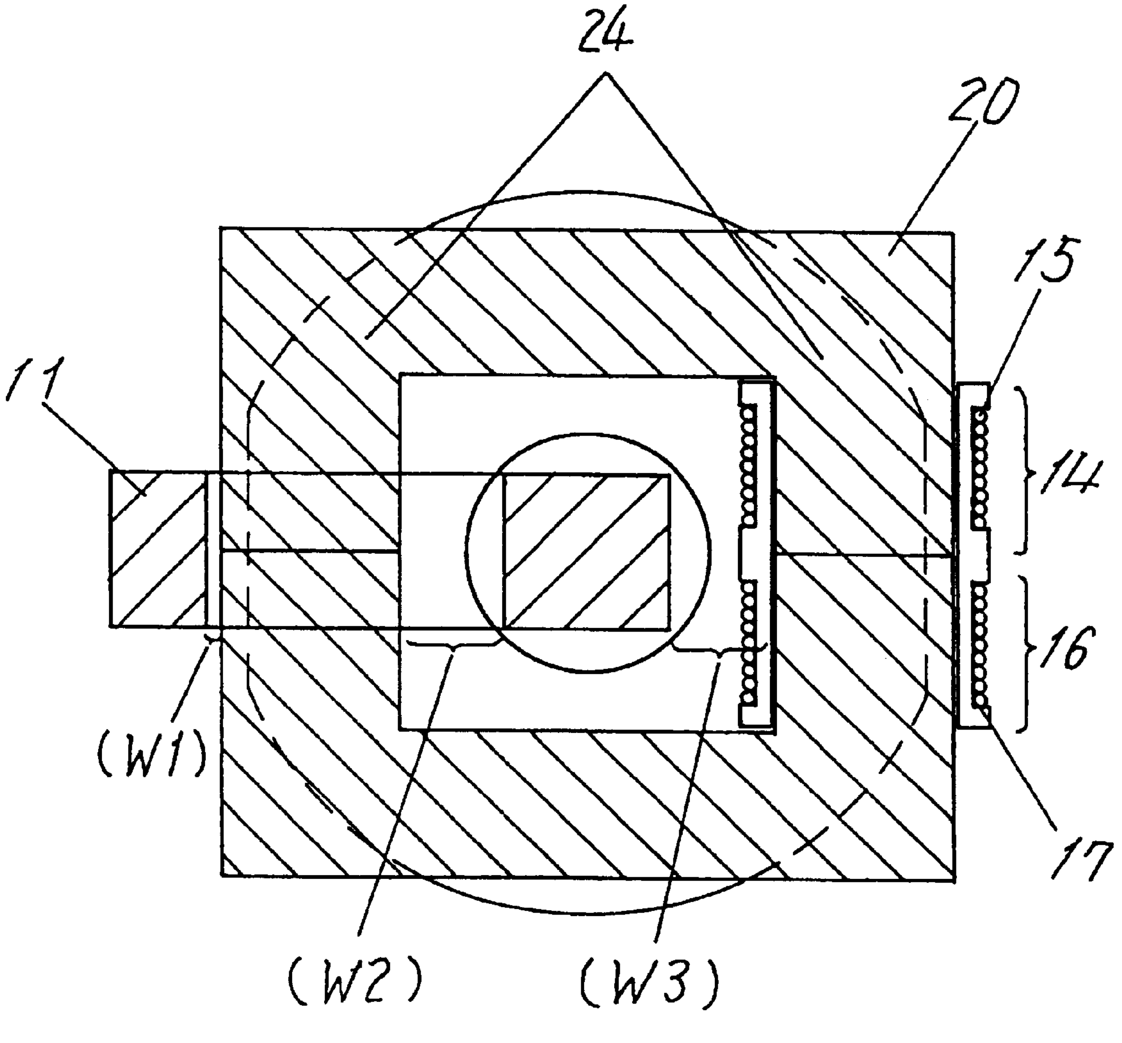
FIG. 11 is a sectioned right side view of another line filter.
Figure 12:
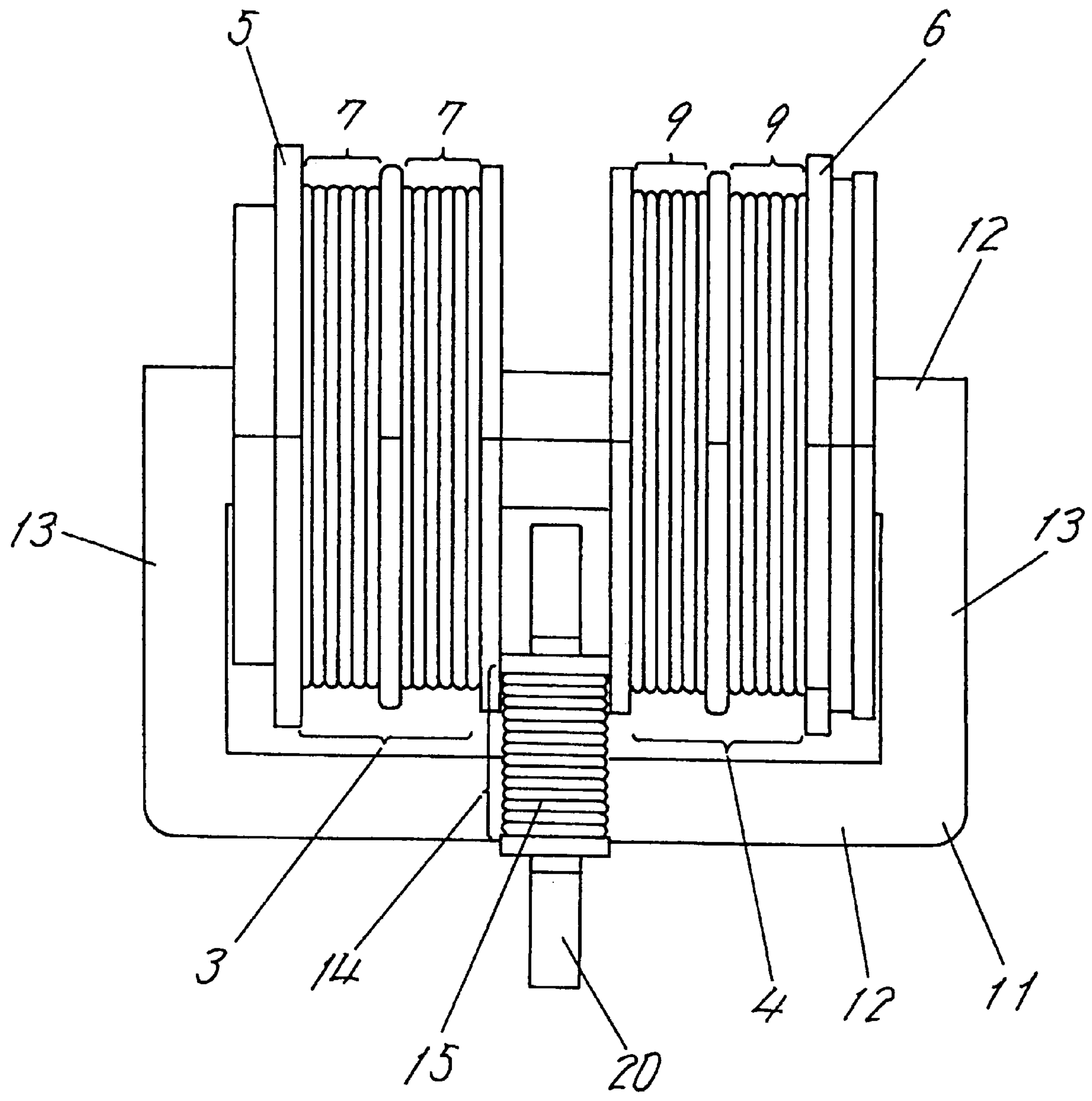
FIG. 12 is a plan view of a line filter according to a second exemplary embodiment of this invention.
Figure 13:
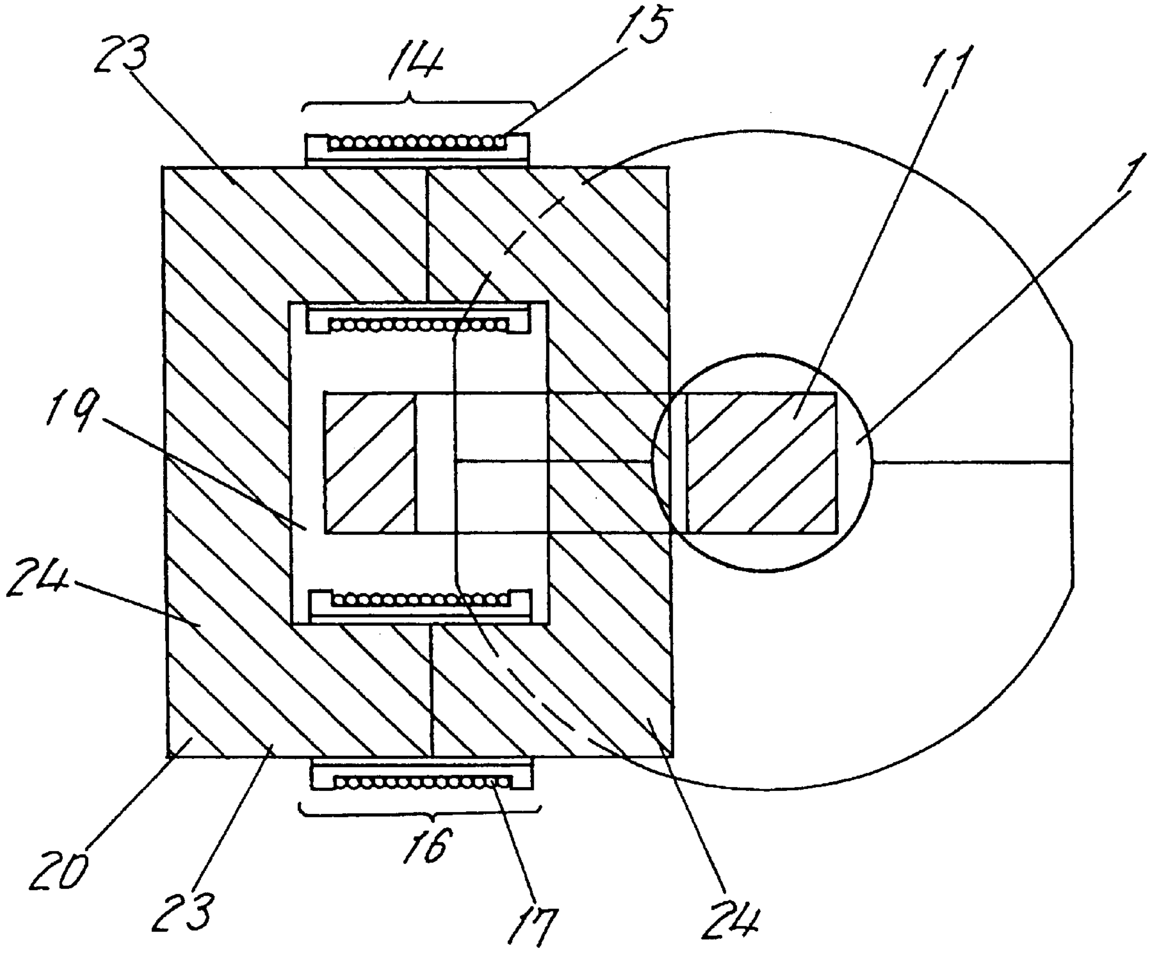
FIG. 13 is a sectioned right side view of the same line filter.
Figure 14:
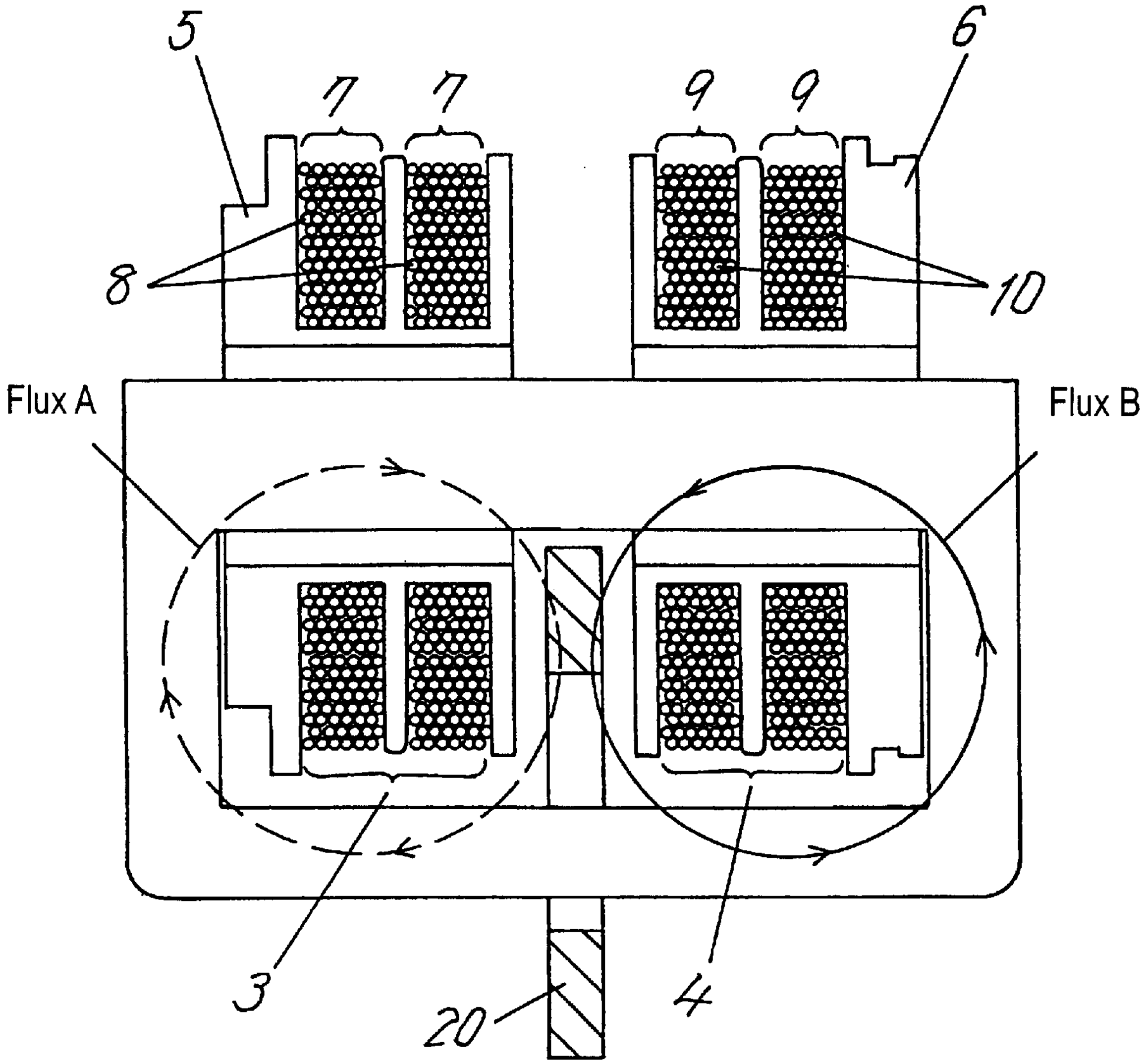
FIG. 14 is a schematic illustration of a magnetic circuit of the same line filter, depicting flows of magnetic flux caused by normal mode noise.
Figure 15:
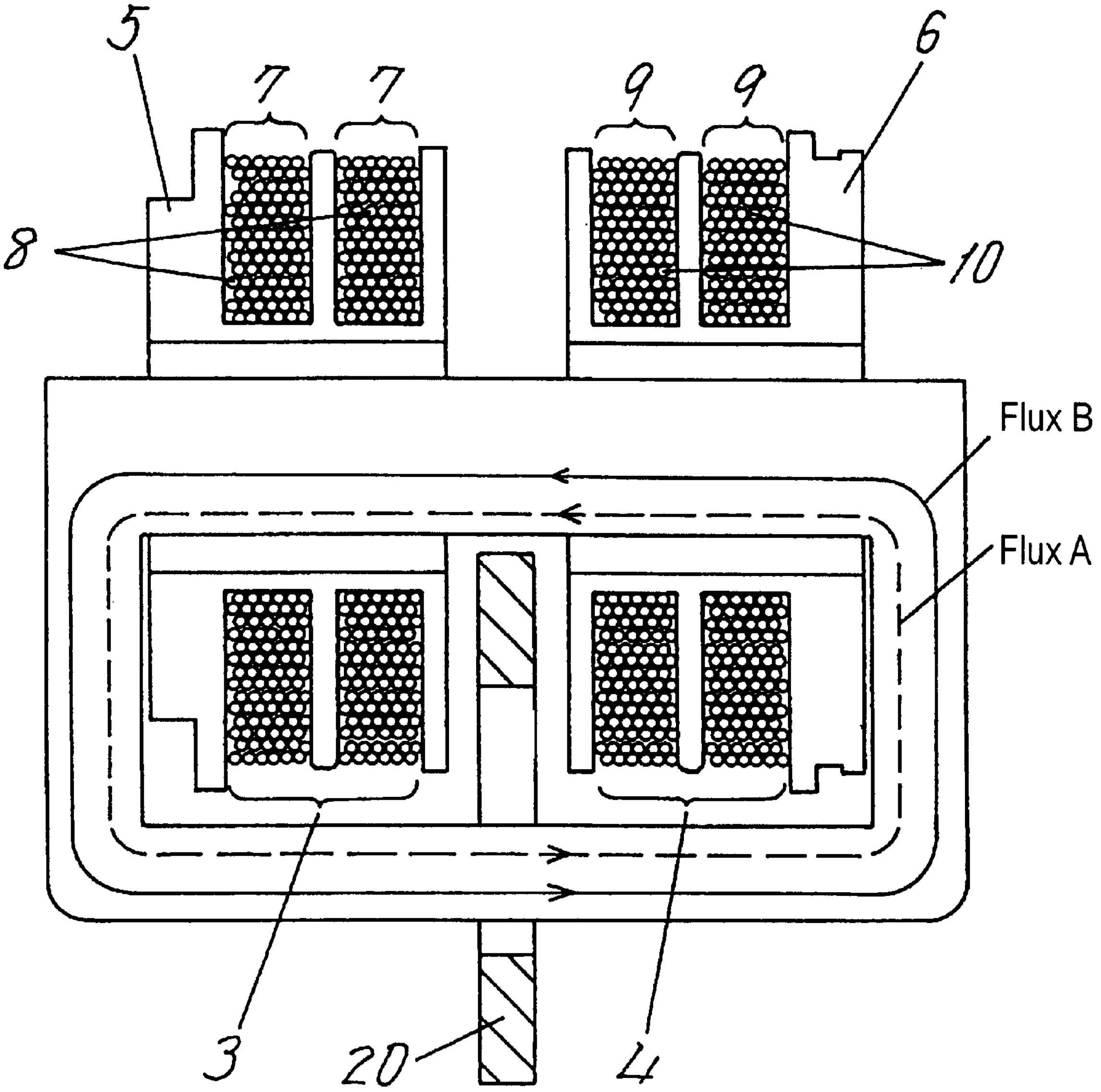
FIG. 15 is another schematic illustration of the magnetic circuit of the same line filter, depicting flows of magnetic flux caused by common mode noise in a first frequency band.

Here, the first and the second coils 14 and 16 for second band may be disposed adjacent to a periphery of the magnetic body 20, as shown in FIG. 11.

In this case, a through-the-air spacing (W1+W2) between the other magnetic frame-bar 24 of the magnetic body 20 surrounded by the frame-bars of the closed-loop magnetic core 11 and the closed-loop magnetic core 11 is set smaller than a spacing (W3) between the other magnetic frame-bar 24 of the magnetic body 20 not surrounded by the frame-bars of the closed-loop magnetic core 11 and the closed-loop magnetic core 11.

According to this structure, the magnetic flux A originating in the normal mode noise generated by the first coil unit 7, and the magnetic flux B originating in the normal mode noise generated by the second coil unit 9 hardly flow in a manner to circle around the magnetic body 20. Therefore, it can suppress a reduction in inductance for the common mode noises.

(Second Exemplary Embodiment)

A line filter according to second exemplary embodiment of this invention will be described hereinafter with referring to the accompanying figures.

The line filter in the second exemplary embodiment is an improvement of the line filter disclosed in the first exemplary embodiment.

In the line filter of the second exemplary embodiment shown in FIG. 12 through FIG. 15, magnetic body 20 is comprised of two confronting magnetic frame-bars 23 and two other confronting magnetic frame-bars 24, in a shape of square with opening 19. A magnetic frame-bar of closed-loop magnetic core 11 is inserted in the opening 19 of the magnetic body 20. It is a structure that the magnetic frame-bar inserted in the opening 19 of the magnetic body 20 is a different one from that inserted into through hole 1 of first bobbin 5 and through hole 1 of second bobbin 6.

Figure 16A:
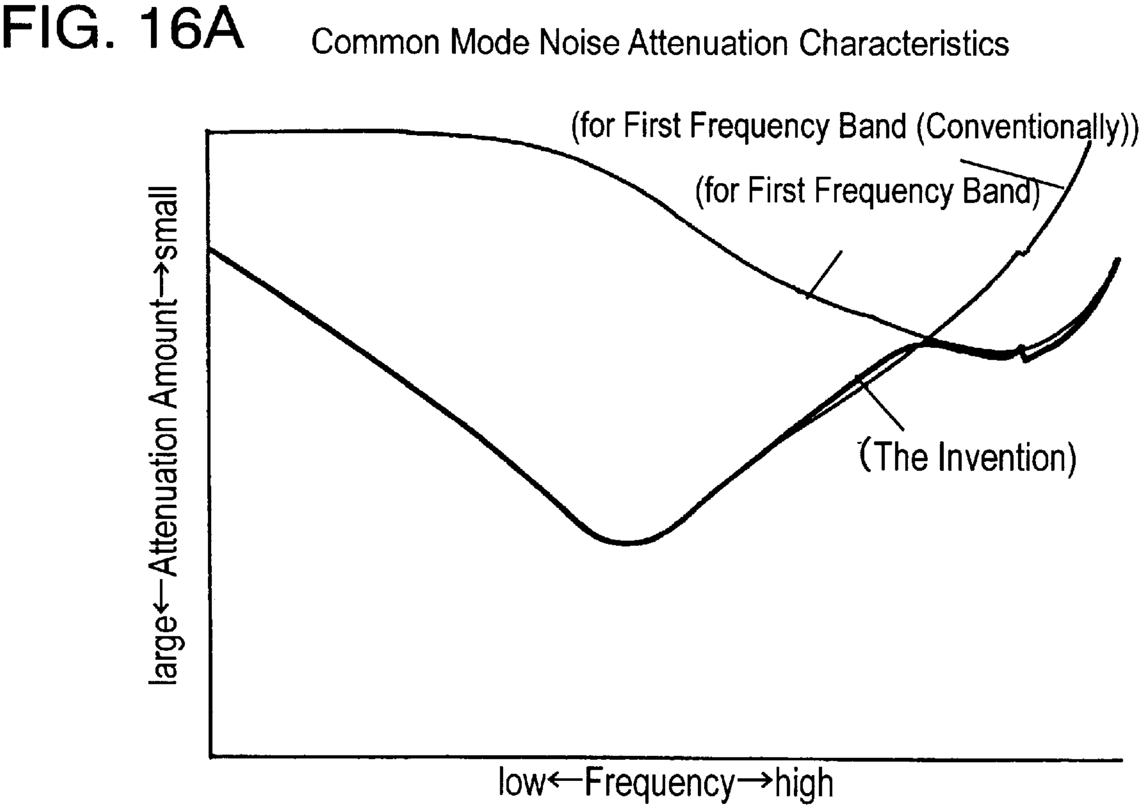
FIGS. 16A and 16B covers graphs representing frequency attenuation characteristics of the same line filter.
Figure 16B:
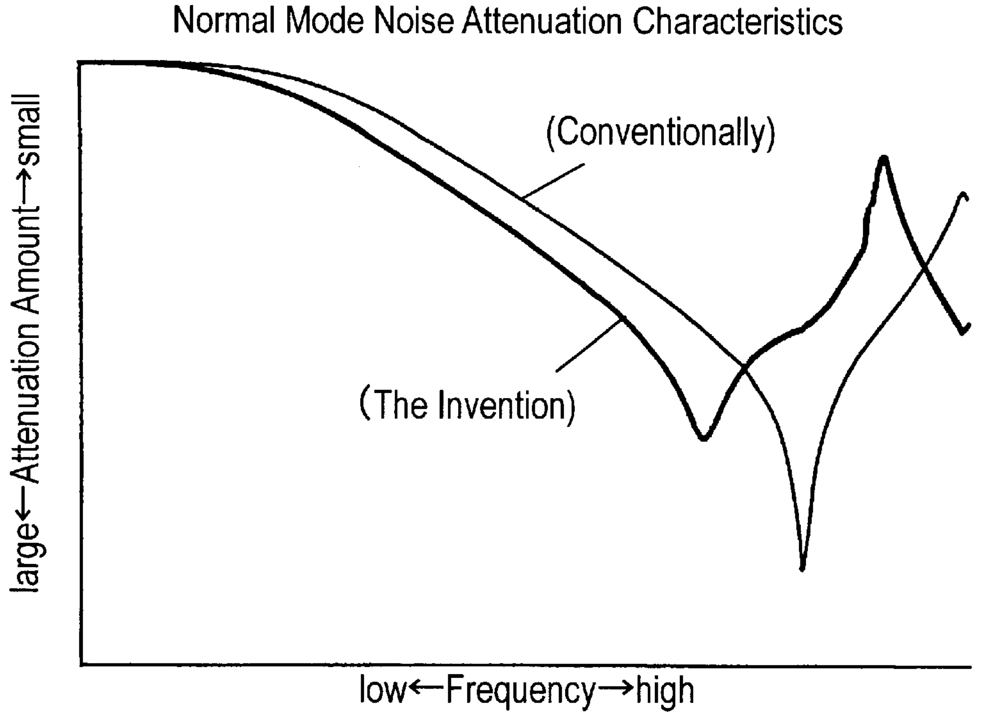
Figure 17:
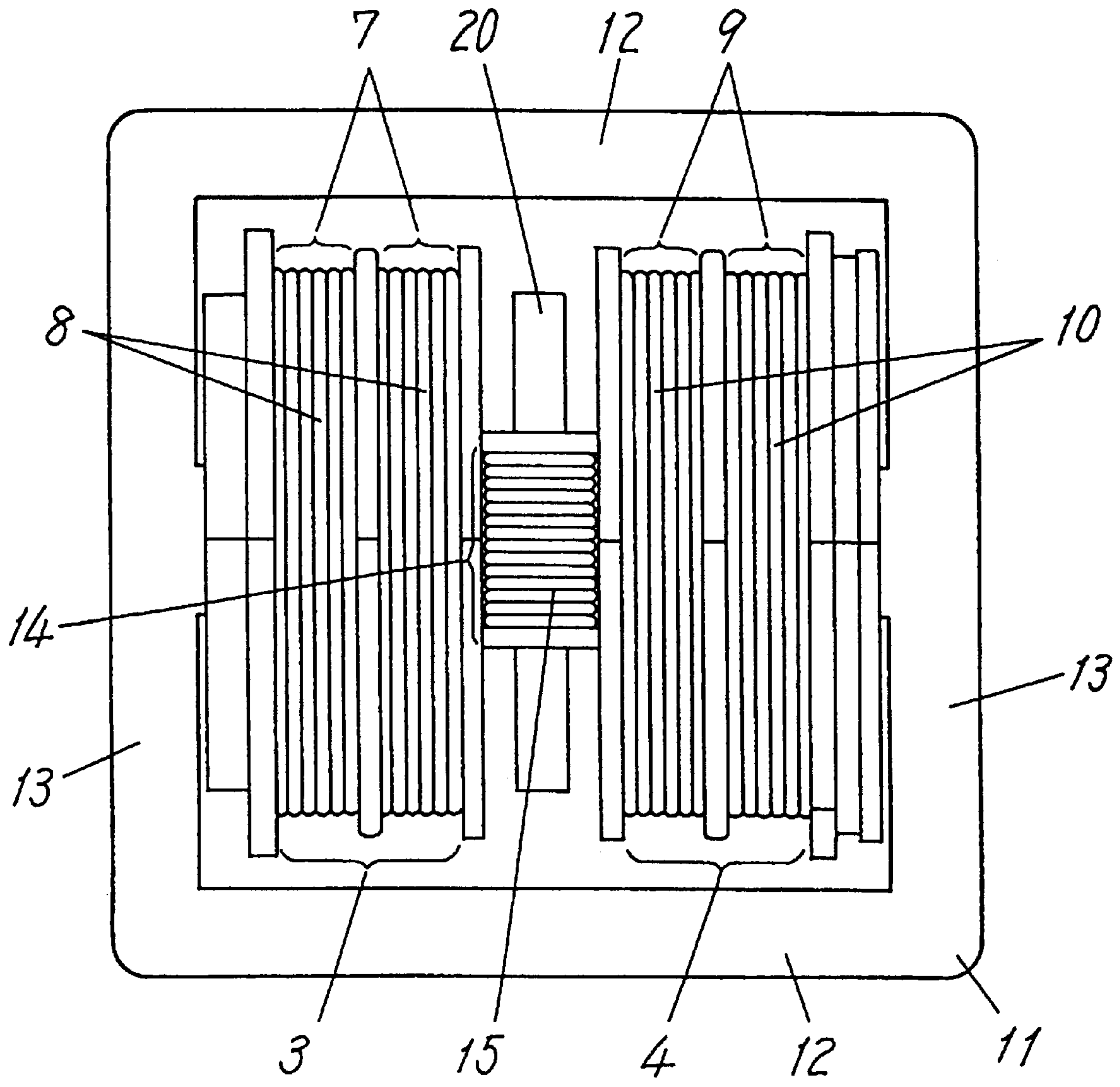
FIG. 17 is a plan view of a line filter according to a third exemplary embodiment of this invention.
Figure 18:
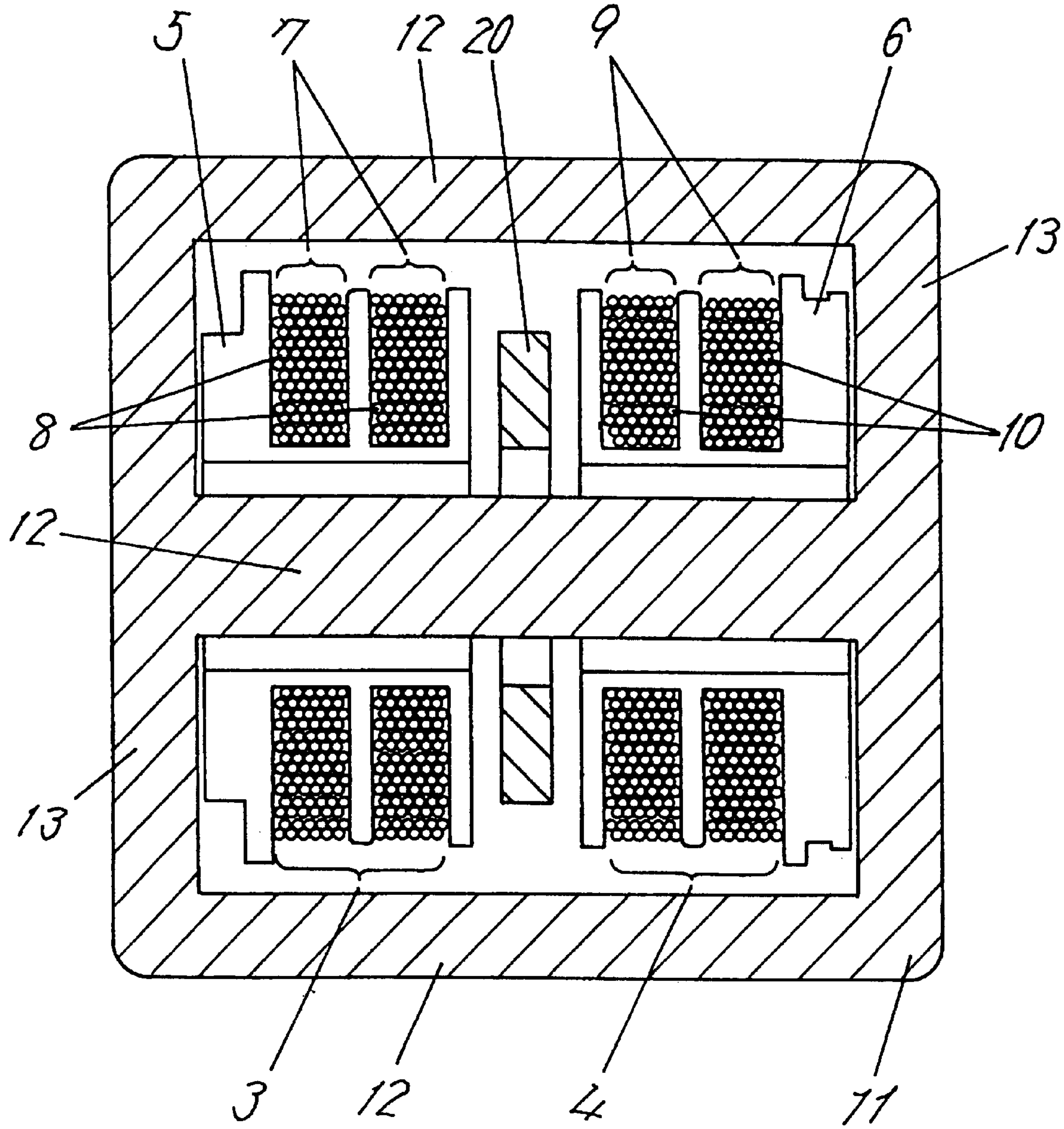
FIG. 18 is a sectioned plan view of the same line filter.
Figure 19:
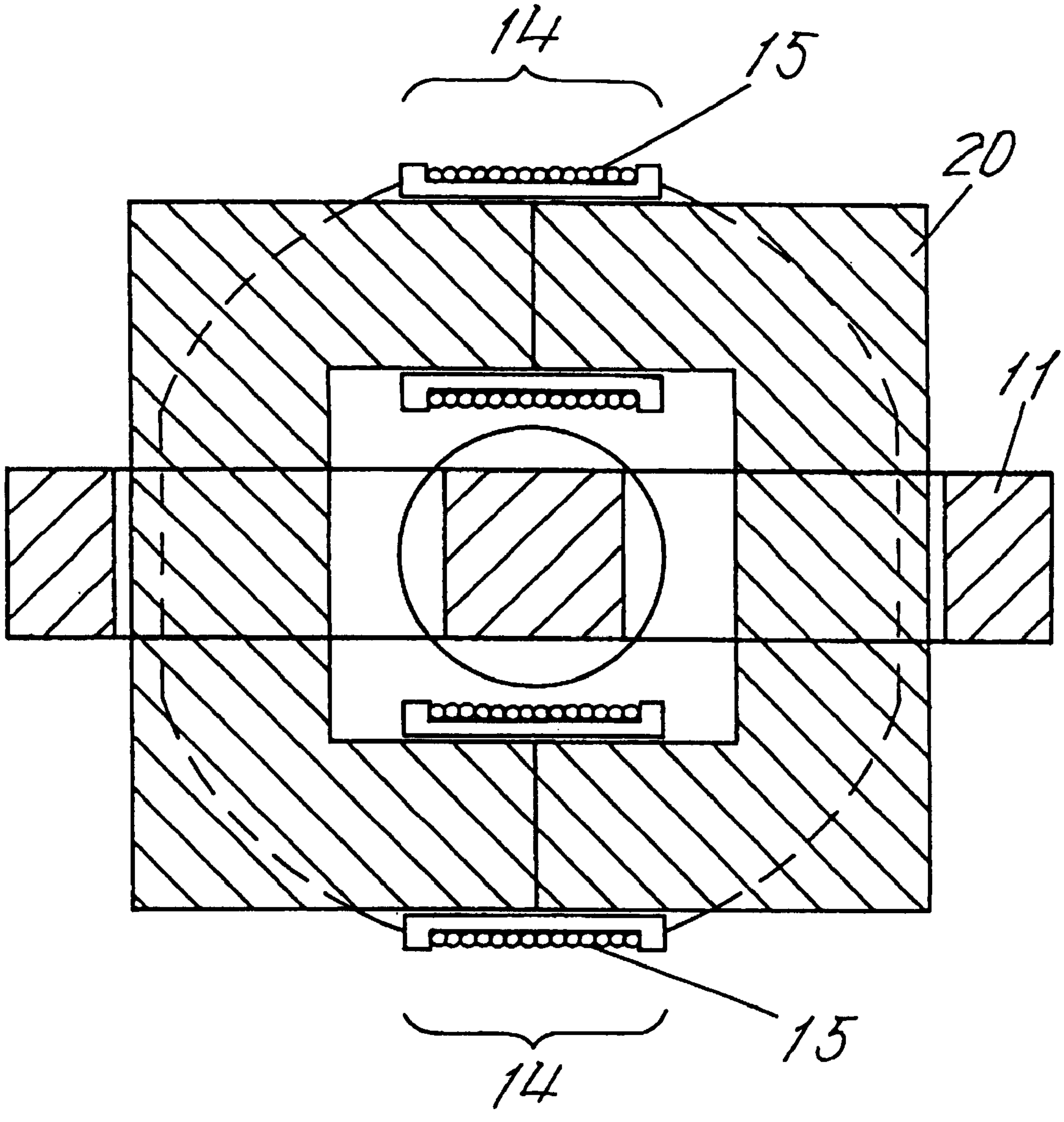
FIG. 19 is a sectioned right side view of the same line filter.
Figure 20:
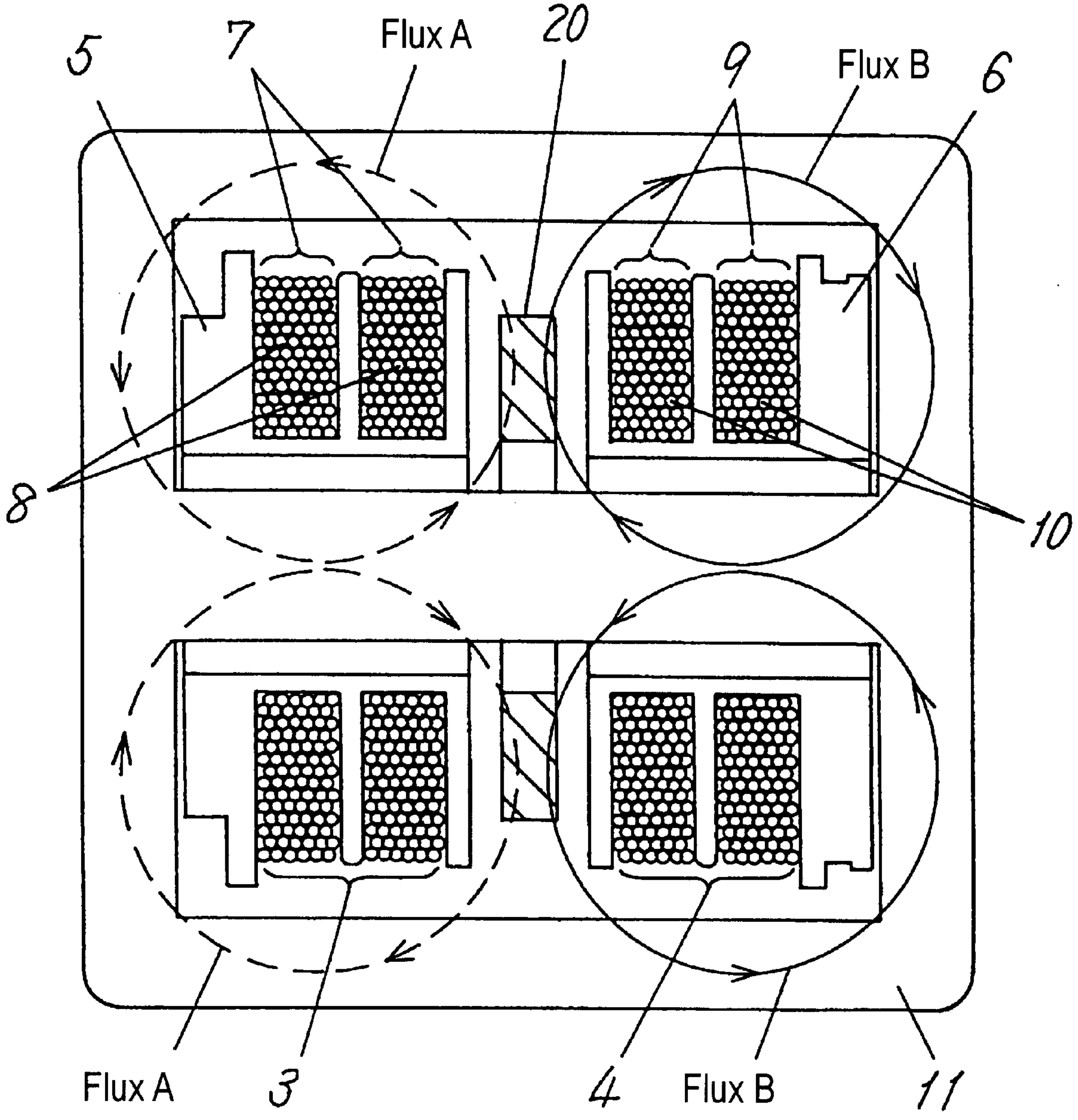
FIG. 20 is a schematic illustration of a magnetic circuit of the same line filter, depicting flows of magnetic flux caused by normal mode noise.
Figure 21:
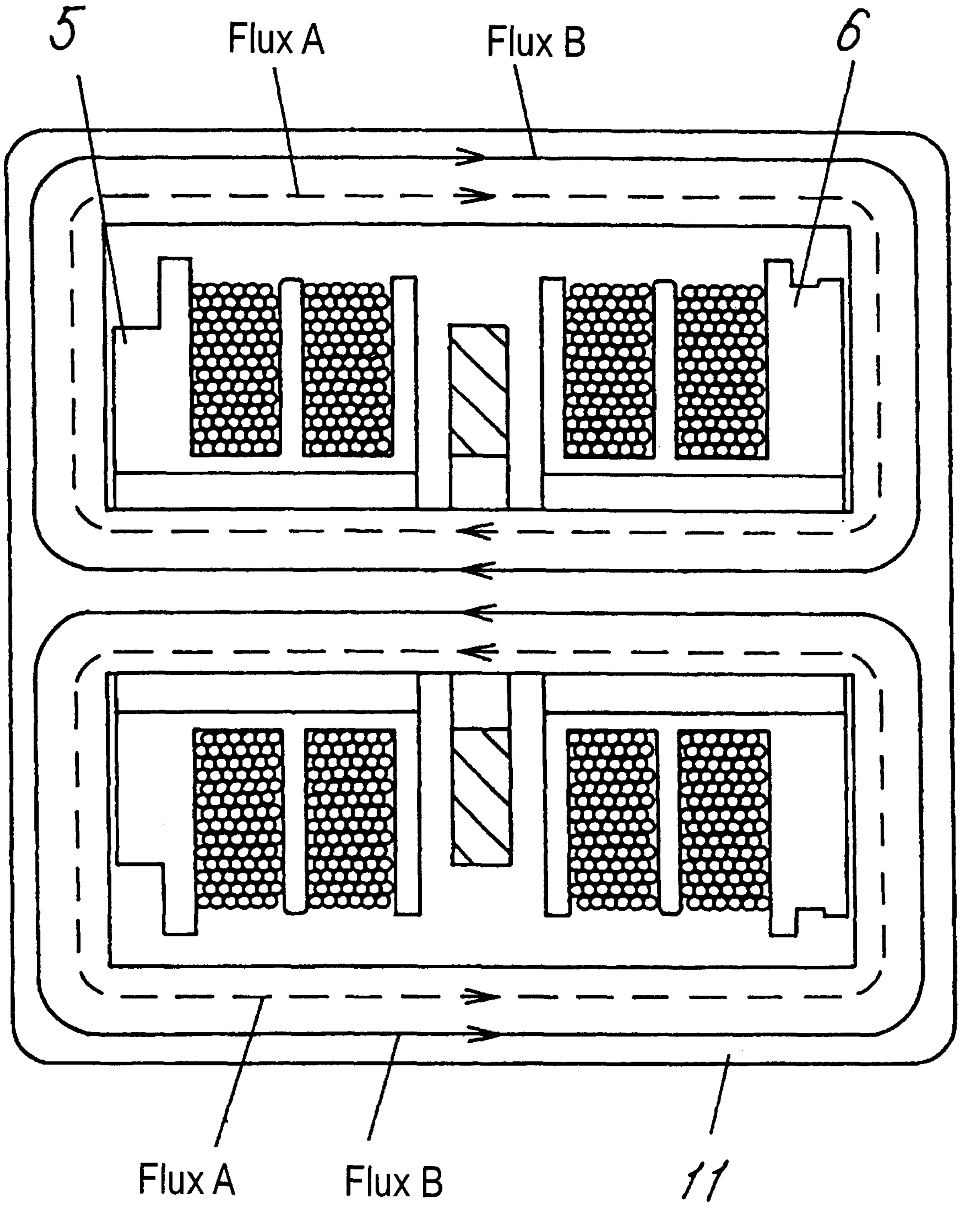
FIG. 21 is another schematic illustration of the magnetic circuit of the same line filter, depicting flows of magnetic flux caused by common mode noise in a first frequency band.
Figure 22:
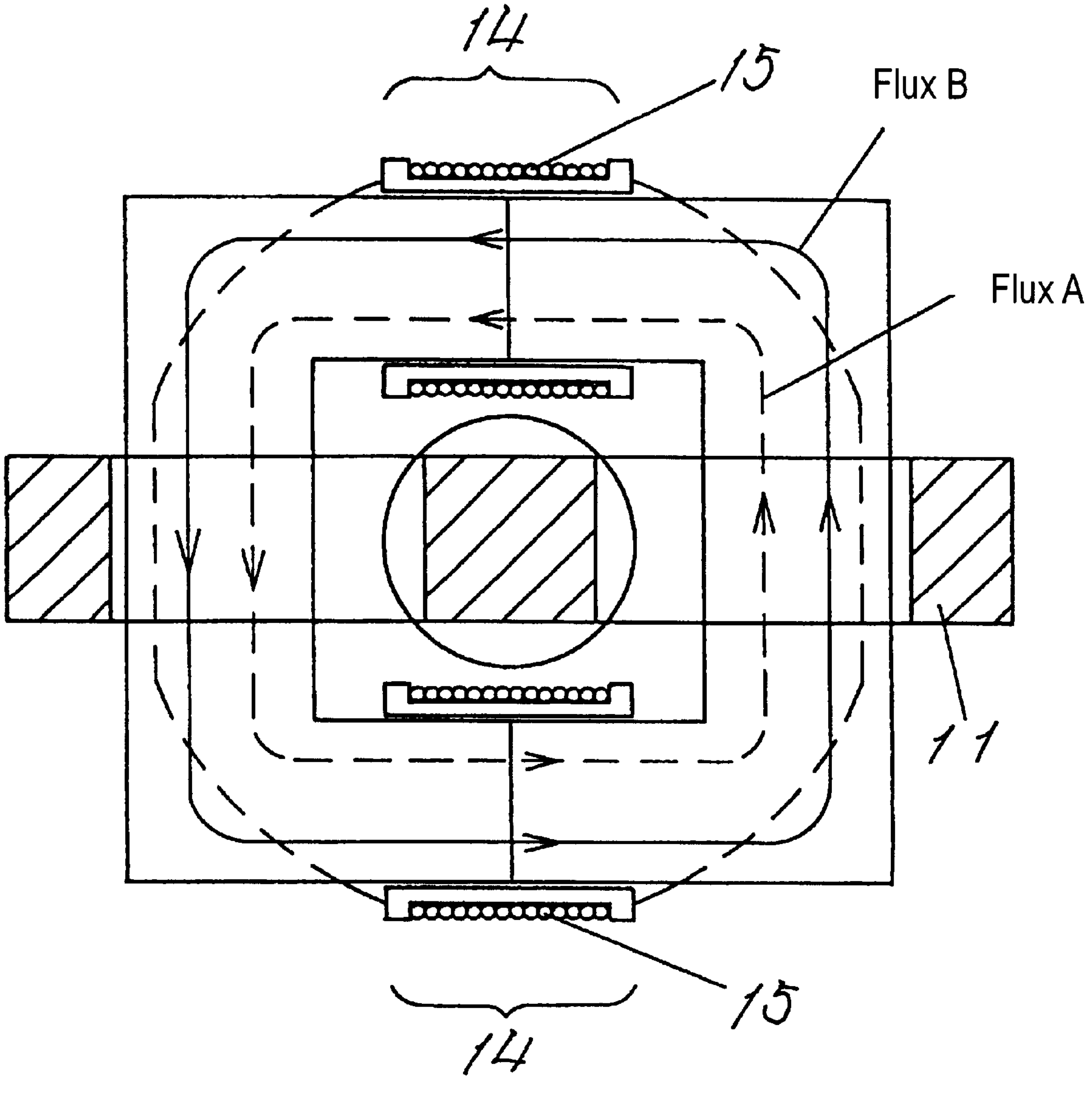
FIG. 22 is a schematic illustration of another magnetic circuit of the same line filter, depicting flows of magnetic flux caused by common mode noise in a second frequency band.

Here, frequency attenuation characteristics for common mode noises in a first frequency band, common mode noises in a second frequency band, and normal mode noises are such as shown in FIG. 16.

According to the foregoing structure, magnetic fluxes A and B generated by first coil unit 14 for second band and second coil unit 16 for second band concentrate in the magnetic body 20, so as to guide them easily into the same direction. This can thus improve further the attenuation characteristic in the second frequency band for eliminating the common mode noises.

(Third Exemplary Embodiment)

A line filter according to third exemplary embodiment of this invention will be described hereinafter with referring to the accompanying figures.

The line filter in the third exemplary embodiment is an improvement of the line filter disclosed in the first exemplary embodiment.

In the line filter of the third exemplary embodiment shown in FIG. 17 through FIG. 22, closed-loop magnetic core 11 is constructed into a double-square shape. In addition, the structure is such that magnetic frame-bar 12 in a center position among three confronting magnetic frame-bars 12 is inserted in through hole 1 of first bobbin 5 and another through hole 1 of second bobbin 6.

Figure 23A:
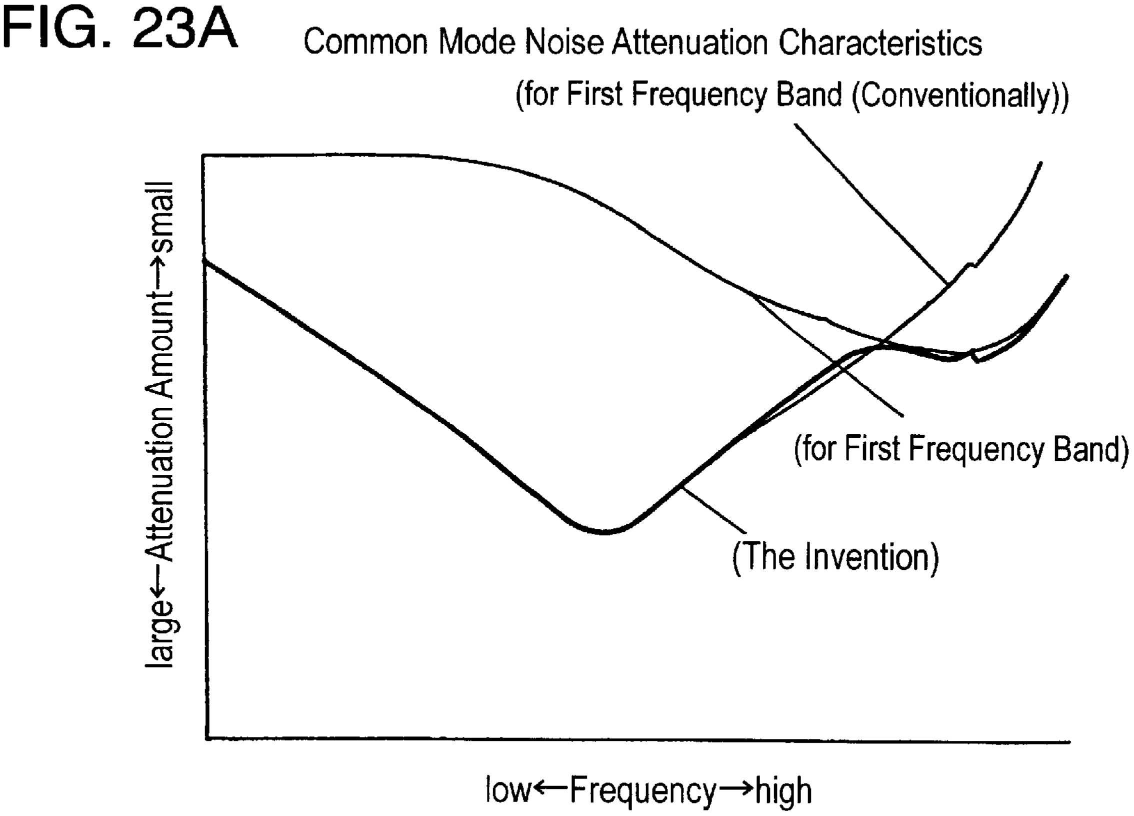
FIGS. 23A and 23B covers graphs representing frequency attenuation characteristics of the same line filter.
Figure 23B:
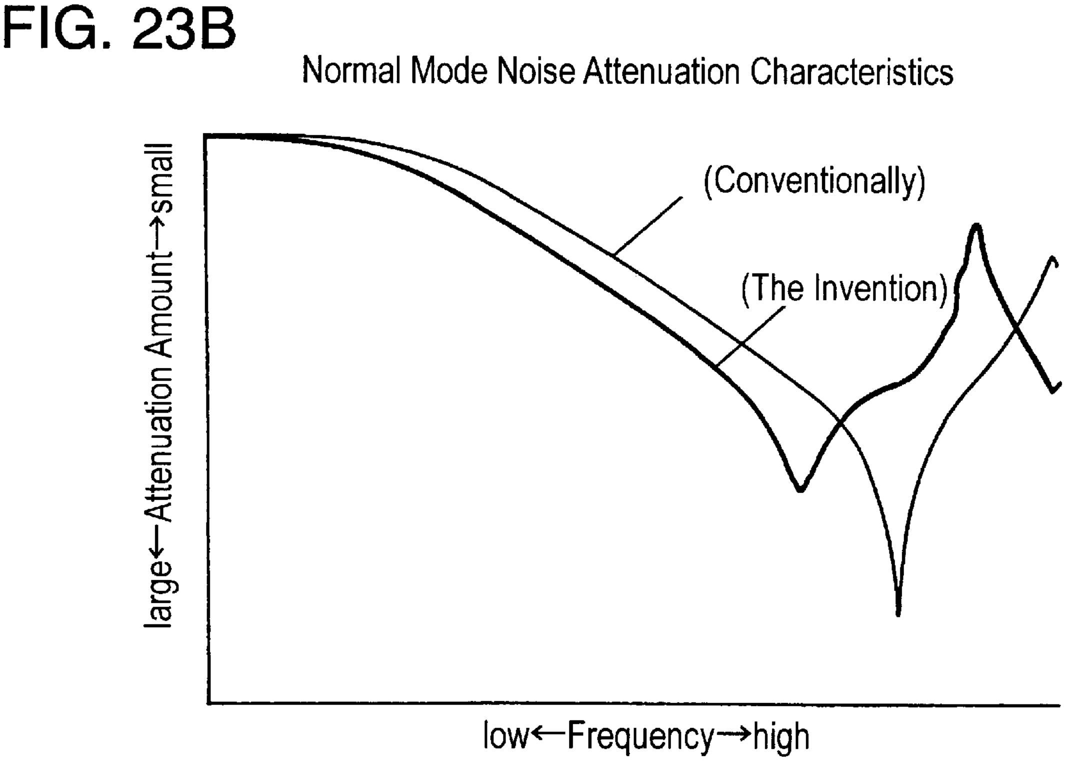

In this embodiment, frequency attenuation characteristics for common mode noises in the first frequency band, common mode noises in the second frequency band, and normal mode noises are shown in FIG. 23.

With the above-described structure, the common mode noises can be adequately eliminated even when the closed-loop magnetic core 11 is constructed into the double-square shape.

(Fourth Exemplary Embodiment)

A line filter according to fourth exemplary embodiment of this invention will be described hereinafter with referring to the accompanying figures.

The line filter in the fourth exemplary embodiment is an improvement of the line filter disclosed in the third exemplary embodiment.

Figure 24:
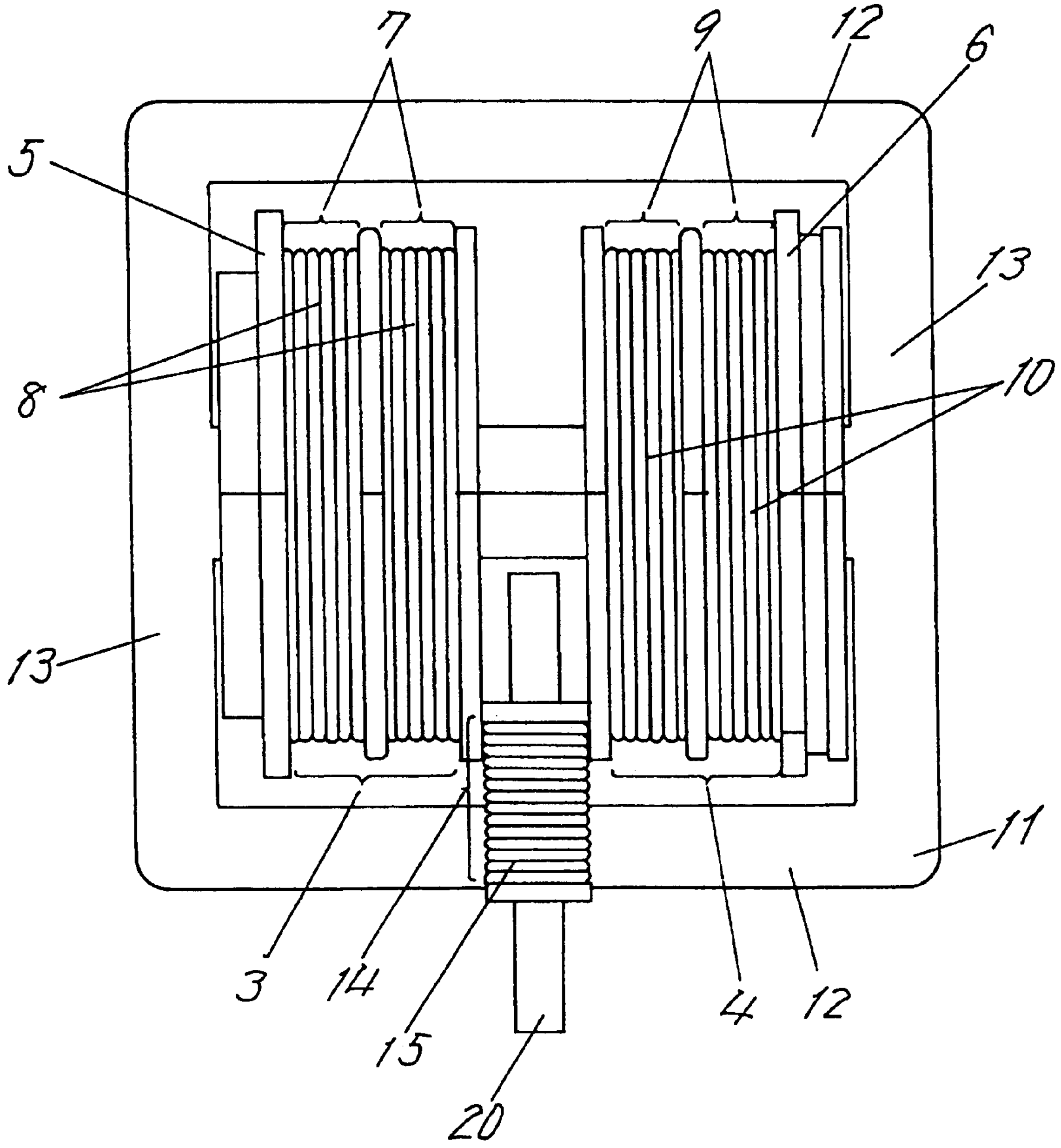
FIG. 24 is a plan view of a line filter according to a fourth exemplary embodiment of this invention.
Figure 25:
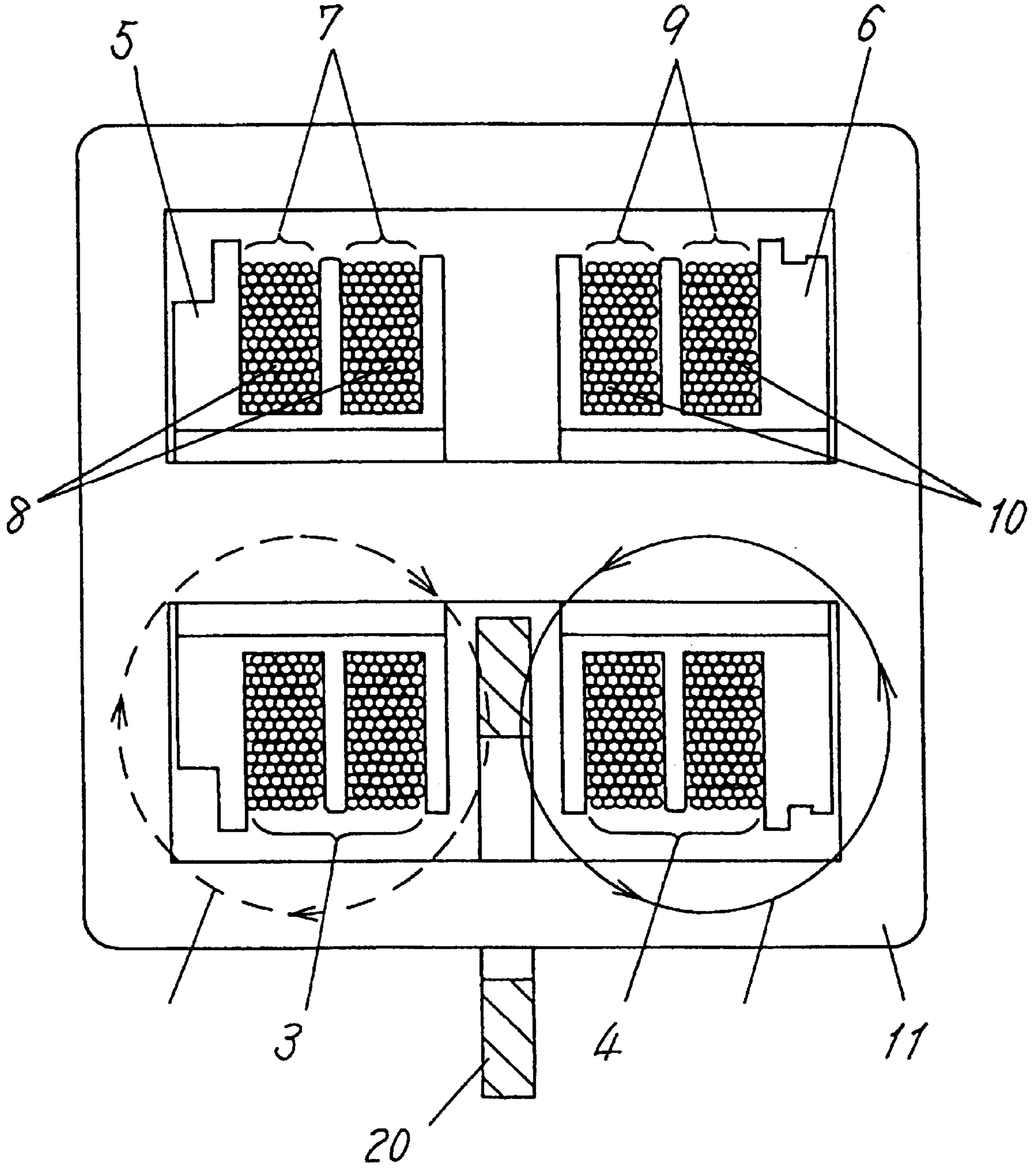
FIG. 25 is a schematic illustration of a magnetic circuit of the same line filter, depicting flows of magnetic flux caused by normal mode noise.
Figure 26:
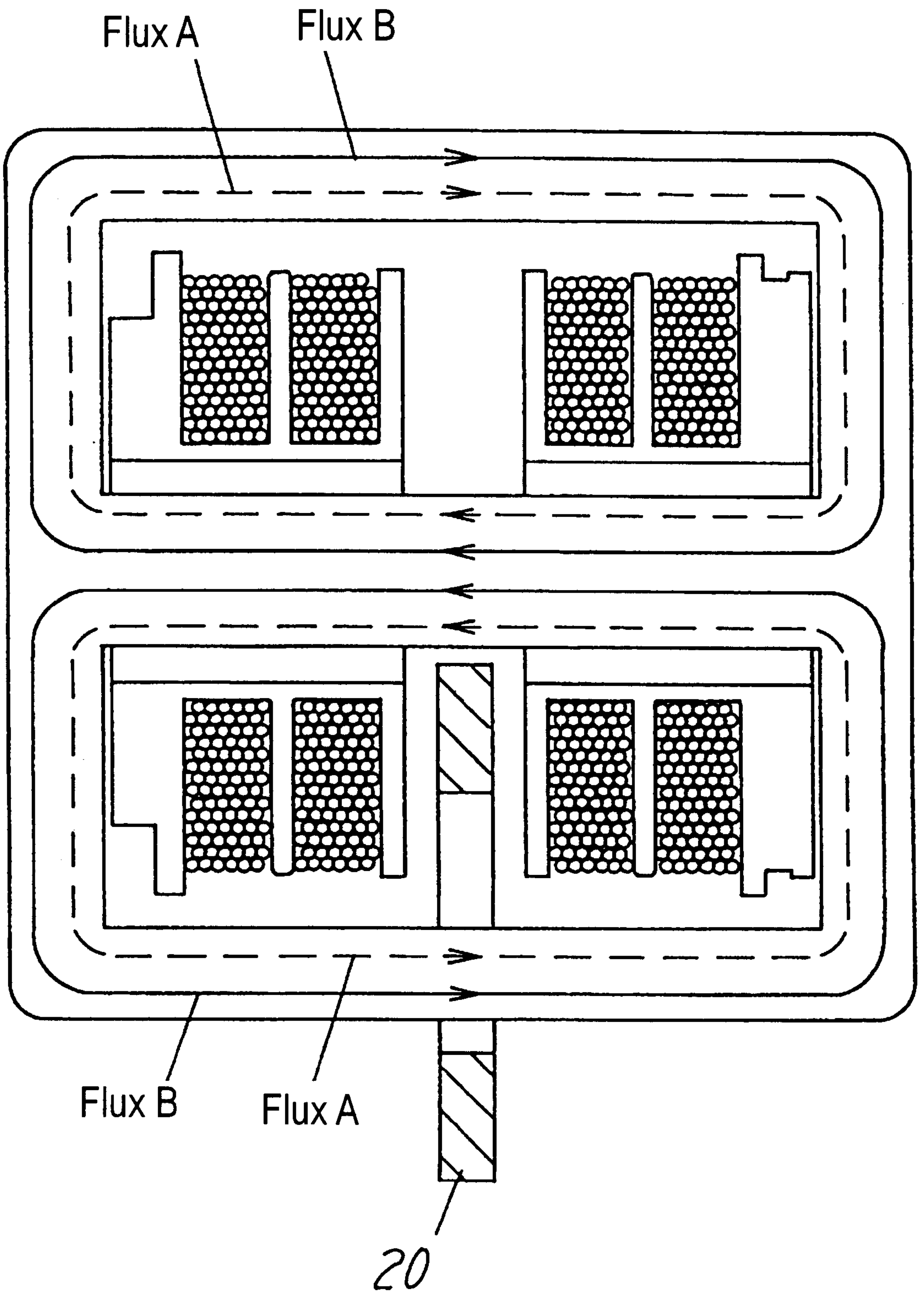
FIG. 26 is another schematic illustration of the magnetic circuit of the same line filter, depicting flows of magnetic flux caused by common mode noise in a first frequency band.

In the line filter of the fourth exemplary embodiment shown in FIG. 24 through FIG. 26, closed-loop magnetic core 11 is constructed into a double-square shape. In addition, the structure is such that magnetic frame-bar 12 located at an outside among three confronting magnetic frame-bars 12 is inserted in through hole 1 of first bobbin 5 and another through hole 1 of second bobbin 6.

Figure 27A:
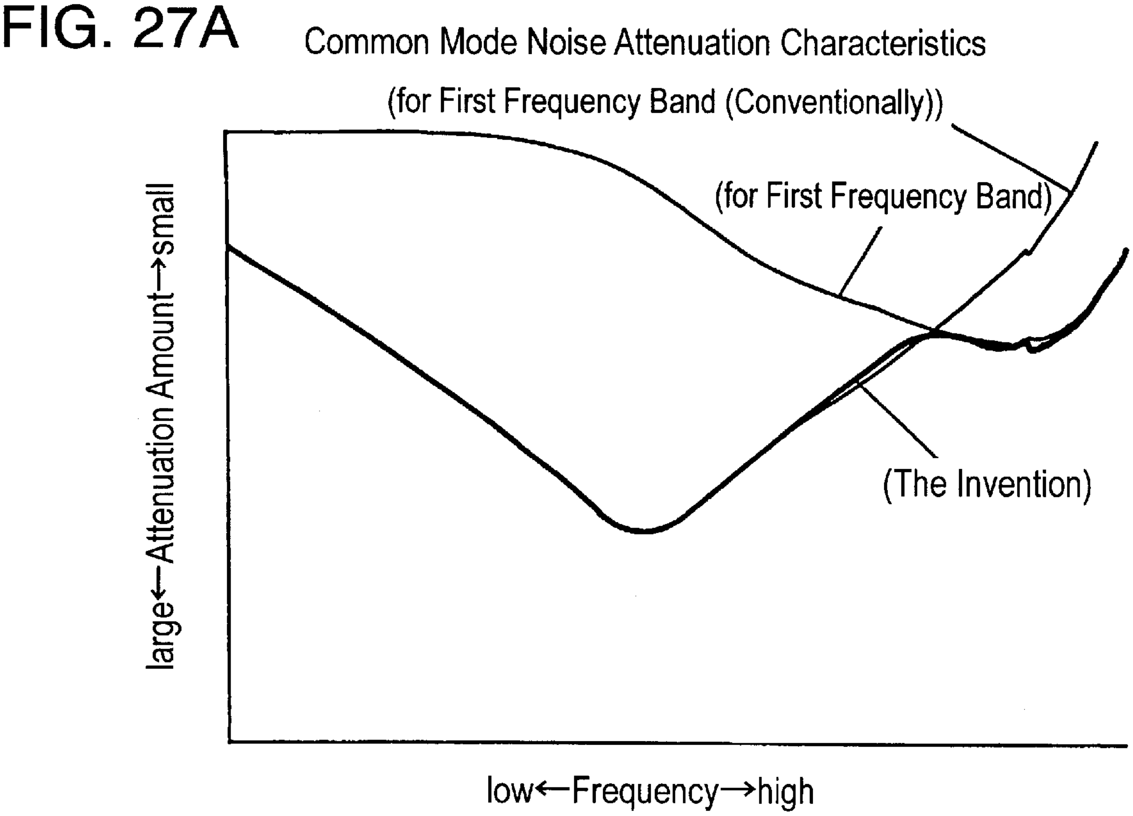
FIG. 27A and 27B covers graphs representing respective frequency attenuation characteristics of the same line filter.
Figure 27B:
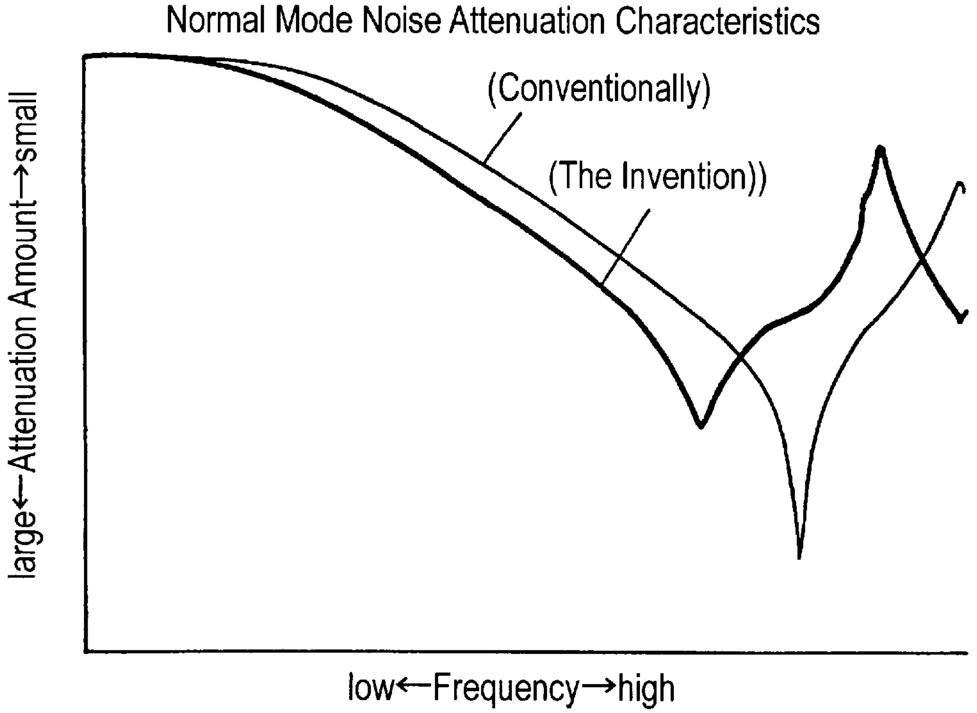
Figure 28:
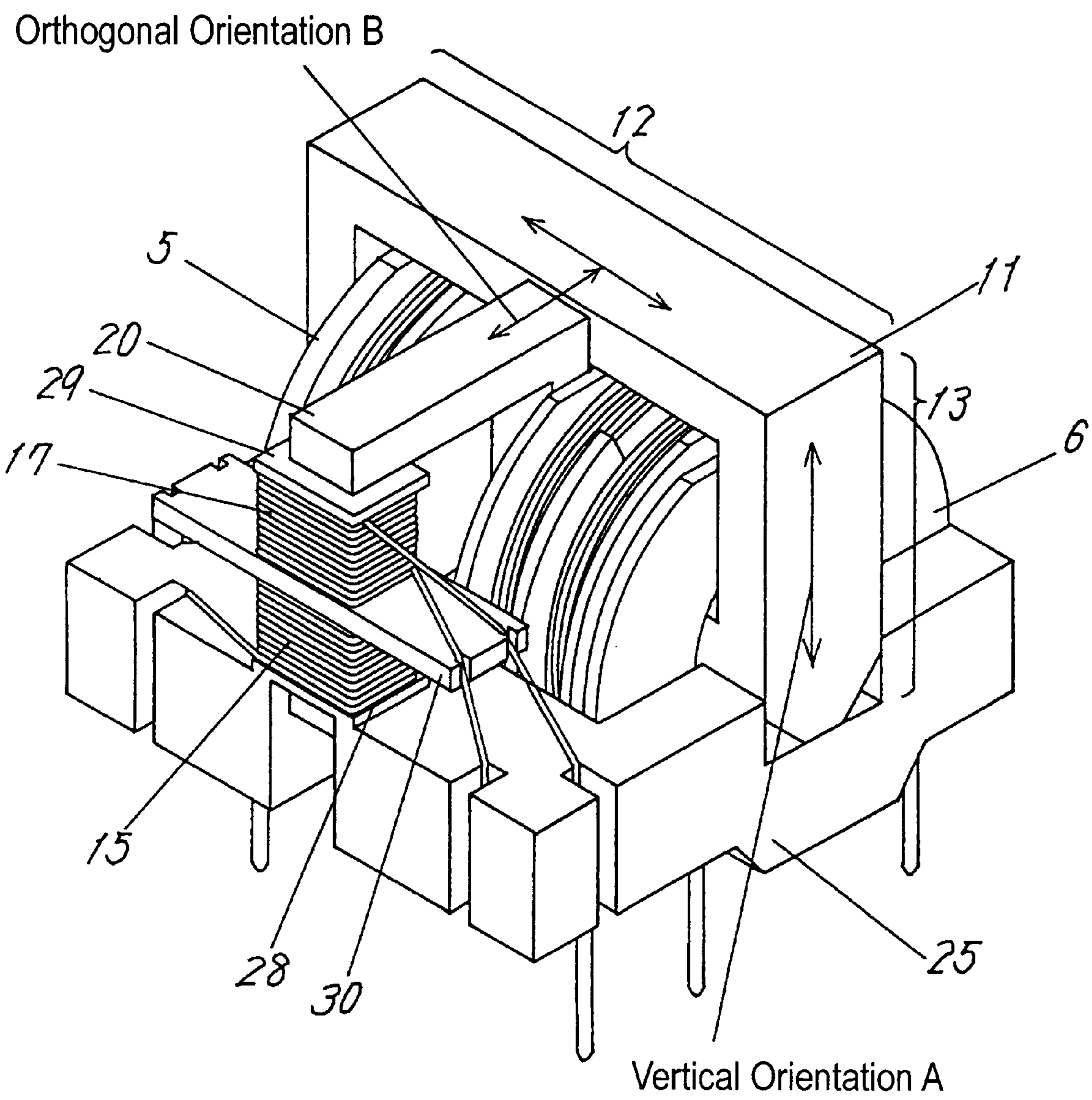
FIG. 28 is a perspective view of a line filter according to a fifth exemplary embodiment.
Figure 29:
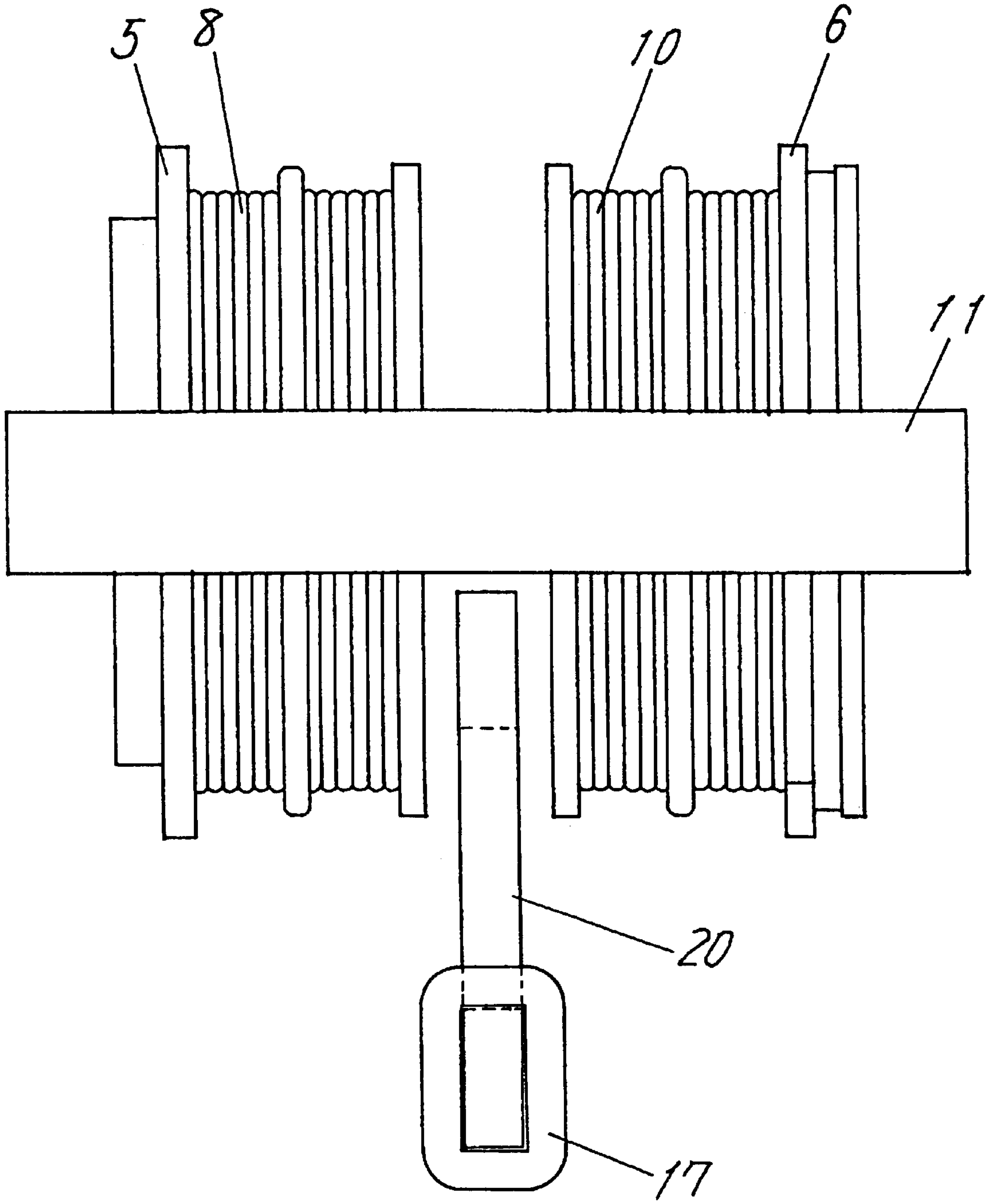
FIG. 29 is a plan view of the same line filter depicting a positional relation between a closed-loop magnetic core wound with first and second coils and a magnetic body wound with first and second coils for second band.
Figure 30:
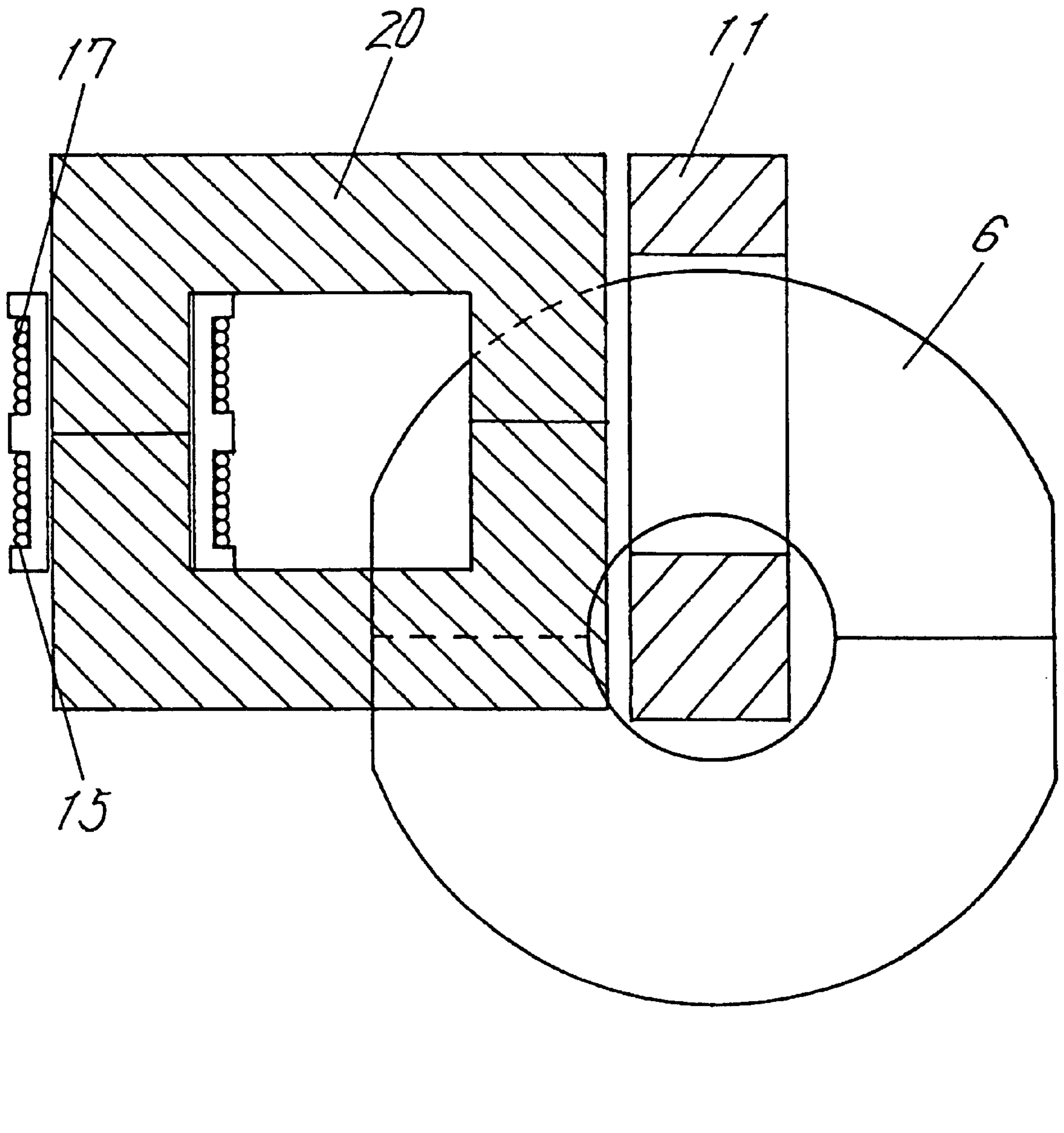
FIG. 30 is a sectioned right side view of the same line filter depicting the positional relation between the closed-loop magnetic core wound with the first and the second coils and the magnetic body wound with the first and the second coils for second band.
Figure 31:
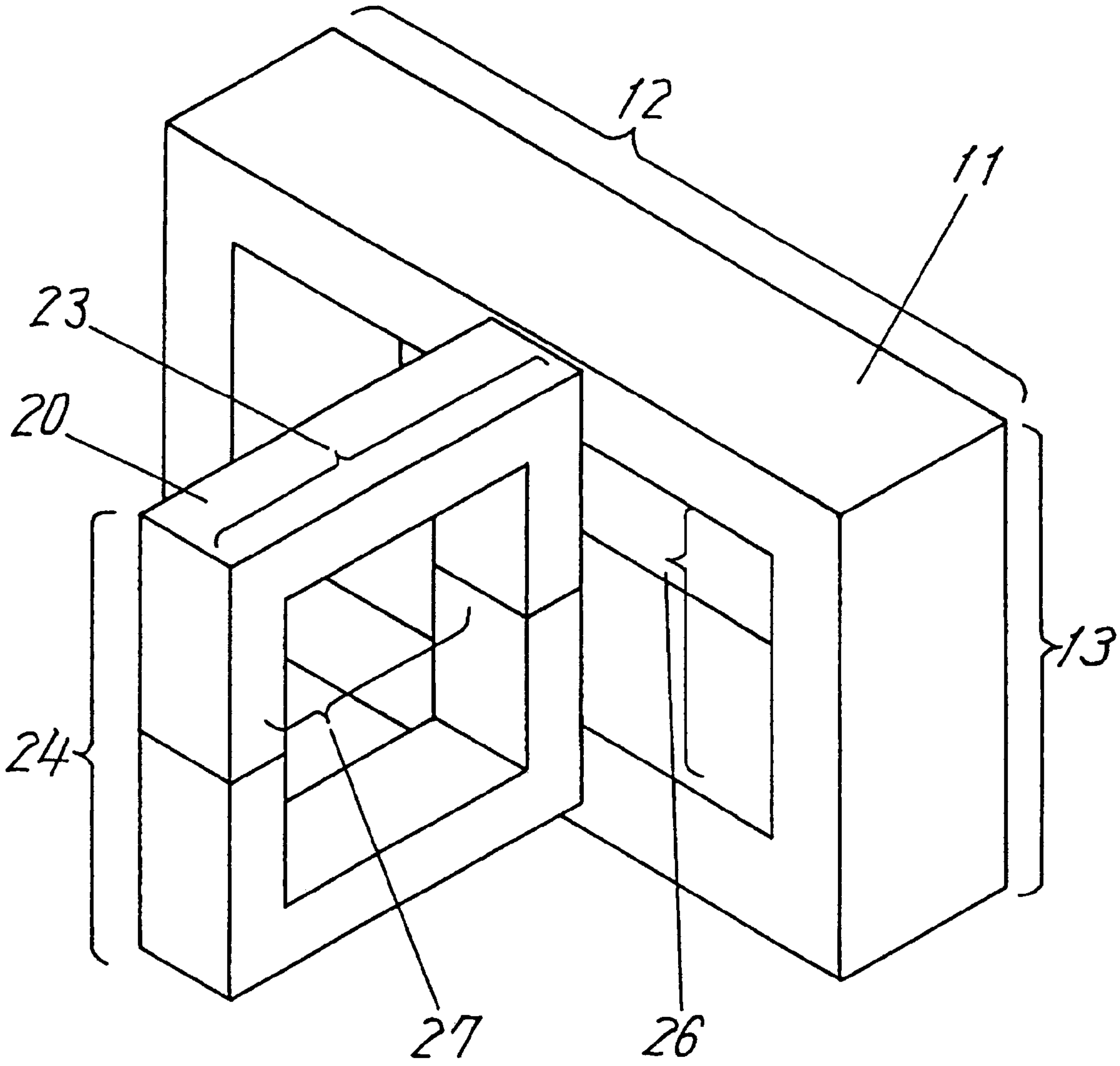
FIG. 31 is a perspective view of the same line filter depicting the positional relation between the closed-loop magnetic core and the magnetic body.
Figure 32:
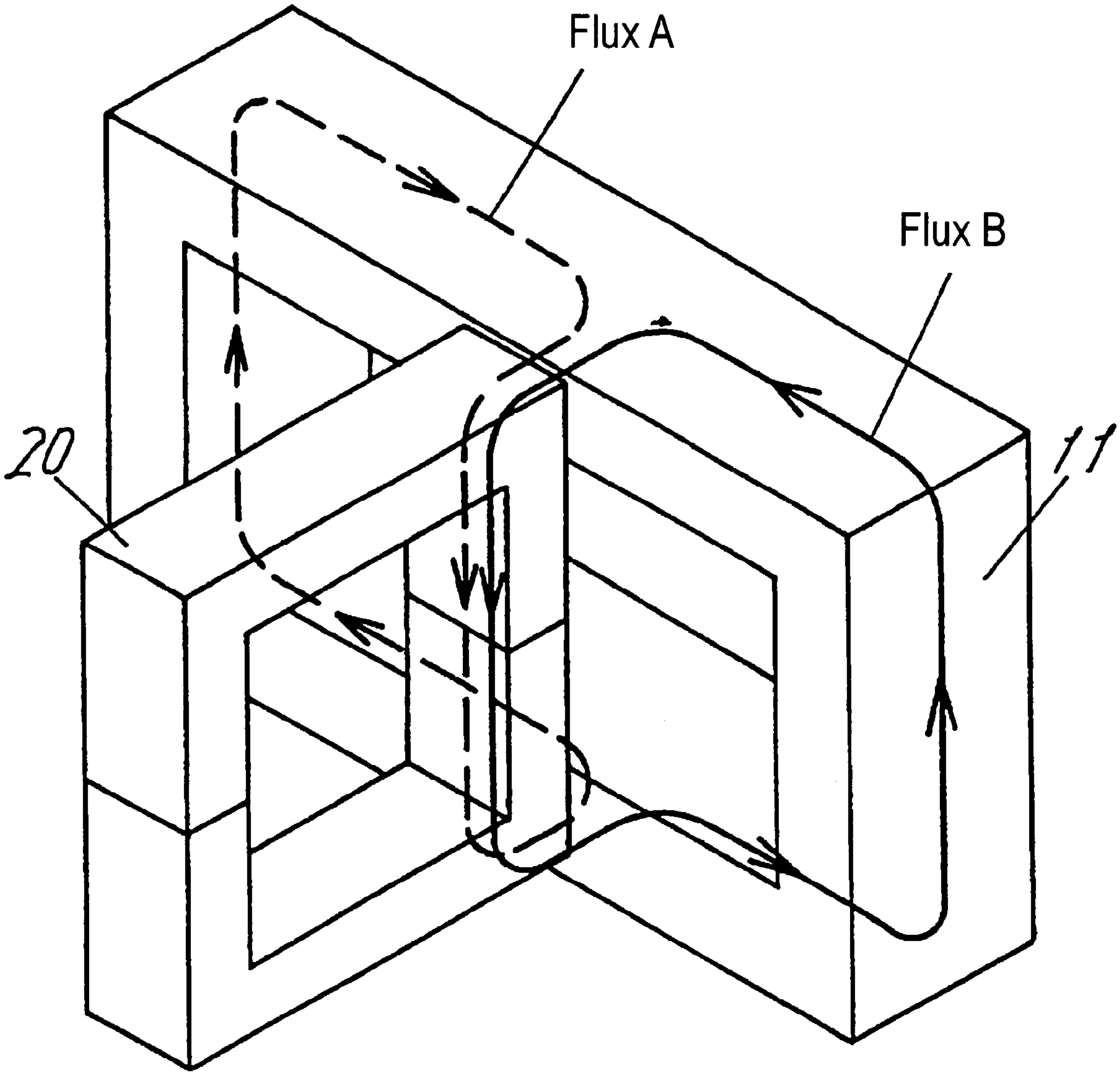
FIG. 32 is a schematic illustration of a magnetic circuit of the same line filter, depicting flows of magnetic flux caused by normal mode noise.
Figure 33:
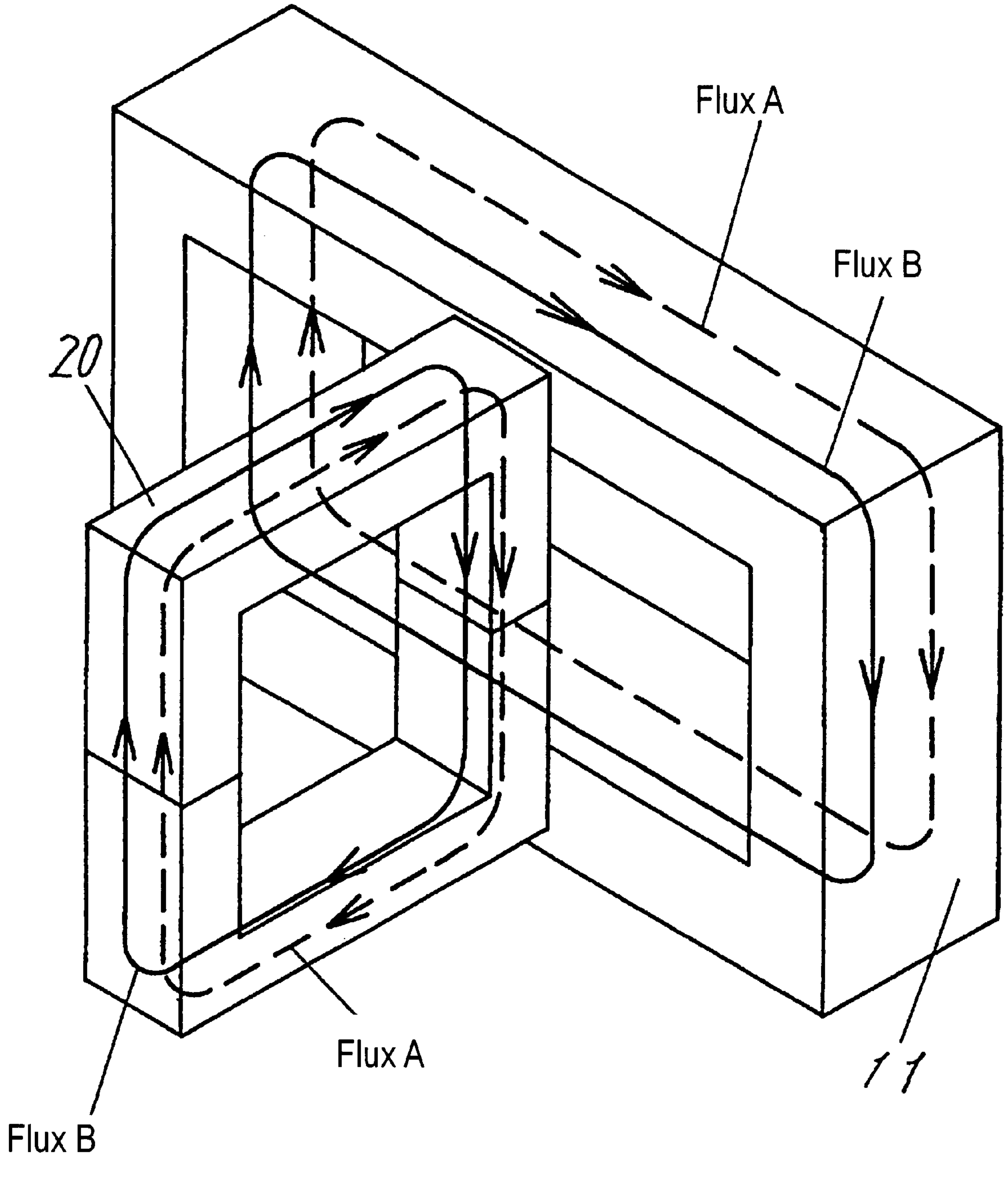
FIG. 33 is another schematic illustration of the magnetic circuit of the same line filter, depicting flows of magnetic flux caused by common mode noise in a first frequency band and a second frequency band.

In this embodiment, frequency attenuation characteristics for common mode noises in the first frequency band, common mode noises in the second frequency band, and normal mode noises are shown in FIG. 27.

With the above-described structure, the common mode noises can be adequately eliminated even when the closed-loop magnetic core 11 is constructed into the double-square shape.

(Fifth Exemplary Embodiment)

A line filter according to fifth exemplary embodiment of this invention will be described hereinafter with referring to the accompanying figures.

The line filter in the fifth exemplary embodiment is an improvement of the line filter disclosed in the first exemplary embodiment.

The line filter of the fifth exemplary embodiment shown in FIG. 28 through FIG. 33 is provided with terminal block 25. Closed-loop magnetic core 11 and magnetic body 20 are disposed respectively in a vertical orientation (A) to the terminal block 25. The closed-loop magnetic core 11 and magnetic body 20 are so arranged that they situate in an orthogonal orientation (B) with respect to each other. None of their magnetic frame-bars is inserted in any of opening 26 of the closed-loop magnetic core 11 and opening 27 of the magnetic body 20.

The terminal block 25 includes first bobbin 28 for second band, on which first coil 15 for second band is wound, and second bobbin 29 for second band, on which second coil 17 for second band is wound, both molded unitary near a front center portion of the block. The magnetic body 20 positioned in the orthogonal orientation (B) to the closed-loop magnetic core 11 is inserted in through holes of the first and the second bobbins 28 and 29 for second band.

In addition, the first bobbin 28 for second band and the second bobbin 29 for second band are serially connected, and separating flange 30 is provided at the connecting portion.

In this embodiment, frequency attenuation characteristics for common mode noises in the first frequency band, common mode noises in the second frequency band, and normal mode noises become equivalent to those of the first exemplary embodiment.

Because of the foregoing structure, magnetic fluxes generated by first coil unit 14 for second band and second coil unit 16 for second band are concentrated in the magnetic body 20, so as to lead the generated magnetic fluxes easily into the same direction. Hence, the attenuation characteristics of the second frequency band for eliminating the common mode noises can be improved furthermore.

In addition, since the terminal block 25 is molded unitary with the first bobbin 28 for second band and the second bobbin 29 for second band, it facilitates winding of the first coil 15 for second band and the second coil 17 for second band. It also reduces a number of components, which simplifies the manufacturing process, thereby reducing the cost.

Further, the first bobbin 28 for second band and the second bobbin 29 for second band are connected in series. Therefore, the first coil 15 for second band and the second coil 17 for second band can be wound without interruption, so as to further simplify the manufacturing process, and to reduce the cost.

Since separating flange 30 is provided, specifically at a connecting portion between the first bobbin 28 for second band and the second bobbin 29 for second band, the first coil 15 for second band and the second coil 17 for second band can be routed easily by using the separating flange 30.

Figure 34:
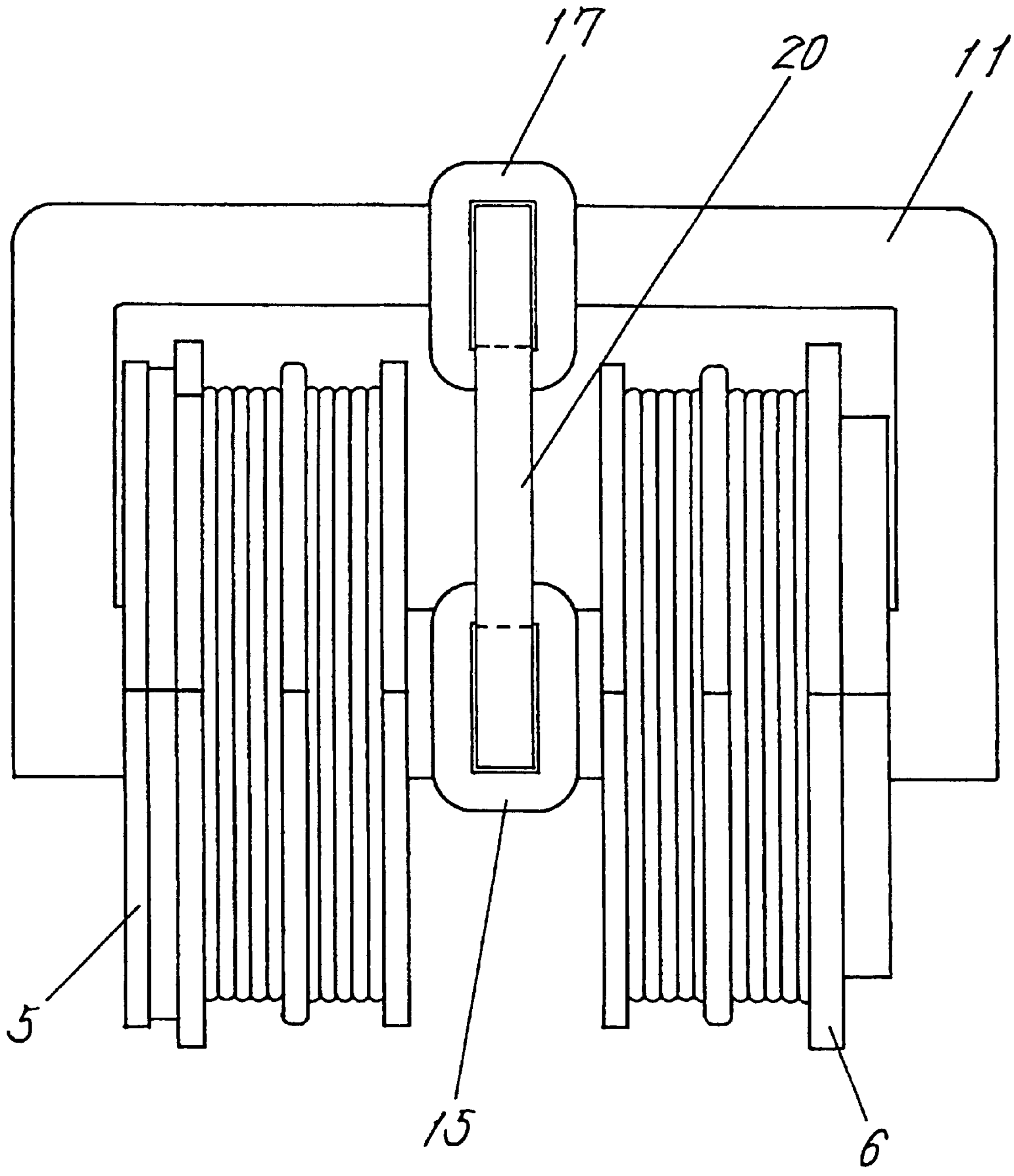
FIG. 34 is a plan view of another line filter depicting a positional relation between a closed-loop magnetic core wound with first and second coils and a magnetic body wound with first and second coils for second band.
Figure 35:
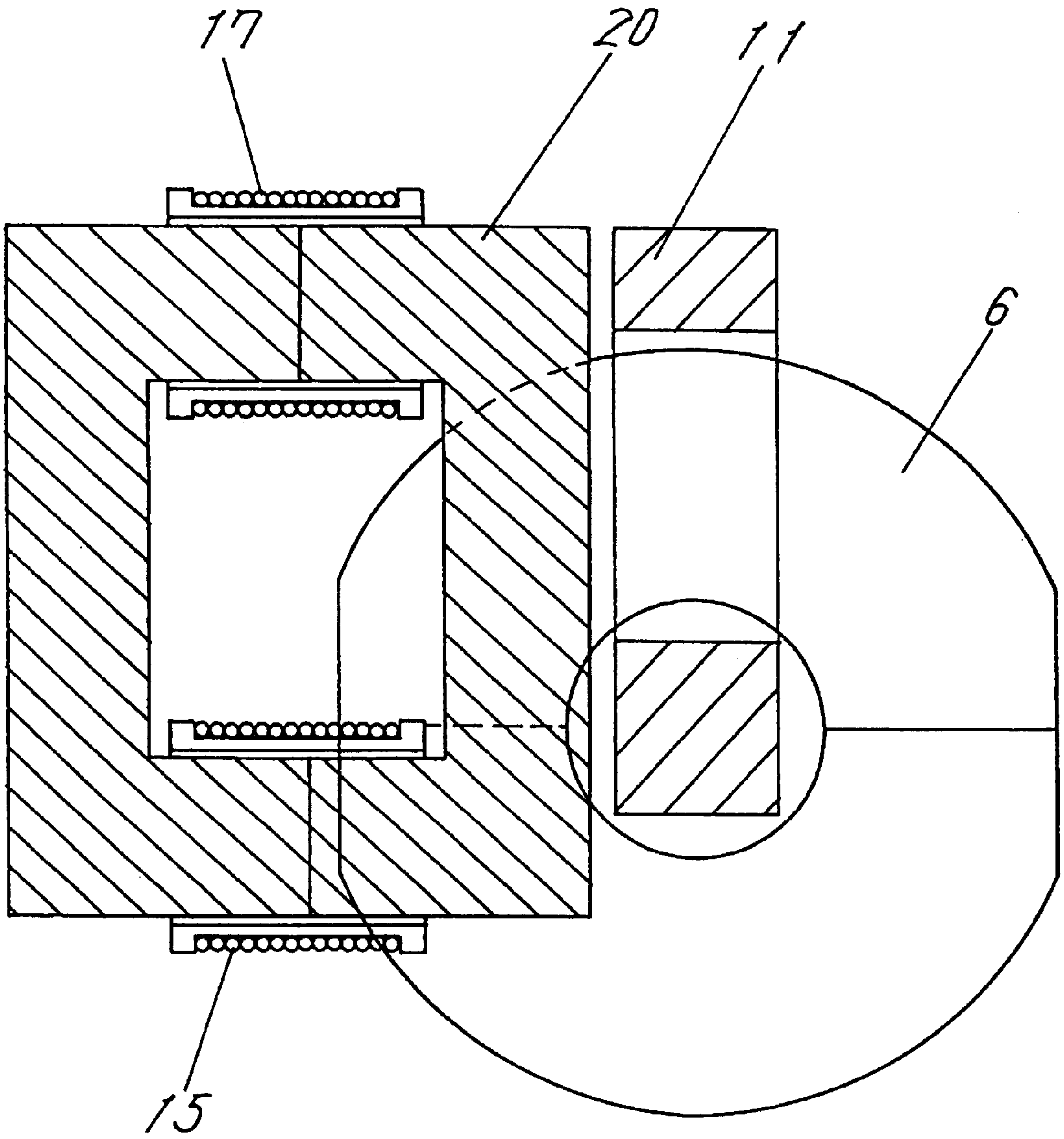
FIG. 35 is a sectioned right side view of the line filter depicting the positional relation between the closed-loop magnetic core wound with the first and the second coils and the magnetic body wound with the first and the second coils for second band.
Figure 36:
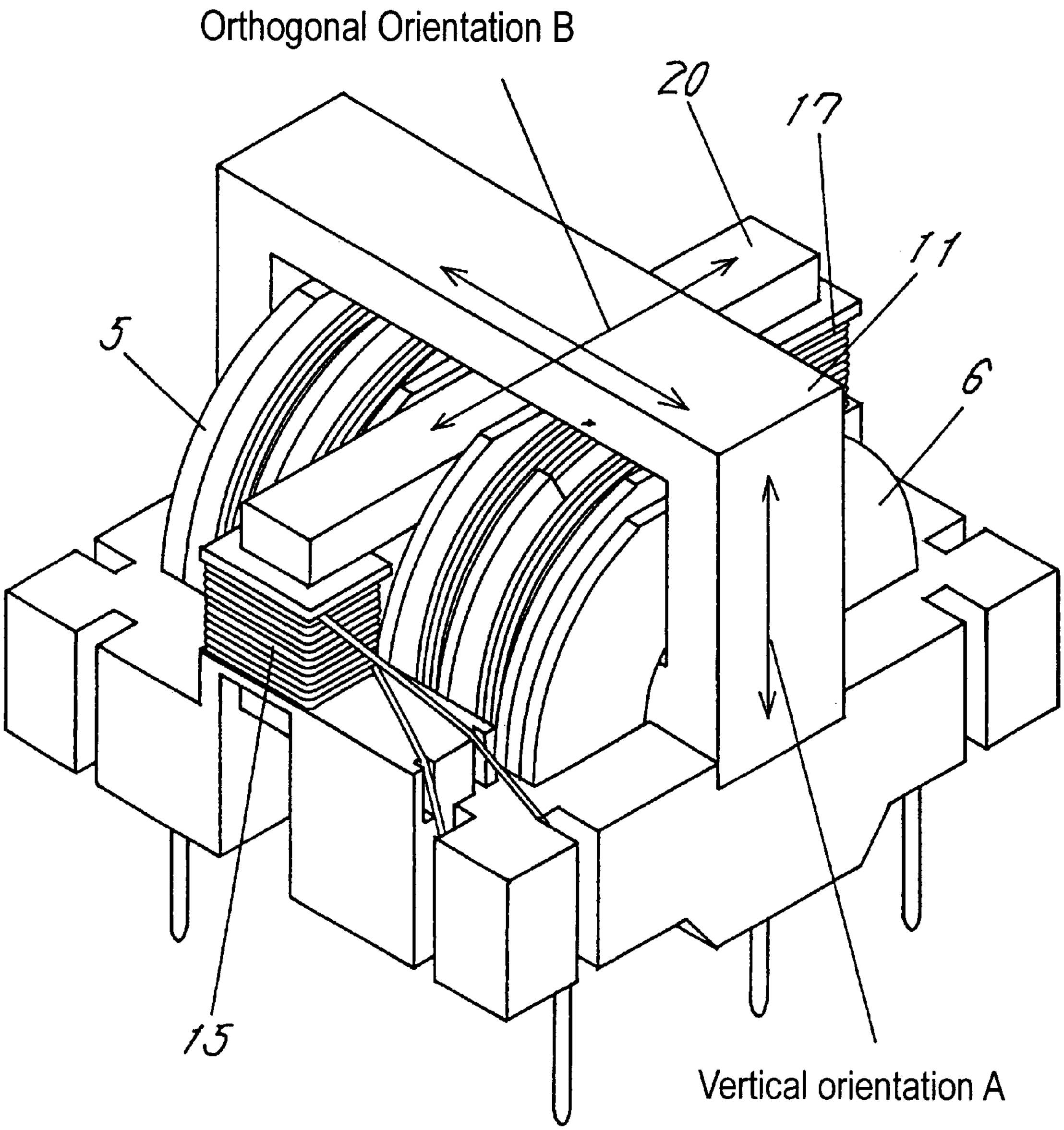
FIG. 36 is a perspective view of a line filter according to a sixth exemplary embodiment.
Figure 37:
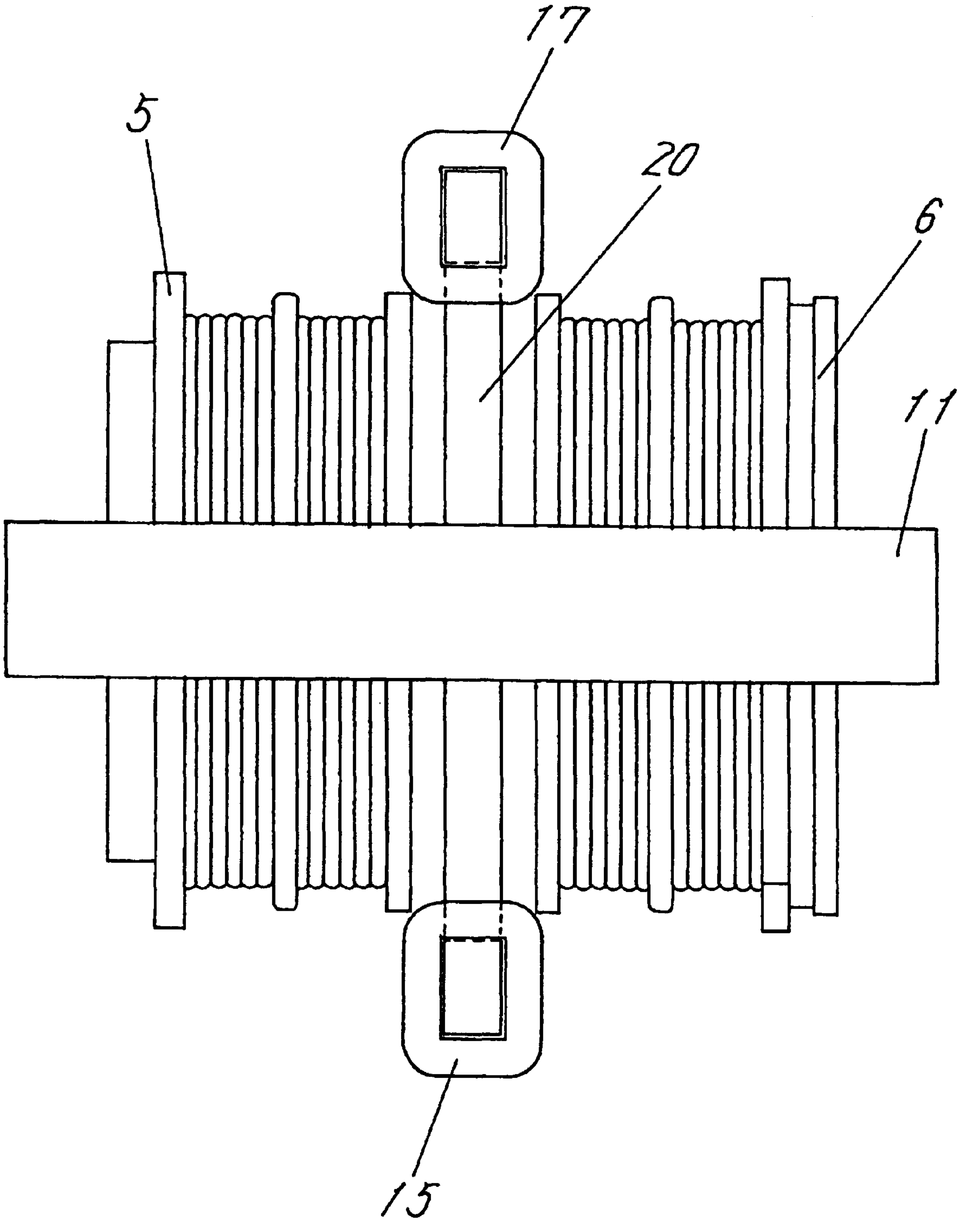
FIG. 37 is a plan view of the same line filter depicting a positional relation between a closed-loop magnetic core wound with first and second coils and a magnetic body wound with first and second coils for second band.
Figure 38:
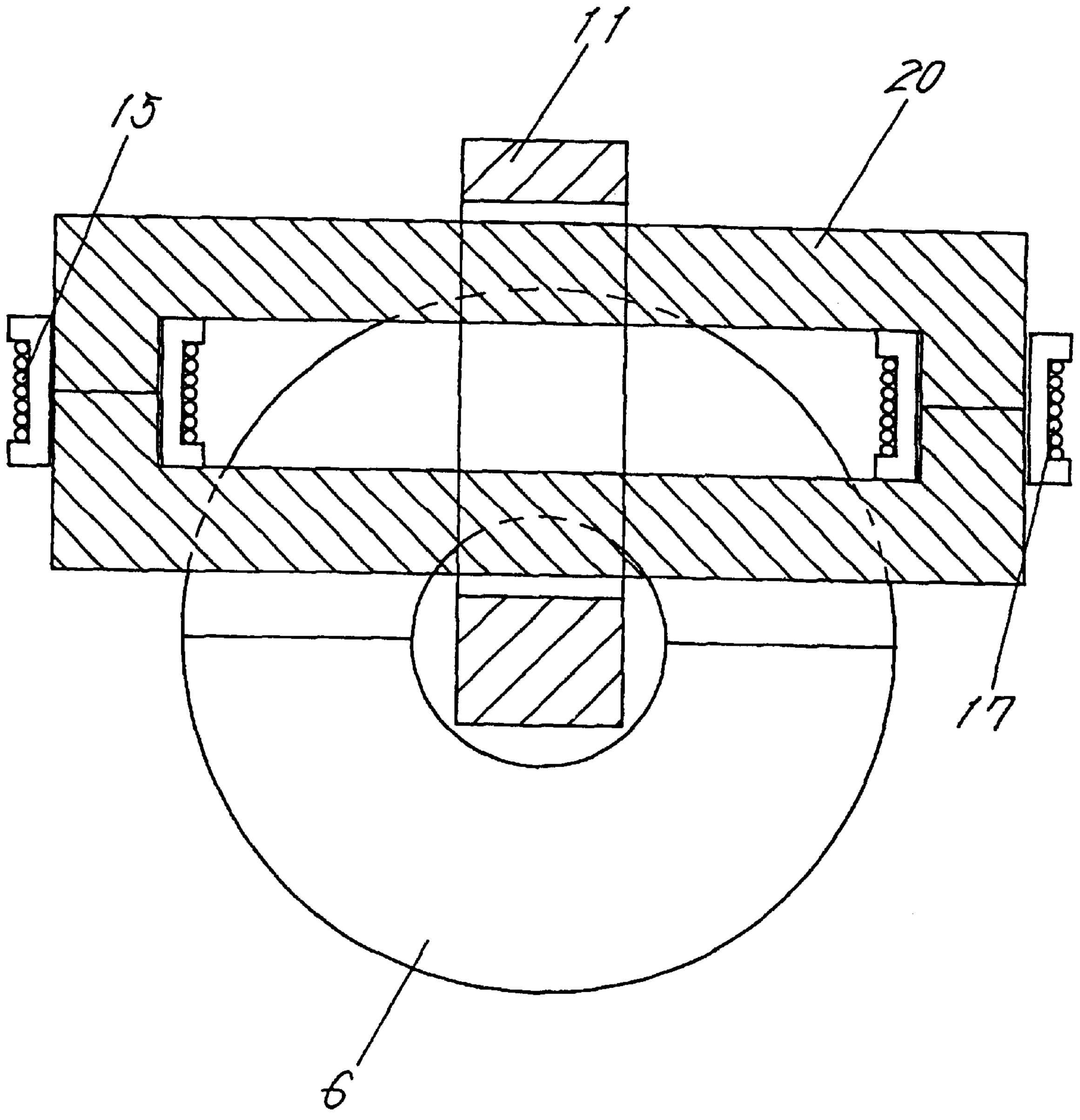
FIG. 38 is a sectioned right side view of the same line filter depicting the positional relation between the closed-loop magnetic core wound with the first and the second coils and the magnetic body wound with the first and the second coils for second band.
Figure 39:
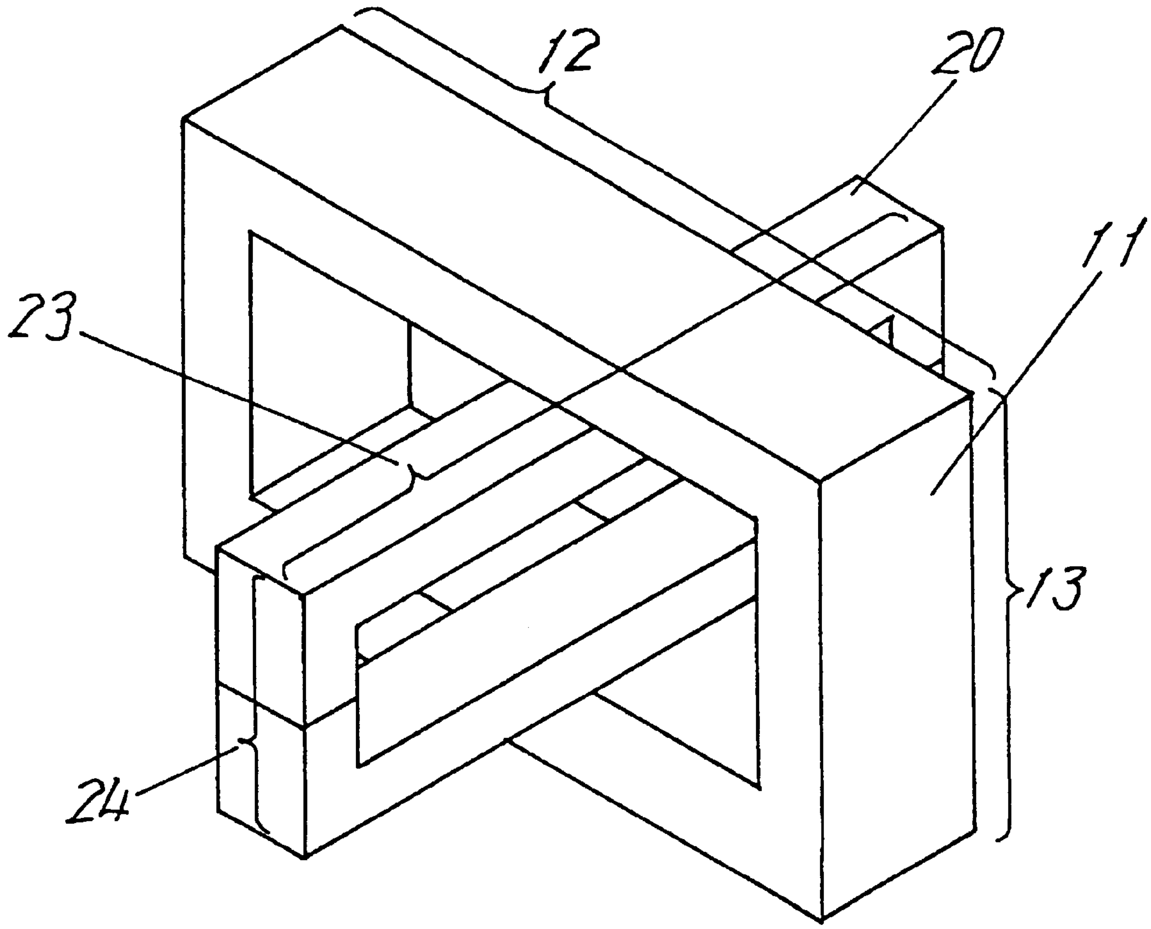
FIG. 39 is a perspective view of the same line filter depicting the positional relation between the closed-loop magnetic core and the magnetic body.
Figure 40:
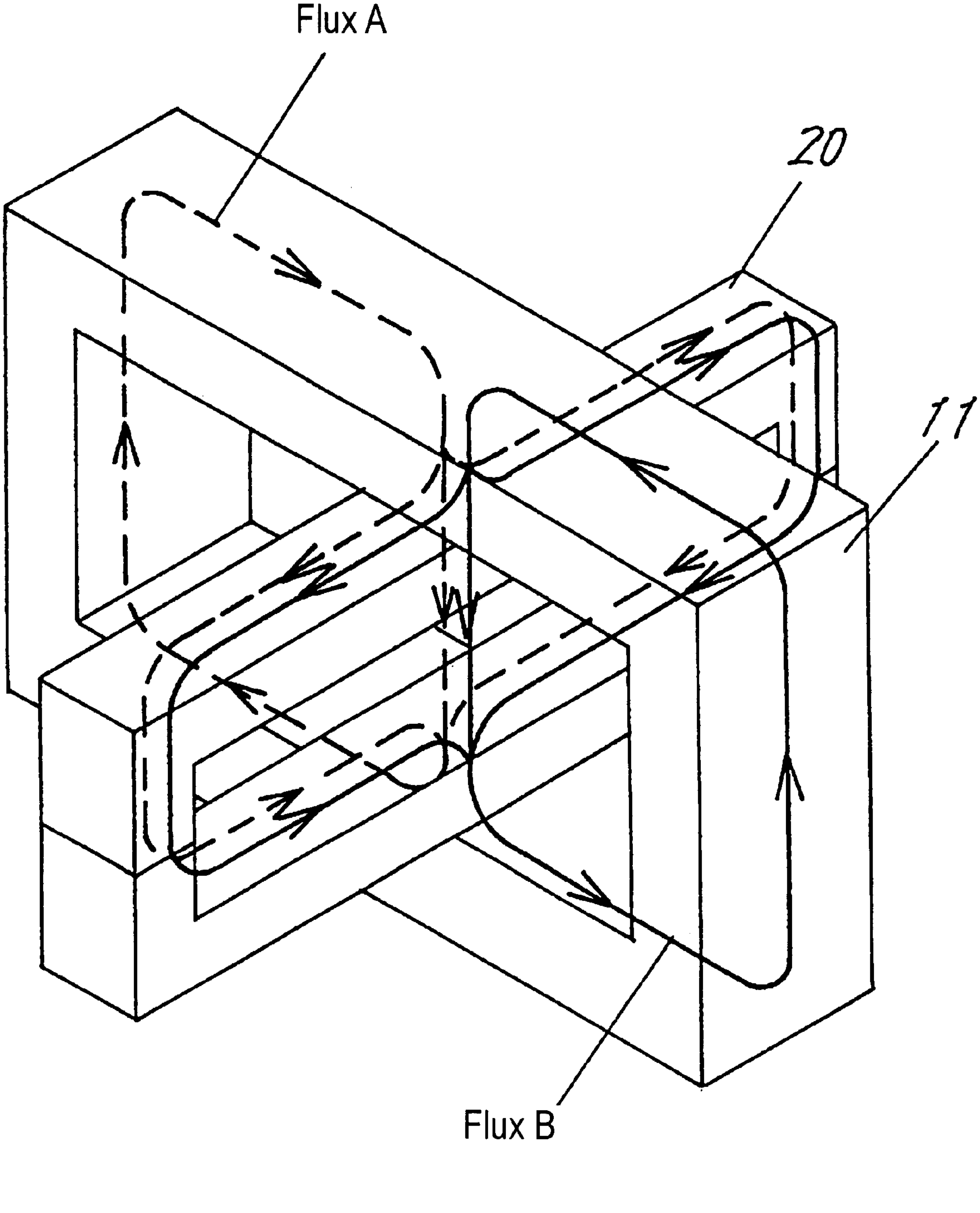
FIG. 40 is a schematic illustration of a magnetic circuit of the same line filter, depicting flows of magnetic flux caused by normal mode noise.
Figure 41:
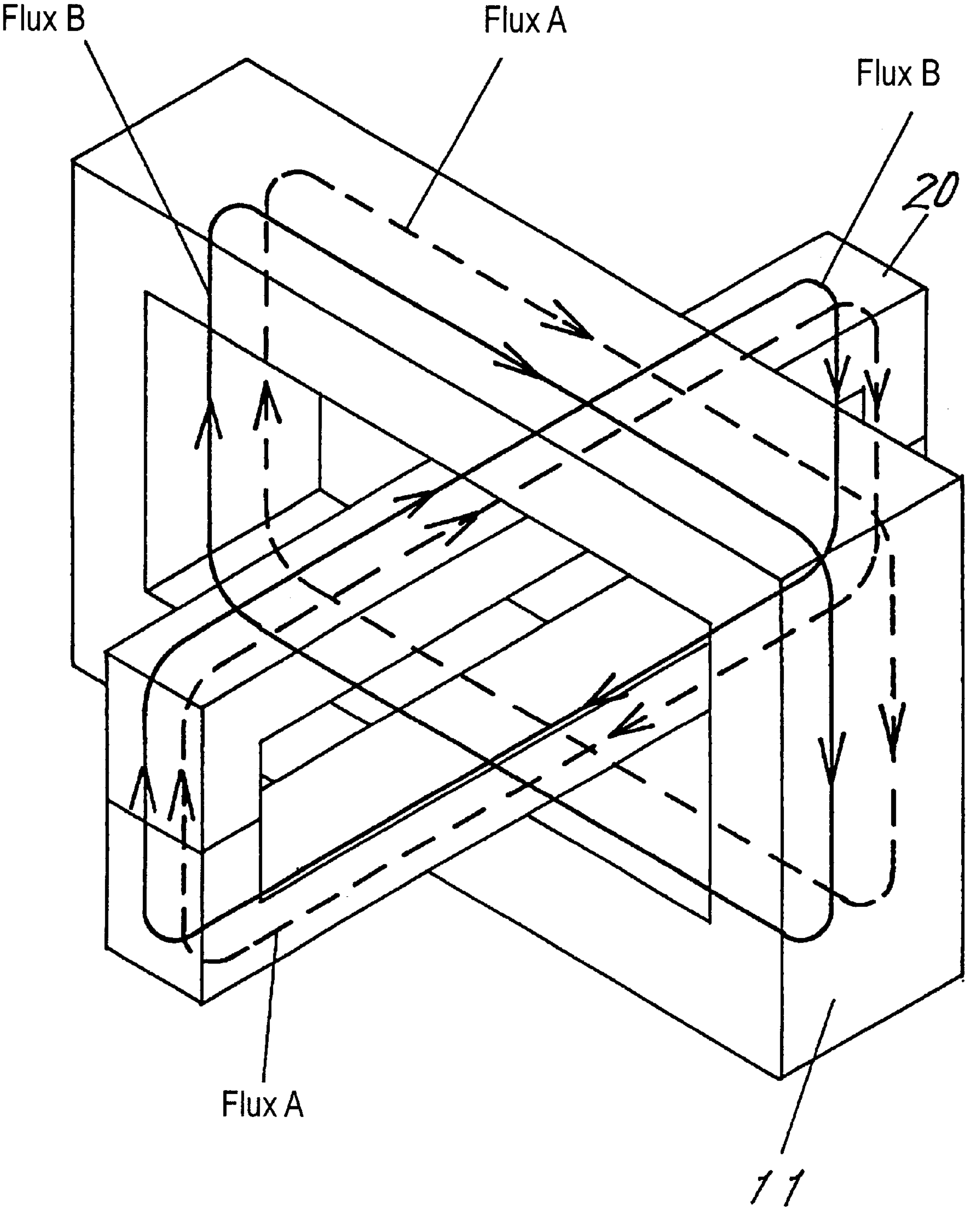
FIG. 41 is another schematic illustration of the magnetic circuit of the same line filter, depicting flows of magnetic flux caused by common mode noise in a first frequency band and a second frequency band.

In the fifth exemplary embodiment, the first and the second coils 15 and 17 for second band are wound on the first and the second bobbins 28 and 29 for second band, which are molded unitary near the front center portion of the terminal block 25, so that the first and the second coil units 14 and 16 for second band are disposed to one of other magnetic frame-bars 24 at a front side of the magnetic body 20. However, the first and the second coil units 14 and 16 for second band may be disposed to one of magnetic frame-bars 23 at an upper side and a lower side of the magnetic body 20, as shown in FIG. 34 and FIG. 35.

(Sixth Exemplary Embodiment)

A line filter according to sixth exemplary embodiment of this invention will be described hereinafter with referring to the accompanying figures.

The line filter in the sixth exemplary embodiment is an improvement of the line filter disclosed in the fifth exemplary embodiment.

The line filter of the sixth exemplary embodiment shown in FIG. 36 through FIG. 41 has two magnetic frame-bars 23 of magnetic body 20 inserted in opening 26 of closed-loop magnetic core 11, in the line filter of the fifth exemplary embodiment.

In this embodiment, frequency attenuation characteristics for common mode noises in the first frequency band, common mode noises in the second frequency band, and normal mode noises become equivalent to those of the first exemplary embodiment.

With the foregoing structure, magnetic fluxes generated by first coil unit 14 for second band and second coil unit 16 for second band are concentrated in the magnetic body 20 in the like advantageous manner as the fifth exemplary embodiment, so as to lead the generated magnetic fluxes easily into the same direction. Hence, the attenuation characteristics of the second frequency band for eliminating the common mode noises can be improved furthermore.

In this sixth exemplary embodiment, although the two magnetic frame-bars 23 of the magnetic body 20 are inserted in the opening 26 of the closed-loop magnetic core 11, the other two magnetic frame-bars 24 of the magnetic body 20 may instead be inserted. Alternatively, two magnetic frame-bars 12 or the other two magnetic frame-bars 13 of the closed-loop magnetic core 11 may be inserted in opening 27 of the magnetic body 20. A similar effect can be achieved when two magnetic frame-bars 12 and 13 or the two other magnetic frame-bars 23 and 24 are inserted respectively in any of the opening 26 of the closed-loop magnetic core 11 and the opening 27 of the magnetic body 20.

In addition, first and second coils 15 and 17 for second band are wound on first and second bobbins 28 and 29 for second band, which are unitary molded near a front center portion of terminal block 25. The first and the second coil units 14 and 16 for second band are disposed to the other magnetic frame-bars 24 at the front side of the magnetic body 20. However, the first and the second coil units 14 and 16 for second band may be disposed to the magnetic frame-bars 23 at upper and lower sides of the magnetic body 20.

According to the present exemplary embodiment of the invention, the magnetic frame-bars of the closed-loop magnetic core 11 comprise at least two confronting magnetic frame-bars 12 coupled by at least two confronting magnetic frame-bars 13. One of the magnetic frame-bars 12 is inserted in through hole 1 of first bobbin 5 and through hole 1 of second bobbin 6. Also, the first bobbin 5 and the second bobbin 6 are arranged coaxially. However, one of the magnetic frame-bars 12 may be inserted in the through hole 1 of the first bobbin 5, and the other of the magnetic frame-bars 12 in the through hole 1 of the second bobbin 6, so that the first bobbin 5 and the second bobbin 6 can be arranged eccentrically in a staggered form in a manner that a periphery of winding slot 3 of the first bobbin 5 and a periphery of winding slot 4 of the second bobbin 6 do not confront each other.

Furthermore, NiZn-base core material may be substituted for MnZn-base core material for use as the magnetic body 20, so as to adopt the same material for both the magnetic body 20 and the closed-loop magnetic core 11.

(Seventh Exemplary Embodiment)

A line filter according to seventh exemplary embodiment of this invention will be described hereinafter with referring to the accompanying figures.

The line filter in the seventh exemplary embodiment is an improvement of the line filter disclosed in the sixth exemplary embodiment.

Figure 42:
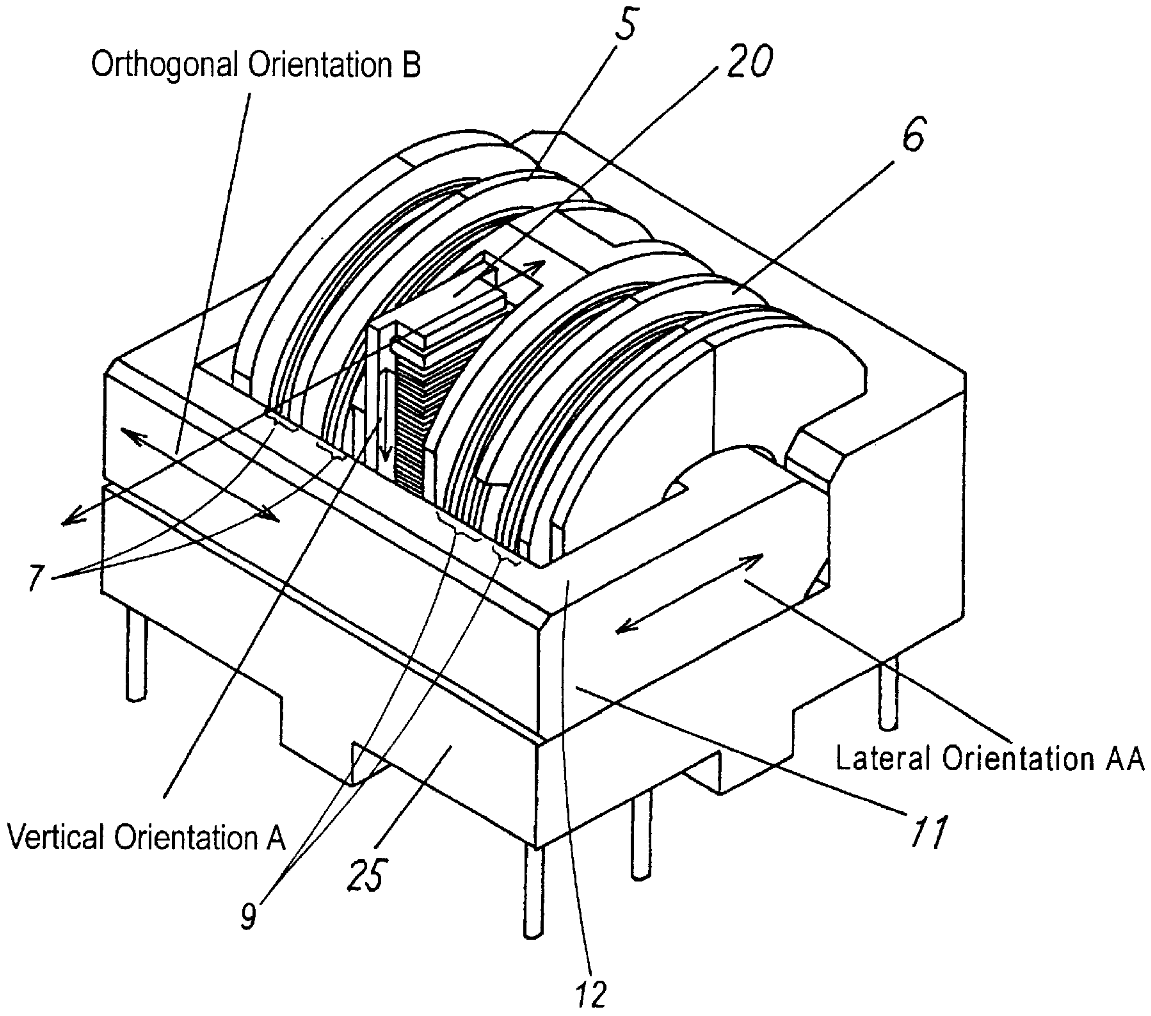
FIG. 42 is a perspective view of a line filter according to a seventh exemplary embodiment.
Figure 43:
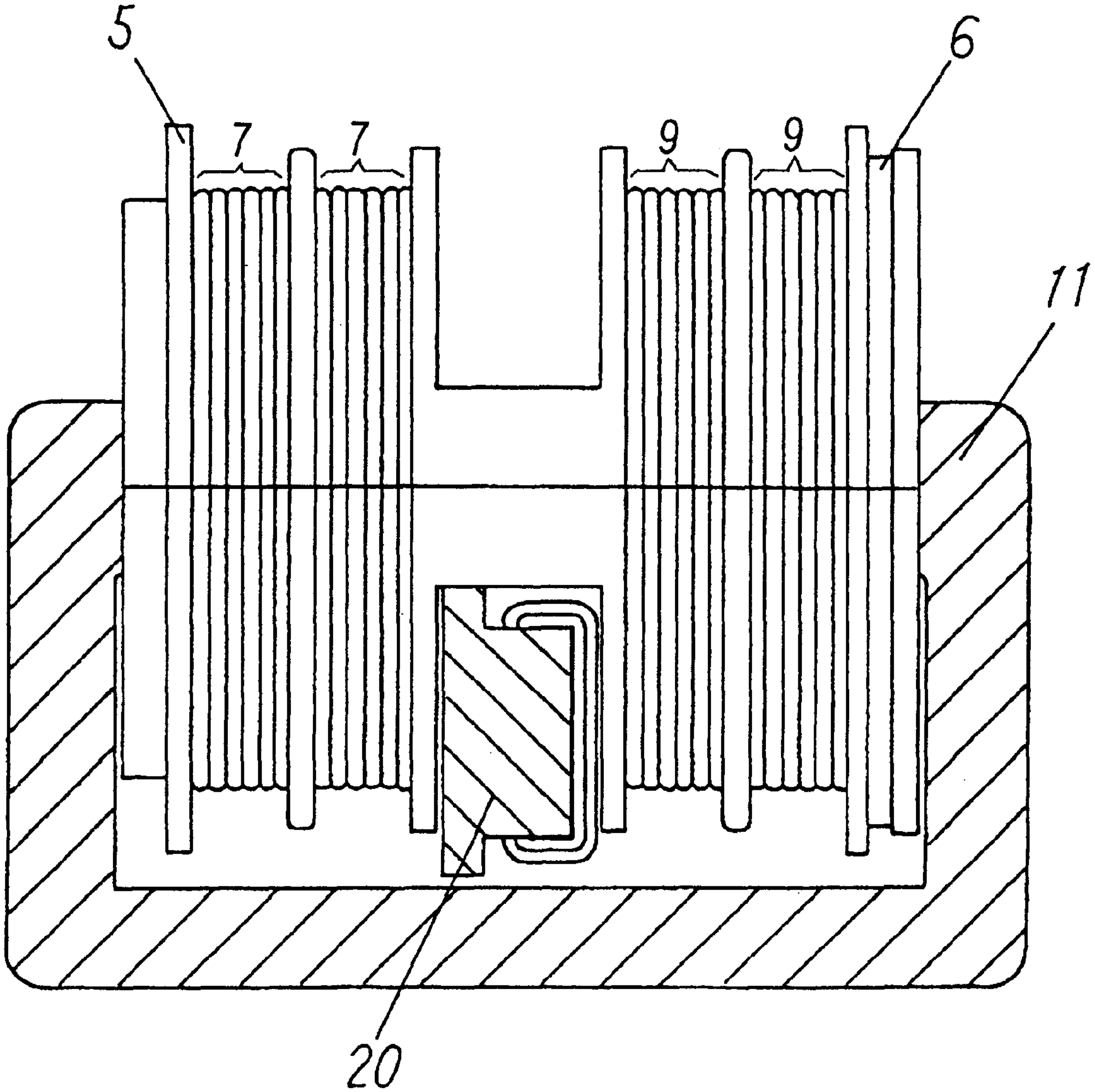
FIG. 43 is a plan view of the same line filter depicting a positional relation between a closed-loop magnetic core wound with first and second coils and a magnetic body wound with first and second coils for second band.
Figure 44:
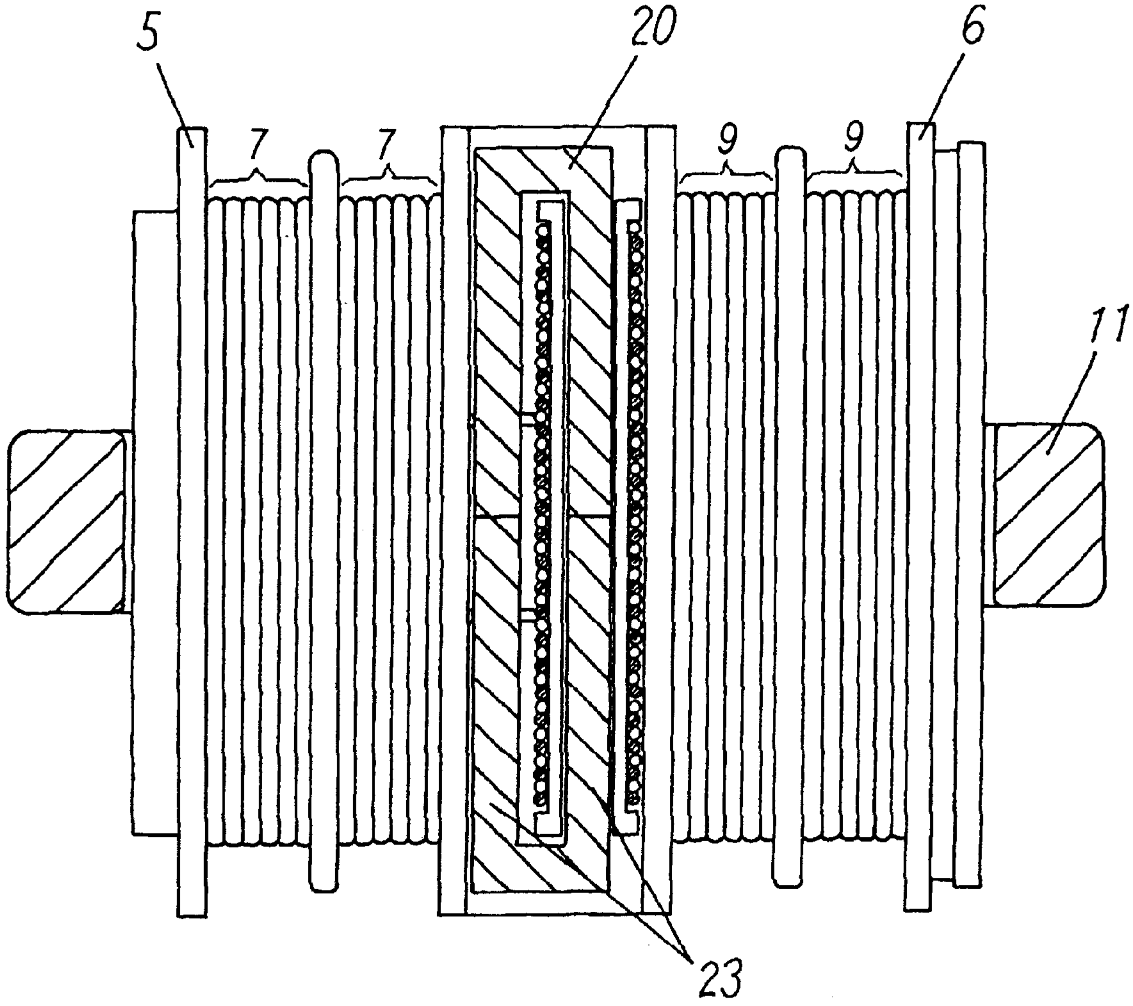
FIG. 44 is a sectioned front view of the same line filter depicting the positional relation between the closed-loop magnetic core wound with the first and the second coils and the magnetic body wound with the first and the second coils for second band.
Figure 45:
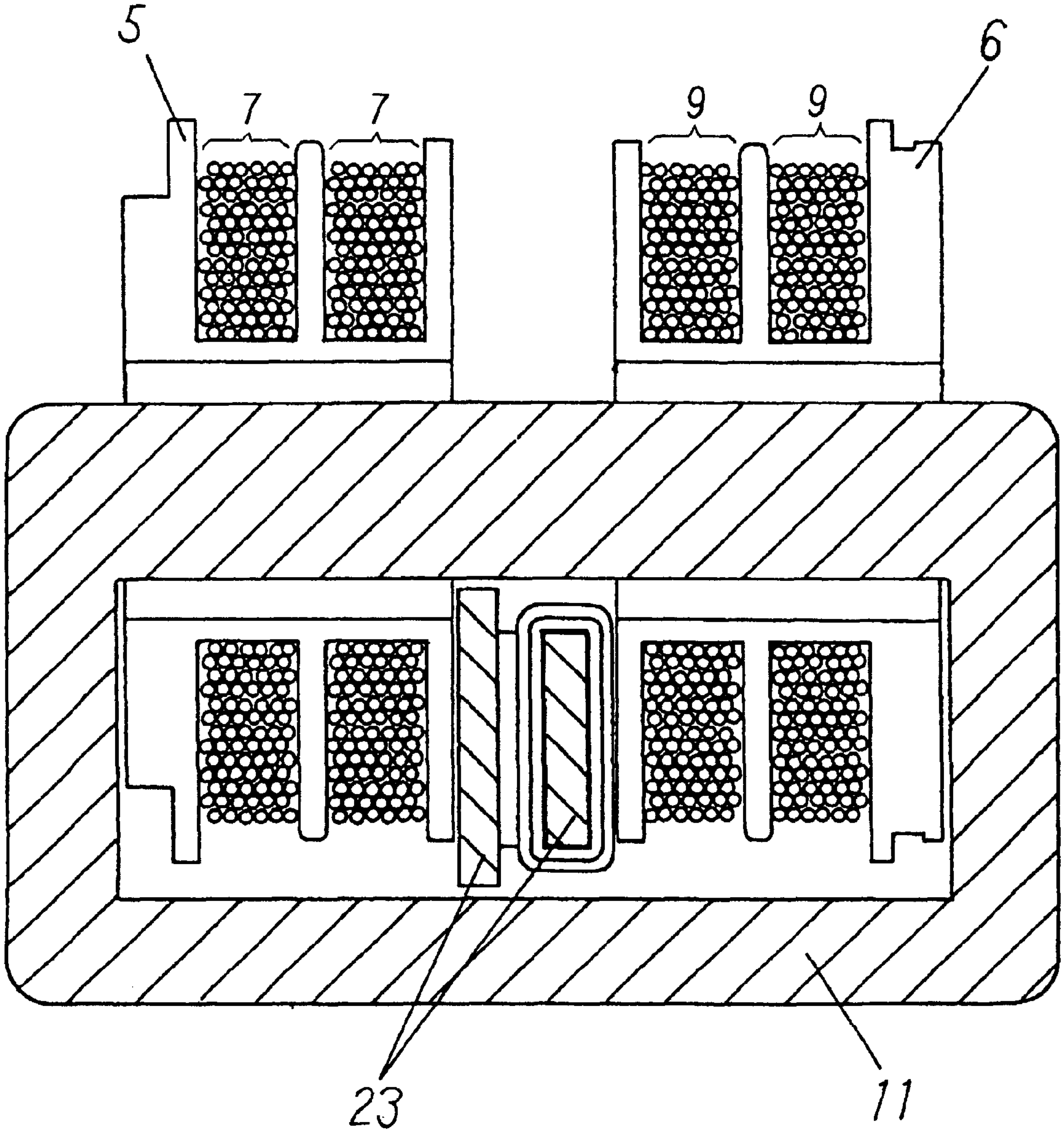
FIG. 45 is a sectioned plan view of the same line filter depicting the positional relation between the closed-loop magnetic core wound with the first and the second coils and the magnetic body wound with the first and the second coils for second band.
Figure 46:
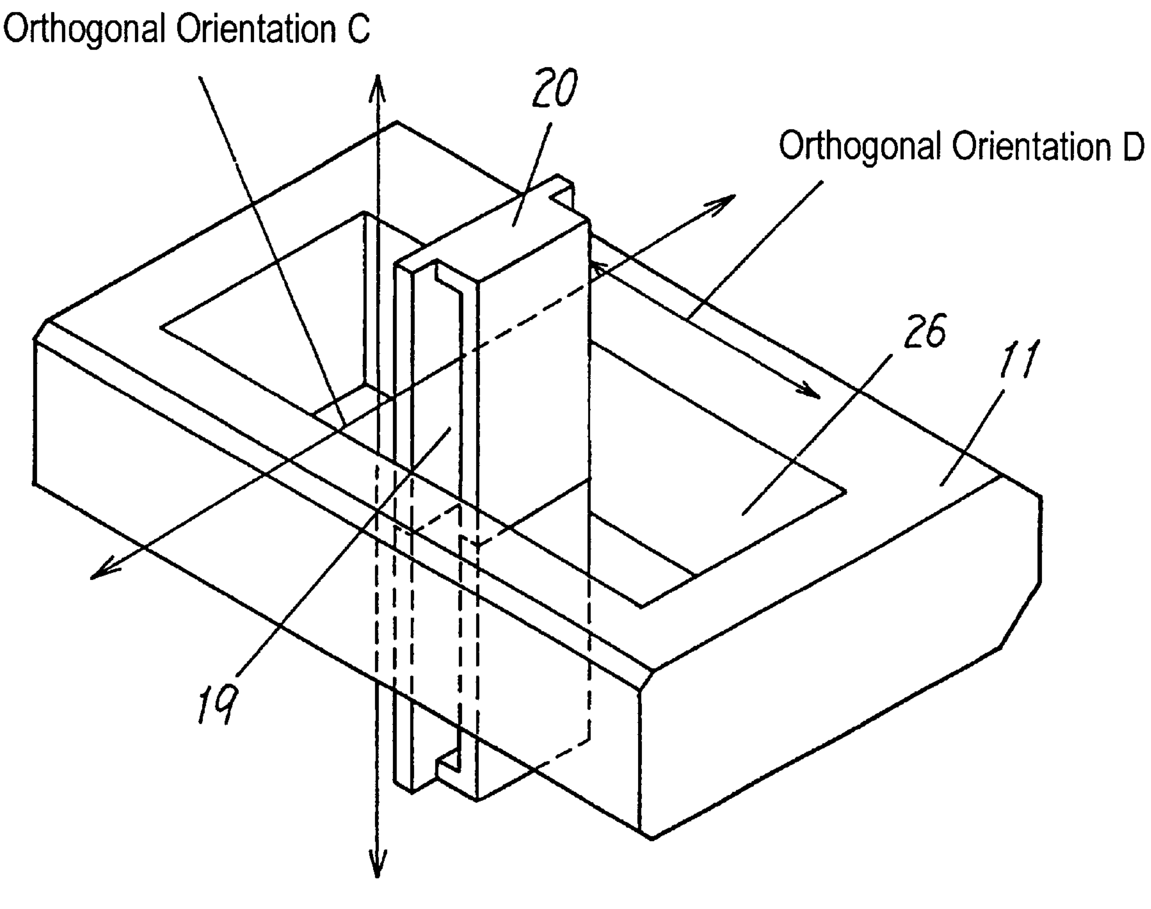
FIG. 46 is a perspective view of the same line filter depicting the positional relation between the closed-loop magnetic core and the magnetic body.
Figure 47:
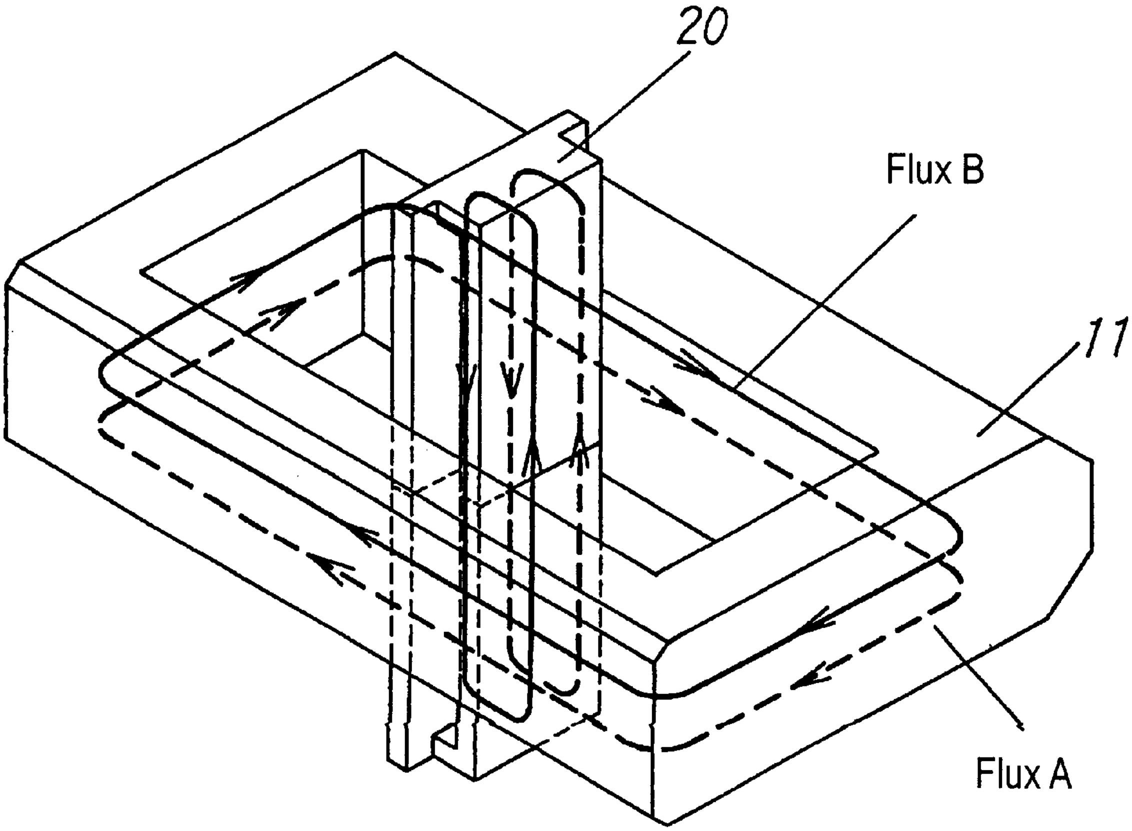
FIG. 47 is a schematic illustration of a magnetic circuit of the same line filter, depicting flows of magnetic flux caused by common mode noise in a first frequency band and a second frequency band.
Figure 48:
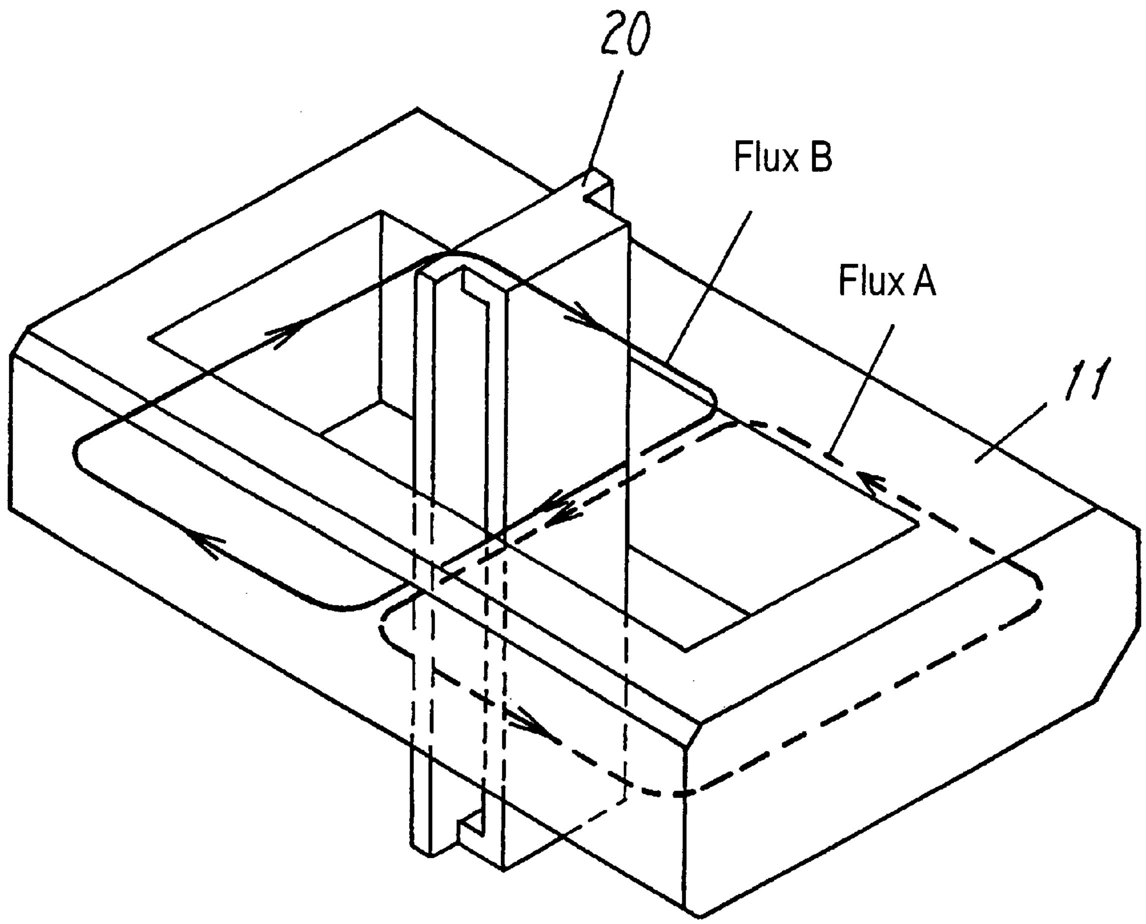
FIG. 48 is another schematic illustration of the magnetic circuit of the same line filter, depicting flows of magnetic flux caused by normal mode noise in the first frequency band and the second frequency band.
Figure 49:
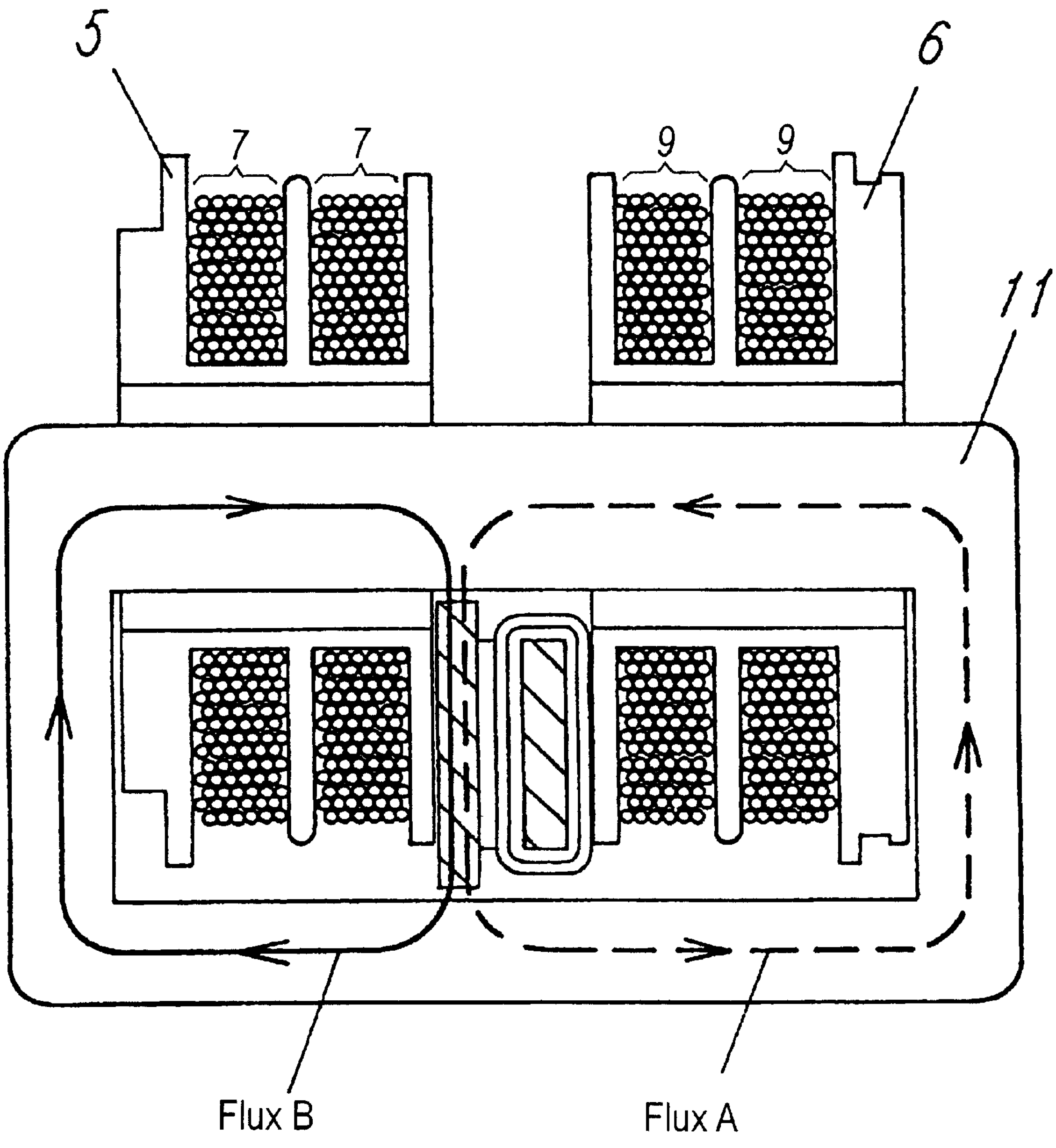
FIG. 49 is still another schematic illustration of the magnetic circuit of the same line filter, depicting flows of magnetic flux caused by the normal mode noise in the first frequency band and the second frequency band.

In FIG. 42 through FIG. 49, the line filter of the seventh exemplary embodiment has closed-loop magnetic core 11 positioned in a lateral orientation (AA) and magnetic body 20 in a vertical orientation (A) with respect to terminal block 25. In addition, as shown, for example, in FIGS. 42 and 46, the closed-loop magnetic core 11 and the magnetic body 20 are arranged in an orthogonal orientation (B) with respect to each other, so that opening 26 of the closed-loop magnetic core 11 and opening 19 of the magnetic body 20 are in an orthogonal orientation (C) with respect to each other. Furthermore, as also shown in FIGS. 42 and 46, the magnetic body 20 is so arranged that the opening 19 situate in an orthogonal orientation (D) to magnetic frame-bar 12 of the closed-loop magnetic core 11 inserted in through holes 1 of the first bobbin 5 and second bobbin 6. As sown in FIG. 44, two magnetic frame-bbars 23 of the magnetic body 2 are inserted in the opening 26 of the closed-loop magnetic core 11.

In this embodiment, frequency attenuation characteristics for common mode noises in the first frequency band, common mode noises in the second frequency band, and normal mode noises become equivalent to those of the first exemplary embodiment.

The foregoing structure provides for like advantage as that of the sixth exemplary embodiment.

Figure 50:
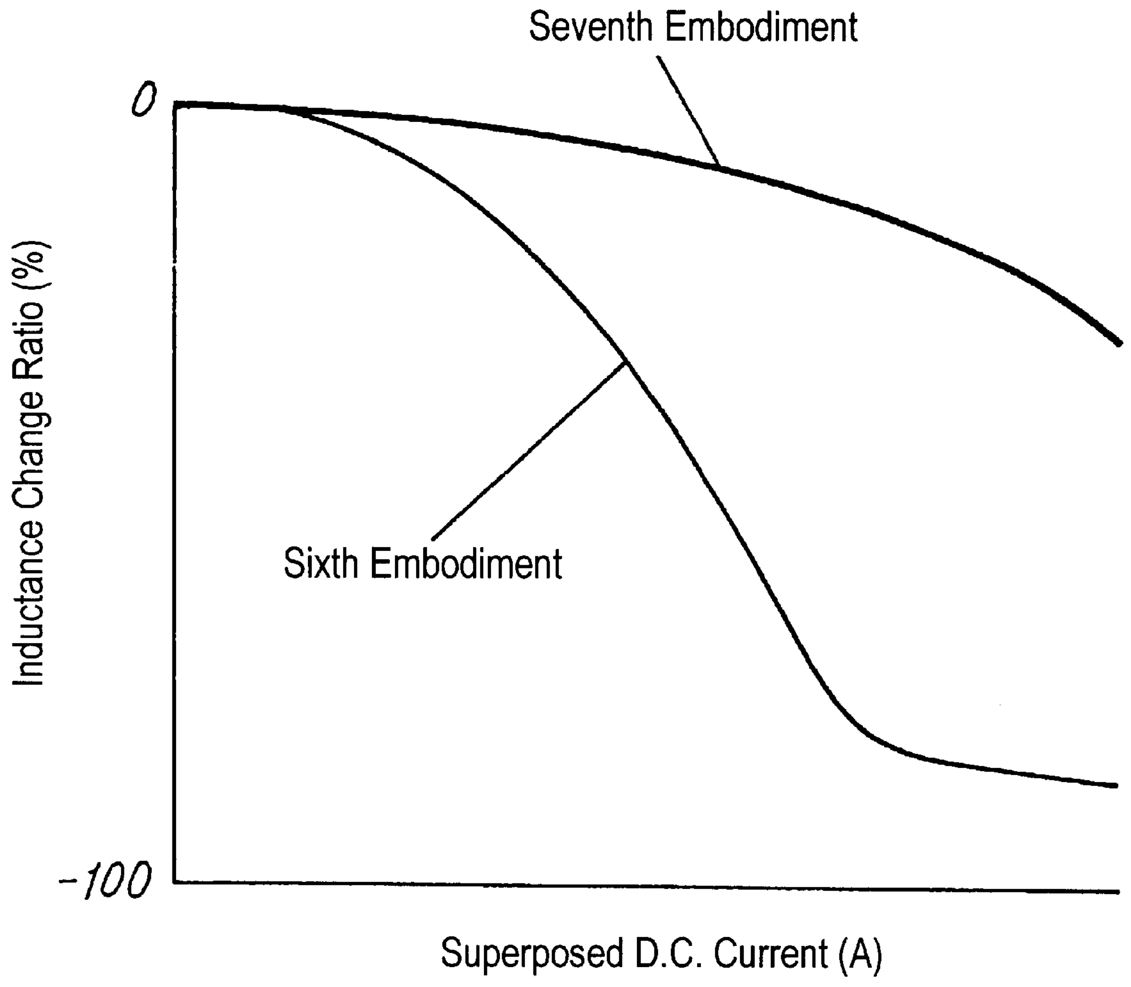
FIG. 50 is a graphical representation of a characteristic showing ratio of inductance change to superimposed D.C. current.

A direction of magnetic flux A generated by first coil unit 7 and magnetic flux B generated by second coil unit 9, and a direction of magnetic flux A generated by first coil unit 14 for second band and magnetic flux B generated by second coil unit 16 for second band cross orthogonally with respect to each other. In particular, the magnetic flux A originating in the normal mode noises generated by the first coil unit 7, and the magnetic flux B originating in the normal mode noises generated by the second coil unit 9 hardly flow in a manner to circle around the magnetic body 20. Therefore, it can suppress a reduction in inductance for the common mode noise. Relation between superimposed D.C. current and ratio of inductance change in this respect is shown in FIG. 50, which indicates a better improvement than the line filter of the sixth exemplary embodiment.

Figure 51:
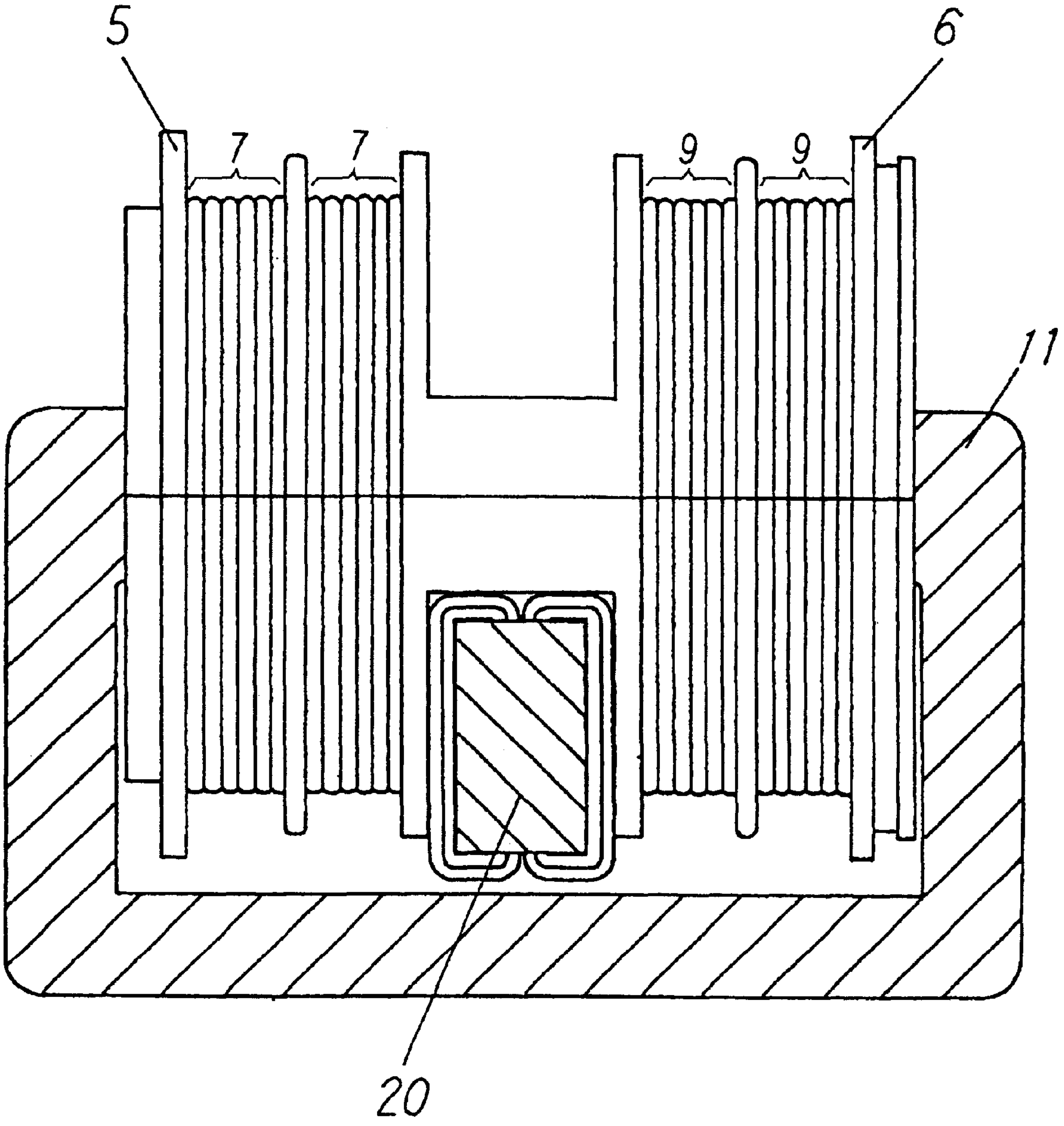
FIG. 51 is a plan view of another line filter depicting a positional relation between a closed-loop magnetic core wound with first and second coils and a magnetic body wound with first and second coils for second band.
Figure 52:
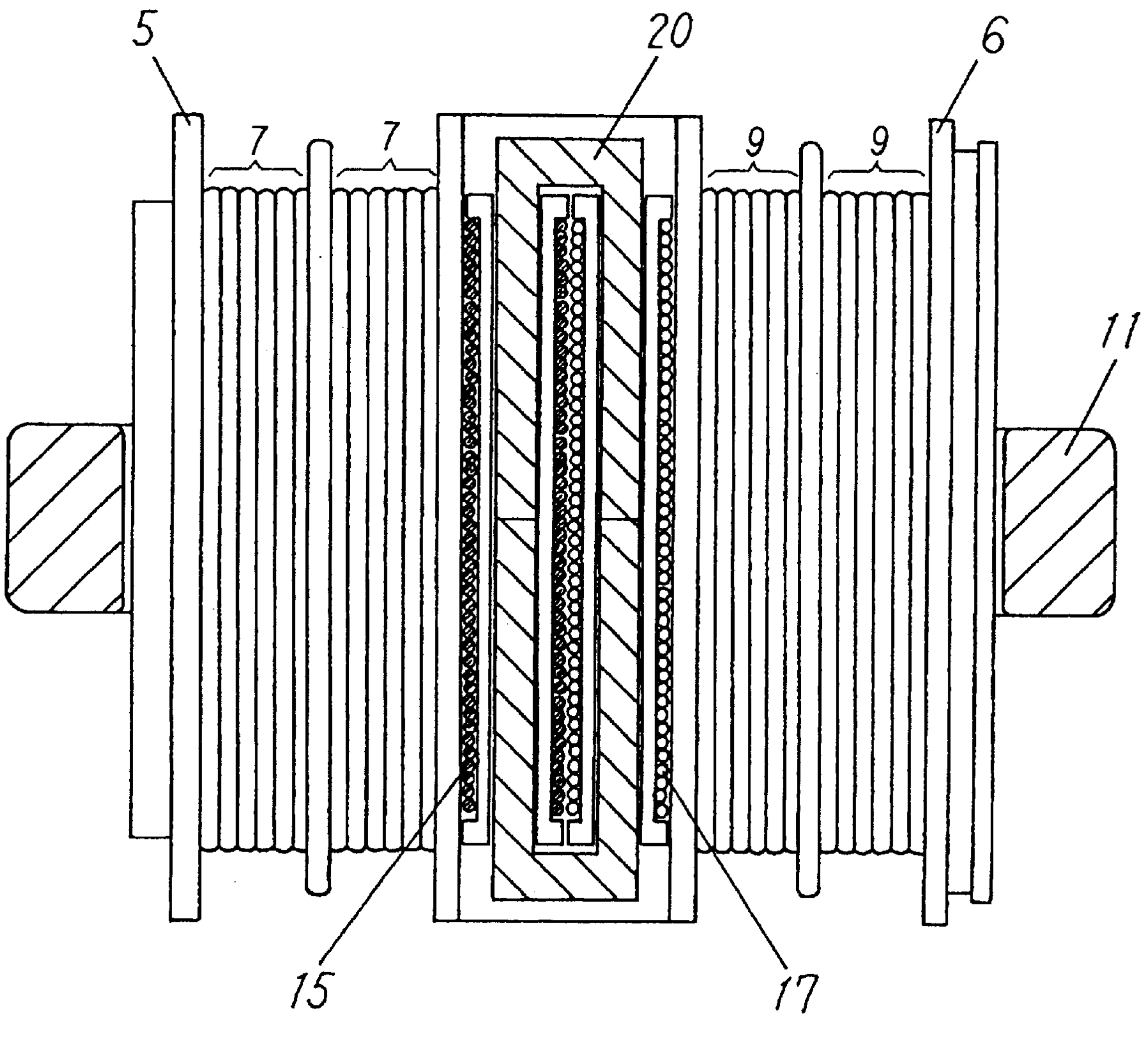
FIG. 52 is a sectioned front view of the line filter depicting the positional relation between the closed-loop magnetic core wound with the first and the second coils and the magnetic body wound with the first and the second coils for second band.

In addition, first coil 15 for second band and second coil 17 for second band are wound on one of the other magnetic frame-bars 23 of the magnetic body 20 in this seventh exemplary embodiment. Similar advantageous effect as described above is achievable even if they are wound individually on both of the other magnetic frame-bars 23, as shown in FIG. 51 and FIG. 52.

Figure 53:
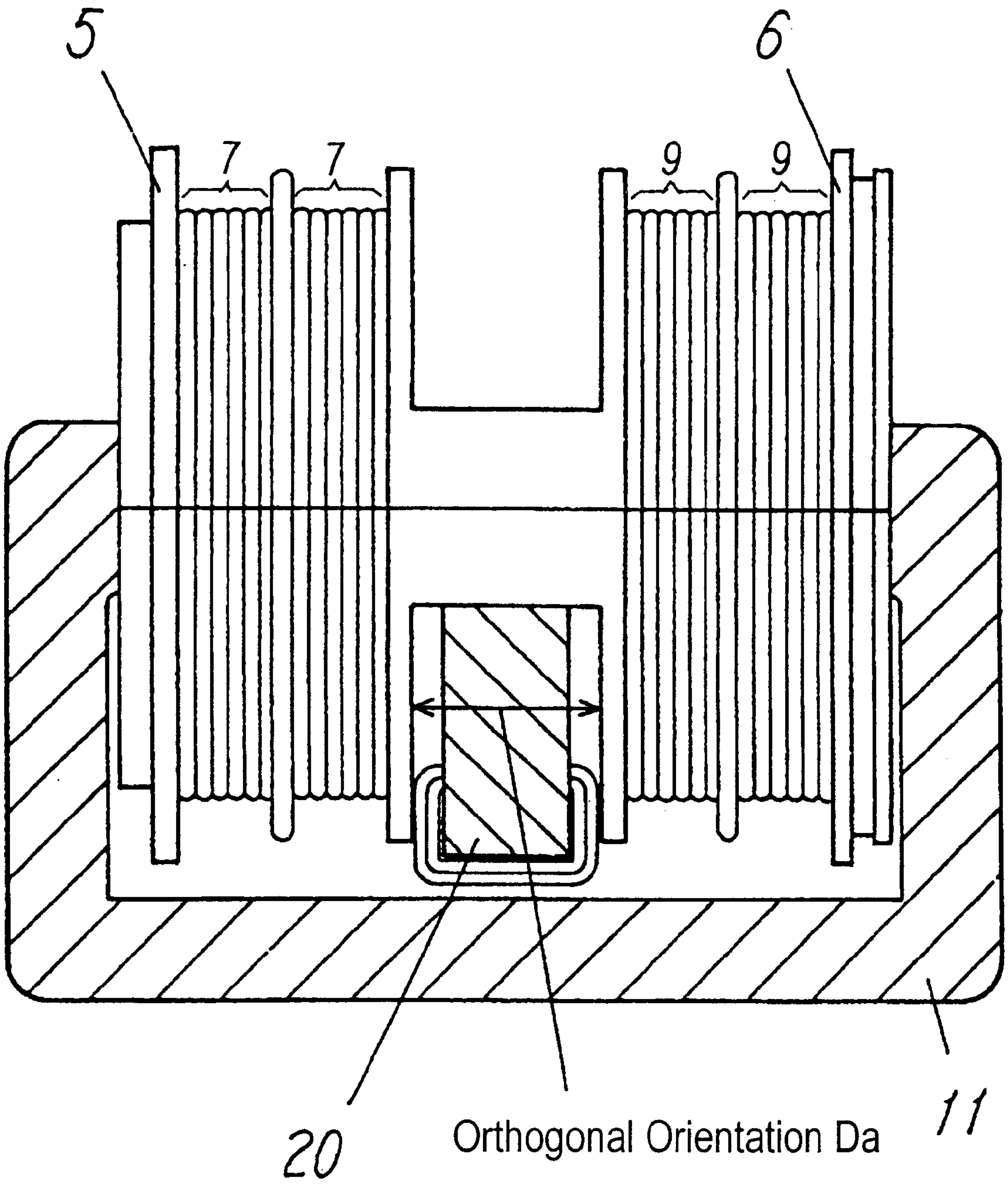
FIG. 53 is a plan view of still another line filter depicting a positional relation between a closed-loop magnetic core wound with first and second coils and a magnetic body wound with first and second coils for second band.
Figure 54:
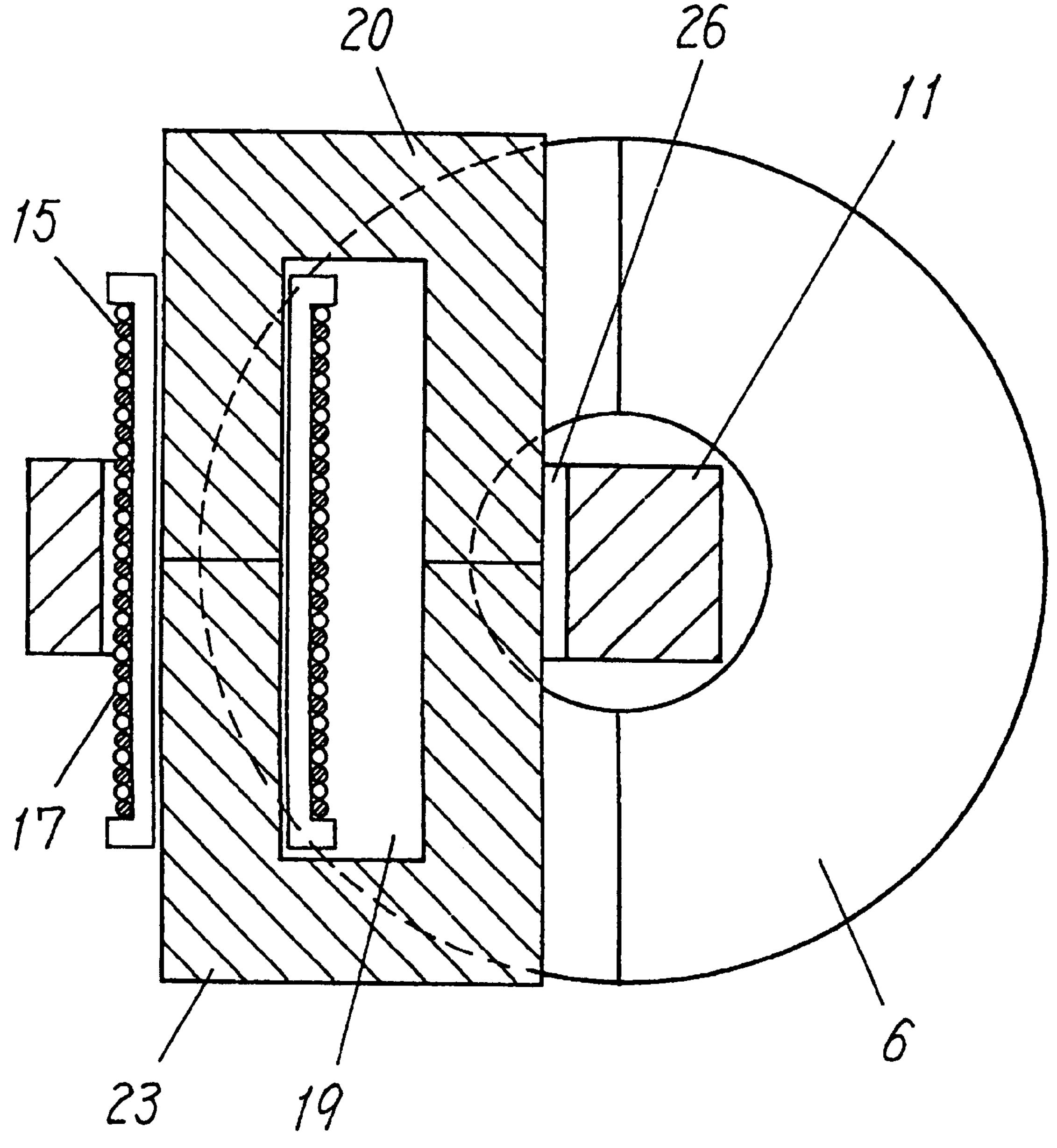
FIG. 54 is a sectioned right side view of the line filter depicting the positional relation between the closed-loop magnetic core wound with the first and the second coils and the magnetic body wound with the first and the second coils for second band.
Figure 55:
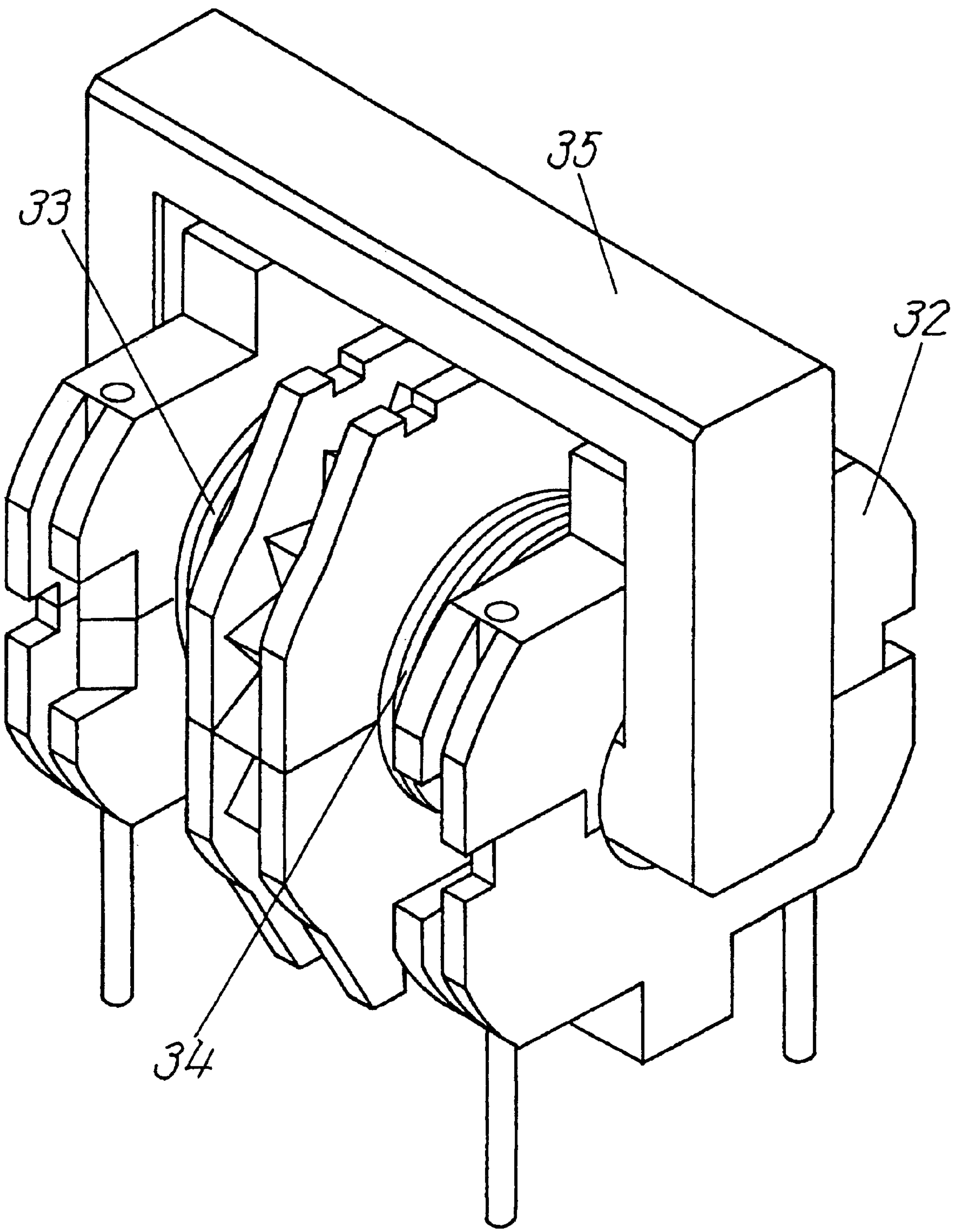
FIG. 55 (PRIOR ART)
FIG. 55 is a perspective view of a conventional line filter.
Figure 56:
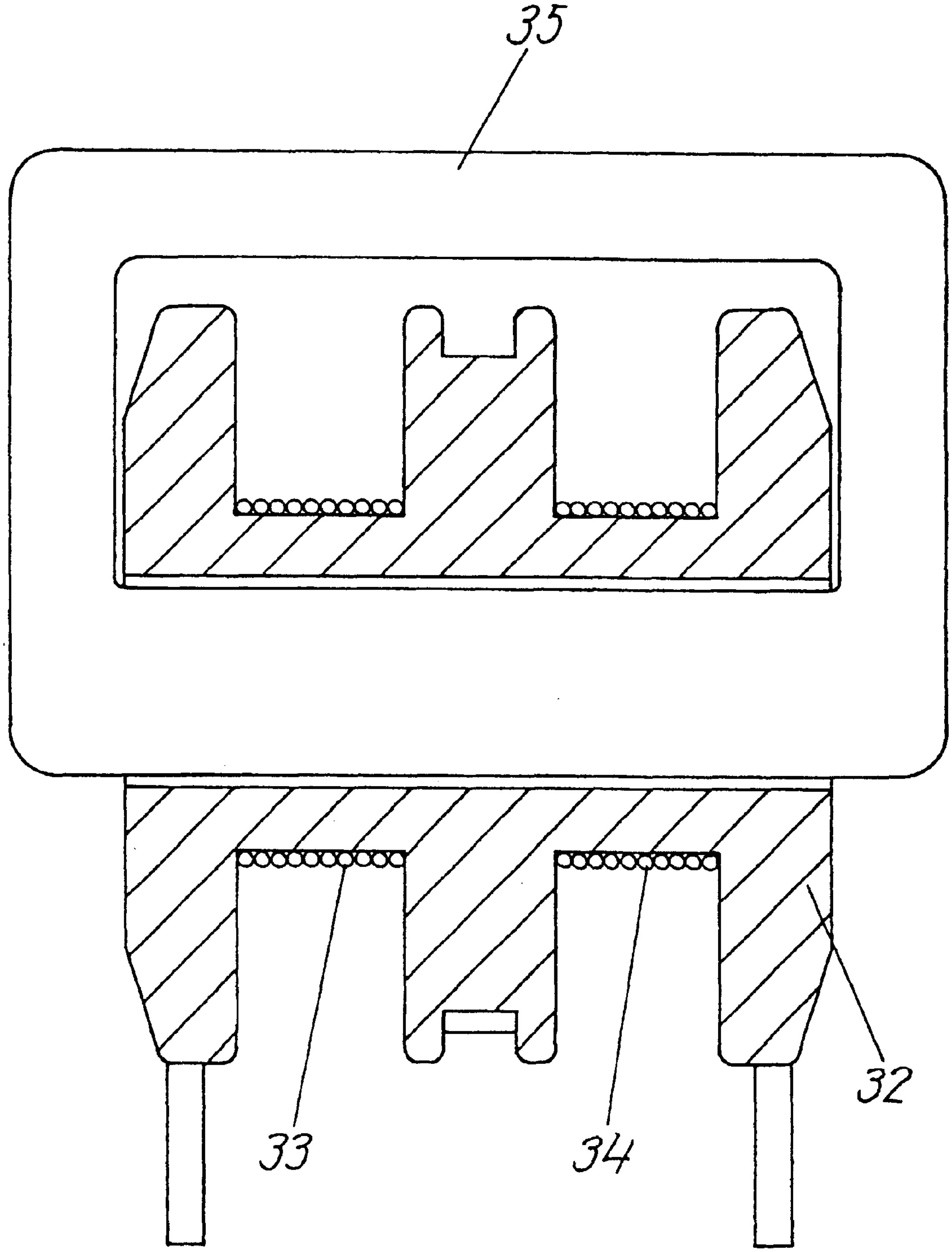
FIG. 56 (PRIOR ART)
FIG. 56 is a sectioned front view of the same line filter.
Figure 57:
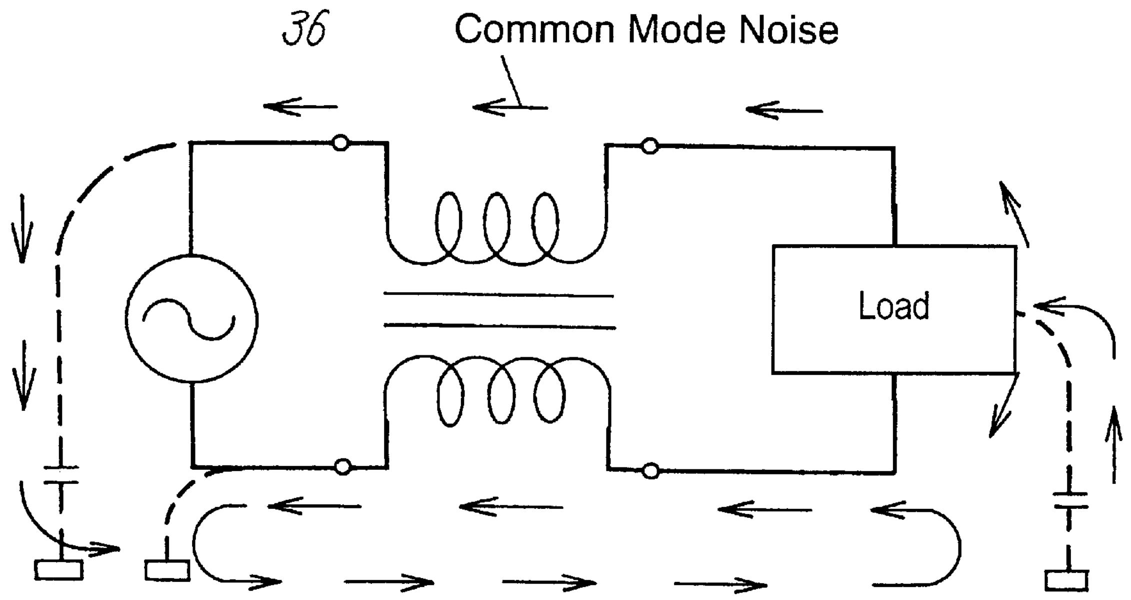
FIG. 57 (PRIOR ART)
FIG. 57 is an electric circuit diagram depicting propagation of the common mode noise in the same line filter.
Figure 58:
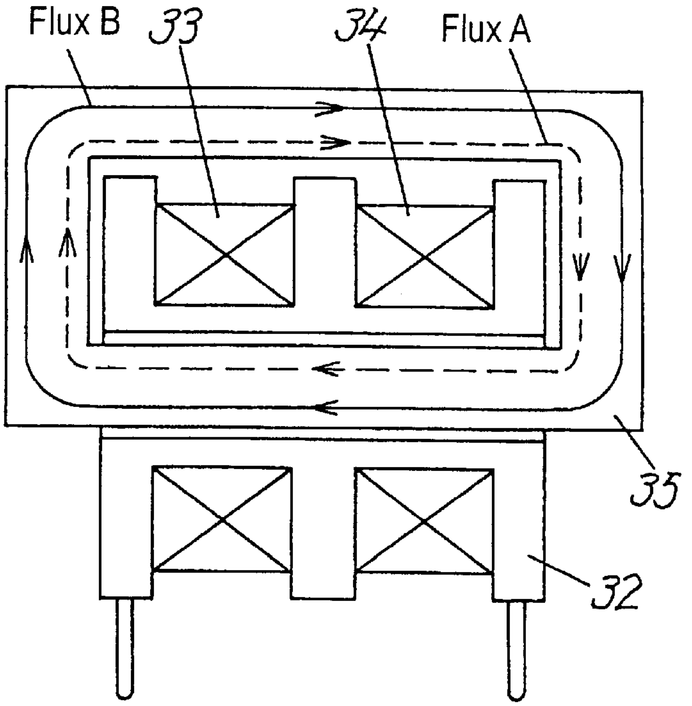
FIG. 58 (PRIOR ART)
FIG. 58 is a schematic illustration of a magnetic circuit of the same line filter, depicting flows of magnetic flux caused by common mode noise.
Figure 59A:
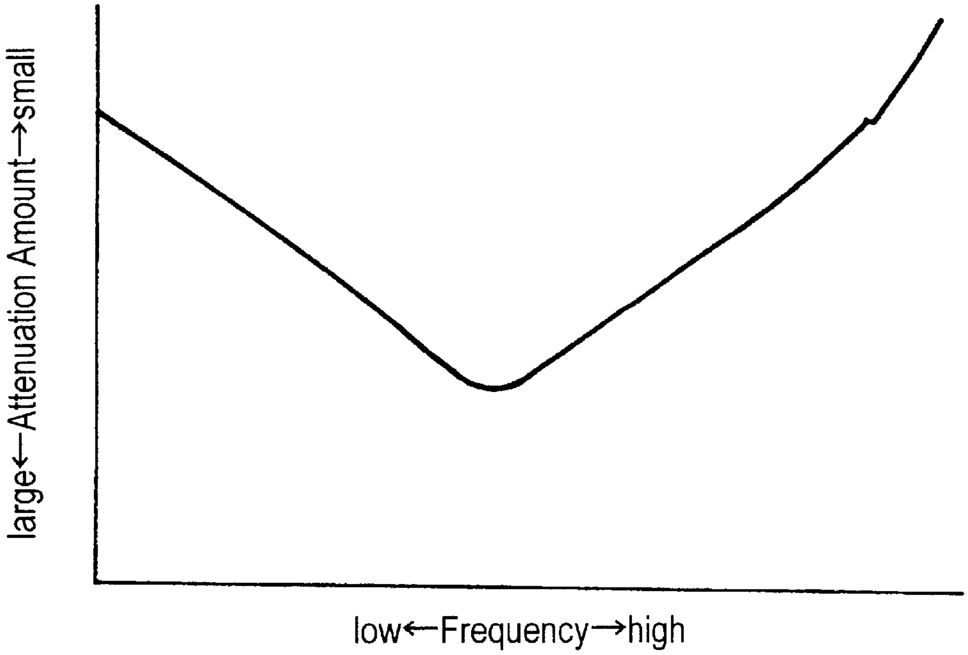
FIG. 59A (PRIOR ART)
FIGS. 59A and 59B covers graphs representing frequency attenuation characteristics of the same line filter.
Figure 59B:
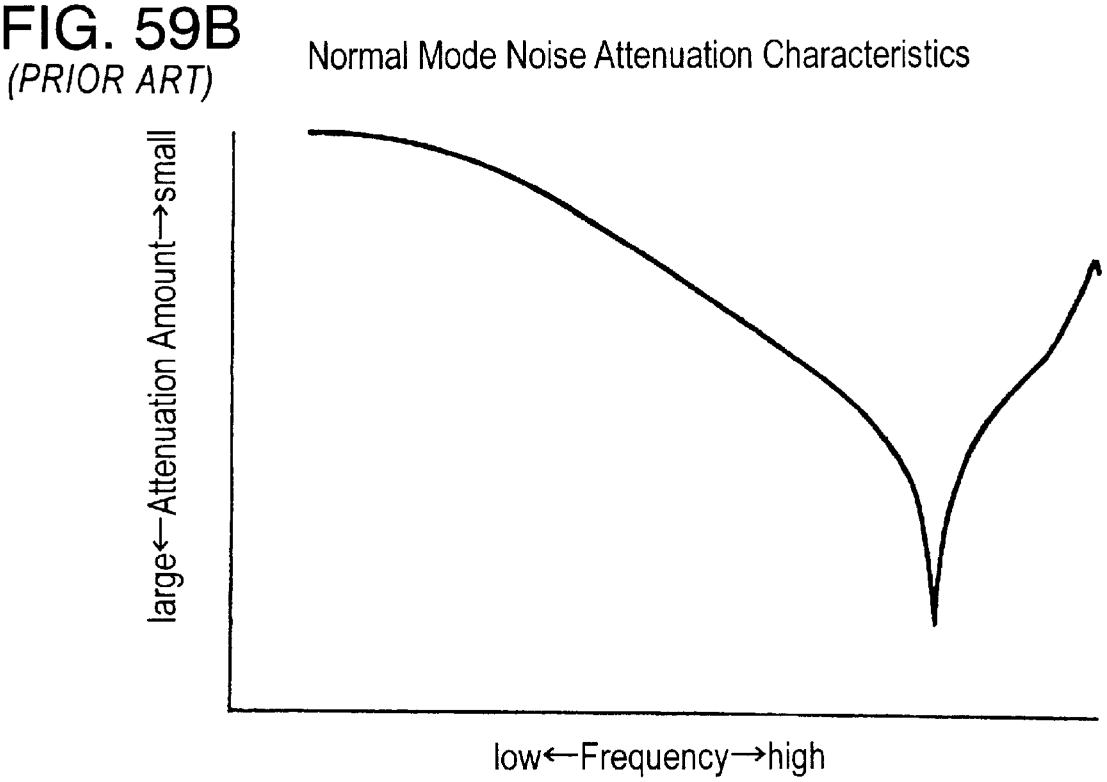
FIG. 59B (PRIOR ART)

In this seventh exemplary embodiment, the magnetic body 20 is so arranged that the opening 19 situate in an orthogonal orientation (D) to the magnetic frame-bar 12 of the closed-loop magnetic core 11 inserted in the through holes 1 of the first bobbin 5 and the second bobbin 6. Instead, it may be arranged in a parallel orientation (Da) as shown in FIG. 53 and FIG. 54.

The first coil 15 for second band and the second coil 17 for second band may be wound alternately on one of the magnetic frame-bars 23 of the magnetic body 20, especially in this instance.

Industrial Applicability

According to the present invention as described, the first coil for second band and the second coil for second band are wound in a manner that magnetic fluxes generated by the first coil unit for second band and the second coil unit for second band enhance each other, in order to eliminate the common mode noise of the second frequency band. It is feasible to set a frequency band, which can be attenuated by the first coil unit for second band and the second coil unit for second band, in a region outside of a frequency band that can be attenuated by the first coil unit and the second coil unit. Therefore, it realizes a wide-band attenuation from low frequency region to high frequency region, thereby improving the attenuation characteristic.

In this instance, in particular, the first coil unit for second band and the second coil unit for second band are arranged orthogonal to the closed-loop magnetic core, so that a direction of magnetic fluxes generated by the first coil unit and the second coil unit and a direction of magnetic fluxes generated by the first coil unit for second band and the second coil unit for second band cross orthogonally with respect to each other. For this reason, the magnetic fluxes generated by the first coil unit and the second coil unit do not influence negatively with the magnetic fluxes generated by the first coil unit for second band and the second coil unit for second band. Accordingly, it prevents attenuation characteristic in the second frequency band from adversely affecting attenuation characteristic in the first frequency band. Furthermore, the attenuation characteristic can be improved since the attenuation characteristic covering the frequency band is broadened positively.

What is claimed is:

1. A line filter comprising:

a first bobbin and a second bobbin, each having a through hole in an axial direction and a winding slot;

a first coil wound around the winding slot of said first bobbin to form a first coil unit;

a second coil wound around the winding slot of said second bobbin to form a second coil unit;

a closed-loop magnetic core having a magnetic frame-bar inserted in the through hole of said first bobbin and the through hole of said second bobbin; and first noise suppression means for eliminating common mode noise, said first noise suppression means comprising a first noise suppressor for first band for eliminating common mode noise in first frequency band and another first noise suppressor for second band for eliminating common mode noise in second frequency band, wherein said first noise suppressor for first band includes said first coil and said second coil wound in a manner that magnetic flux generated by said first coil and magnetic flux generated by said second coil enhance each other in said closed-loop magnetic core, said first noise suppressor for second band includes a first coil for second band spirally wound to form a first coil unit for second band, and a second coil for second band spirally wound to form a second coil unit for second band, said first coil for second band and said second coil for second band being wound in a manner that magnetic flux generated by said first coil unit for second band and magnetic flux generated by said second coil unit for second band enhance each other, and further wherein said first coil unit for second band and said second coil unit for second band are arranged orthogonal to said closed-loop magnetic core, so that a direction of the magnetic flux generated by said first coil unit and the magnetic flux generated by said second coil unit and a direction of the magnetic flux generated by said first coil unit for second band and the magnetic flux generated by said second coil unit for second band cross orthogonally with respect to each other.

2. The line filter of claim 1, further comprising second noise suppression means for eliminating normal mode noise, wherein said second noise suppression means leads the magnetic flux generated by said first coil and said second coil in directions opposite each other in said closed-loop magnetic core, but in a same direction in a space between confronting side surfaces next to the winding slot of said first bobbin and the winding slot of said second bobbin, and produces the magnetic flux in a closed-loop pattern around the winding slot of said first bobbin and also around the winding slot of said second bobbin.

3. The line filter of claim 2, further comprising a magnetic body in the space between the confronting side surfaces next to the winding slot of said first bobbin and the winding slot of said second bobbin, wherein said first coil for second band forming said first coil unit for second band and said second coil for second band forming said second coil unit for second band are wound on said magnetic body.

4. The line filter of claim 1, further comprising a magnetic body, wherein said first coil for second band forming said first coil unit for second band and said second coil for second band forming said second coil unit for second band are wound on said magnetic body.

5. The line filter of claim 4, wherein said magnetic body has a closed magnetic loop configuration with an opening.

6. The line filter of claim 5, wherein a magnetic frame-bar of said closed-loop magnetic core is inserted in the opening of said magnetic body.

7. The line filter of claim 4, wherein said magnetic body comprises two confronting magnetic frame-bars and two other confronting magnetic frame-bars coupled together, and has an opening of a square shape.

8. The line filter of claim 7, wherein a magnetic frame-bar of said closed-loop magnetic core is inserted in the opening of said magnetic body, and the magnetic frame-bar of said closed-loop magnetic core is also inserted in the through hole of said first bobbin and the through hole of said second bobbin along with the opening of said magnetic body.

9. The line filter of claim 4, wherein said second frequency band is in a higher frequency region than said first frequency band, and permeability of said magnetic body is equal to or less than permeability of said closed-loop magnetic core.

10. The line filter of claim 9, wherein said magnetic body and said closed-loop magnetic core are comprised of MnZn-base core material.

11. The line filter of claim 9, wherein said magnetic body is comprised of NiZn-base core material, and said closed-loop magnetic core is comprised of MnZn-base core material.

12. The line filter of claim 4, wherein said magnetic body comprises two confronting magnetic frame-bars and two other confronting magnetic frame-bars coupled together, and has an opening of a square shape, and said first coil for second band is wound on one of said two confronting magnetic frame-bars, and said second coil for second band is wound on the other of said two confronting magnetic frame-bars.

13. The line filter of claim 12, wherein one of said two confronting magnetic frame-bars is positioned upward, and the other of said two confronting magnetic frame-bars is positioned downward.

14. The line filter of claim 12, wherein said closed-loop magnetic core and said magnetic body are each arranged vertically, while positioned orthogonally with respect to each other, and none of said two confronting magnetic frame-bars and said two other confronting magnetic frame-bars is inserted in an opening of said closed-loop magnetic core, and a magnetic frame-bar of said closed-loop magnetic core is not inserted in the opening of said magnetic body.

15. The line filter of claim 14 further having a terminal block, wherein said closed-loop magnetic core and said magnetic body are each disposed vertically to said terminal block, and said terminal block is unitary molded with said first bobbin for second band for receiving winding of said first coil for second band and said second bobbin for second band for receiving winding of said second coil for second band.

16. The line filter of claim 15, wherein said first bobbin for second band and said second bobbin for second band are connected.

17. The line filter of claim 17, wherein a separating flange is disposed at a connecting portion between said first bobbin for second band and said second bobbin for second band.

18. The line filter of claim 12, wherein said closed-loop magnetic core and said magnetic body are each arranged vertically, while positioned orthogonally with respect to each other, and any of said two confronting magnetic frame-bars and said two other confronting magnetic frame-bars is inserted in an opening of said closed-loop magnetic core, or a magnetic frame-bar of said closed-loop magnetic core is inserted in the opening of said magnetic body.

19. The line filter of claim 4, wherein said magnetic body comprises two confronting magnetic frame-bars and two other confronting magnetic frame-bars coupled together, and has an opening of a square shape, and said first coil for second band is wound on one of said two other confronting magnetic frame-bars, and said second coil for second band is wound on the other of said two other confronting magnetic frame-bars.

20. The line filter for claim 1, wherein:

said second frequency band is in a higher frequency region than said first frequency band;

a number of turns of said first coil for second band and said second coil for second band are equal to or less than a number of turns of said first coil and said second coil; and said first coil for second band and said second coil for second band are wound in a single layer so as not to overlap each other.

21. The line filter of claim 1, wherein:

the magnetic frame-bar of said closed-loop magnetic core comprises at least two confronting magnetic frame-bars coupled with at least two confronting side magnetic frame-bars;

one of said at least two confronting magnetic frame-bars is inserted in the through hole of said first bobbin and the through hole of said second bobbin; and said first bobbin and said second bobbin are arranged coaxially.

22. The line filter of claim 21, wherein said closed-loop magnetic core is a double-square shape.

23. The line filter of claim 21, wherein said closed-loop magnetic core is a double-square shape.

24. The line filter of claim 21, wherein said closed-loop magnetic core comprises three confronting magnetic frame-bars in a shape of double-square, and one of said three confronting magnetic frame-bars located in a center position is inserted in the through hole of said first bobbin and the through hole of said second bobbin.

25. The line filter of claim 1, wherein:

the magnetic frame-bar of said closed loop magnetic core comprises at least two confronting magnetic frame-bars linked with at least two confronting side magnetic frame-bars;

one of said at least two confronting magnetic frame-bars is inserted in the through hole of said first bobbin;

the other of said at least two confronting magnetic frame-bars is inserted in the through hole of said second bobbin; and said first bobbin and said second bobbin are arranged eccentrically.

26. The line filter of claim 1, wherein:

the magnetic frame-bar of said closed-loop magnetic core comprises at least two confronting magnetic frame-bars linked with at least two confronting side magnetic frame-bars;

one of said at least two confronting magnetic frame-bars is inserted in the through hole of said first bobbin;

the other of said at least two confronting magnetic frame-bars is inserted in the through hole of said second bobbin; and said first bobbin and said second bobbin are arranged eccentrically in a staggered form so that a periphery of the winding slot of said first bobbin and a periphery of the winding slot of said second bobbin do not confront each other.

27. The line filter of claim 1, further having a tapping terminal, wherein said first coil and said first coil for second band are connected through said tapping terminal, and said second coil for second band and said second coil for second band are connected through said tapping terminal.

28. The line filter of claim 27, wherein said tapping terminal comprises a first tapping terminal and a second tapping terminal, said first coil for second band and said first coil for second band are connected through said first tapping terminal, and said second coil for second band and said second coil for second band are connected through said second tapping terminal.

* * * * *